United States Patent
Riggs et al.

(10) Patent No.: US 12,174,550 B2
(45) Date of Patent: Dec. 24, 2024

(54) CALIBRATION SYSTEM FOR AN EXTREME ULTRAVIOLET LIGHT SOURCE

(71) Applicant: ASML Netherlands B.V., Veldhoven (NL)

(72) Inventors: Daniel Jason Riggs, Poway, CA (US); Liane Manuela Matthes, San Diego, CA (US); Rilpho Ludovicus Donker, Eindhoven (NL); Martinus Hendrikus Antonius Leenders, Rhoon (NL)

(73) Assignee: ASML Netherlands B.V., Veldhoven (NL)

( * ) Notice: Subject to any disclaimer, the term of this patent is extended or adjusted under 35 U.S.C. 154(b) by 307 days.

(21) Appl. No.: 17/782,268

(22) PCT Filed: Dec. 11, 2020

(86) PCT No.: PCT/EP2020/085656
§ 371 (c)(1),
(2) Date: Jun. 3, 2022

(87) PCT Pub. No.: WO2021/122341
PCT Pub. Date: Jun. 24, 2021

(65) Prior Publication Data
US 2023/0018949 A1     Jan. 19, 2023

Related U.S. Application Data

(60) Provisional application No. 62/951,397, filed on Dec. 20, 2019, provisional application No. 62/951,846, (Continued)

(51) Int. Cl.
*G01B 11/24* (2006.01)
*G03F 7/00* (2006.01)
*H05G 2/00* (2006.01)

(52) U.S. Cl.
CPC ........ *G03F 7/70558* (2013.01); *G01B 11/24* (2013.01); *G03F 7/70033* (2013.01); (Continued)

(58) Field of Classification Search
CPC ............ G03F 7/70558; G03F 7/70033; G03F 7/70041; G03F 7/7085; G01B 11/24; H05G 2/008
See application file for complete search history.

(56) References Cited

U.S. PATENT DOCUMENTS 6,710,849 B2   3/2004   Kwan et al.
6,730,920 B2   5/2004   Groeneveld et al.
(Continued)

FOREIGN PATENT DOCUMENTS

JP   2007109451 A   4/2007
JP   2016512383 A   4/2016
(Continued)

OTHER PUBLICATIONS

Wiebo van Toledo, European International Searching Authority, International Search Report and Written Opinion, counterpart PCT Application No. PCT/EP2020/085656, mailed Jun. 2, 2021, 21 pages total.

*Primary Examiner* — David P Porta
*Assistant Examiner* — Fani Polyzos Boosalis
(74) *Attorney, Agent, or Firm* — DiBerardino McGovern IP Group LLC

(57) ABSTRACT

A metrology system includes a light beam metrology apparatus configured to sense one or more aspects of an amplified light beam and to make adjustments to the amplified light beam based on the sensed one or more aspects; a target metrology apparatus configured to measure one or more properties of a modified target after a target has interacted with the amplified light beam, and to determine a moment
(Continued)

when the modified target achieves a reference calibration state; and a control apparatus configured to: receive the reference calibration state and the moment at which the reference calibration state is achieved from the target metrology apparatus; determine a light beam calibration state of the amplified light beam based on the received reference calibration state and the moment at which the reference calibration state is achieved; and provide the light beam calibration state to the light beam metrology apparatus.

23 Claims, 23 Drawing Sheets

Related U.S. Application Data filed on Dec. 20, 2019, provisional application No. 62/987,917, filed on Mar. 11, 2020, provisional application No. 63/118,262, filed on Nov. 25, 2020.

(52) U.S. Cl.
CPC ........ *G03F 7/70041* (2013.01); *G03F 7/7085* (2013.01); *H05G 2/008* (2013.01)

(56) References Cited

U.S. PATENT DOCUMENTS

| | | | |
|---|---|---|---|
| 6,955,074 B2 | 10/2005 | Levasier et al. |
| 6,995,831 B2 | 2/2006 | Levasier et al. |
| 7,002,667 B2 | 2/2006 | Levasier et al. |
| 7,170,580 B2 | 1/2007 | Leenders et al. |
| 7,239,368 B2 | 7/2007 | Oesterholt et al. |
| 7,256,871 B2 | 8/2007 | Loopstra et al. |
| 7,271,917 B2 | 9/2007 | Van Donkelaar et al. |
| 7,292,312 B2 | 11/2007 | Loopstra et al. |
| 7,408,655 B2 | 8/2008 | Loopstra et al. |
| 7,511,799 B2 | 3/2009 | Tel et al. |
| 7,528,965 B2 | 5/2009 | Loopstra et al. |
| 7,542,127 B2 | 6/2009 | Sengers et al. |
| 7,859,686 B2 | 12/2010 | Loopstra et al. |
| 7,880,901 B2 | 2/2011 | Loopstra et al. |
| 8,000,212 B2 | 8/2011 | Senekerimyan et al. |
| 8,173,985 B2 | 5/2012 | Bergstedt et al. |
| 8,289,498 B2 | 10/2012 | Loopstra et al. |
| 8,351,022 B2 | 1/2013 | De Boeij et al. |
| 8,368,902 B2 | 2/2013 | Loopstra et al. |
| 8,477,287 B2 | 7/2013 | Oudshoorn et al. |
| 8,514,365 B2 | 8/2013 | De Jong et al. |
| 8,730,448 B2 | 5/2014 | Nienhuys et al. |
| 8,797,504 B2 | 8/2014 | Nienhuys et al. |
| 9,000,405 B2 | 4/2015 | Fleurov et al. |
| 9,778,022 B1 | 10/2017 | Odle et al. |
| 9,820,368 B2 | 11/2017 | Riggs et al. |
| 9,983,489 B2 | 5/2018 | Berendsen et al. |
| 10,925,143 B2 * | 2/2021 | Wakana ................ H05G 2/008 |
| 2005/0253080 A1 | 11/2005 | Janik |
| 2014/0264091 A1 | 9/2014 | Fleurov et al. |
| 2016/0234920 A1 | 8/2016 | Suzuki et al. |
| 2017/0171955 A1 | 6/2017 | Ueno et al. |
| 2018/0235064 A1 | 8/2018 | Yabu et al. |
| 2018/0329292 A1 | 11/2018 | Kanehara et al. |
| 2019/0250517 A1 | 8/2019 | Hosoda |
| 2019/0313519 A1 | 10/2019 | Yabu et al. |

FOREIGN PATENT DOCUMENTS

| | | |
|---|---|---|
| TW | 201137539 A | 11/2011 |
| TW | 201729005 A | 8/2017 |
| WO | 2011104179 A1 | 9/2011 |
| WO | 2014149435 A1 | 9/2014 |
| WO | 2016063409 A | 4/2016 |
| WO | 2019105664 A1 | 6/2019 |

* cited by examiner

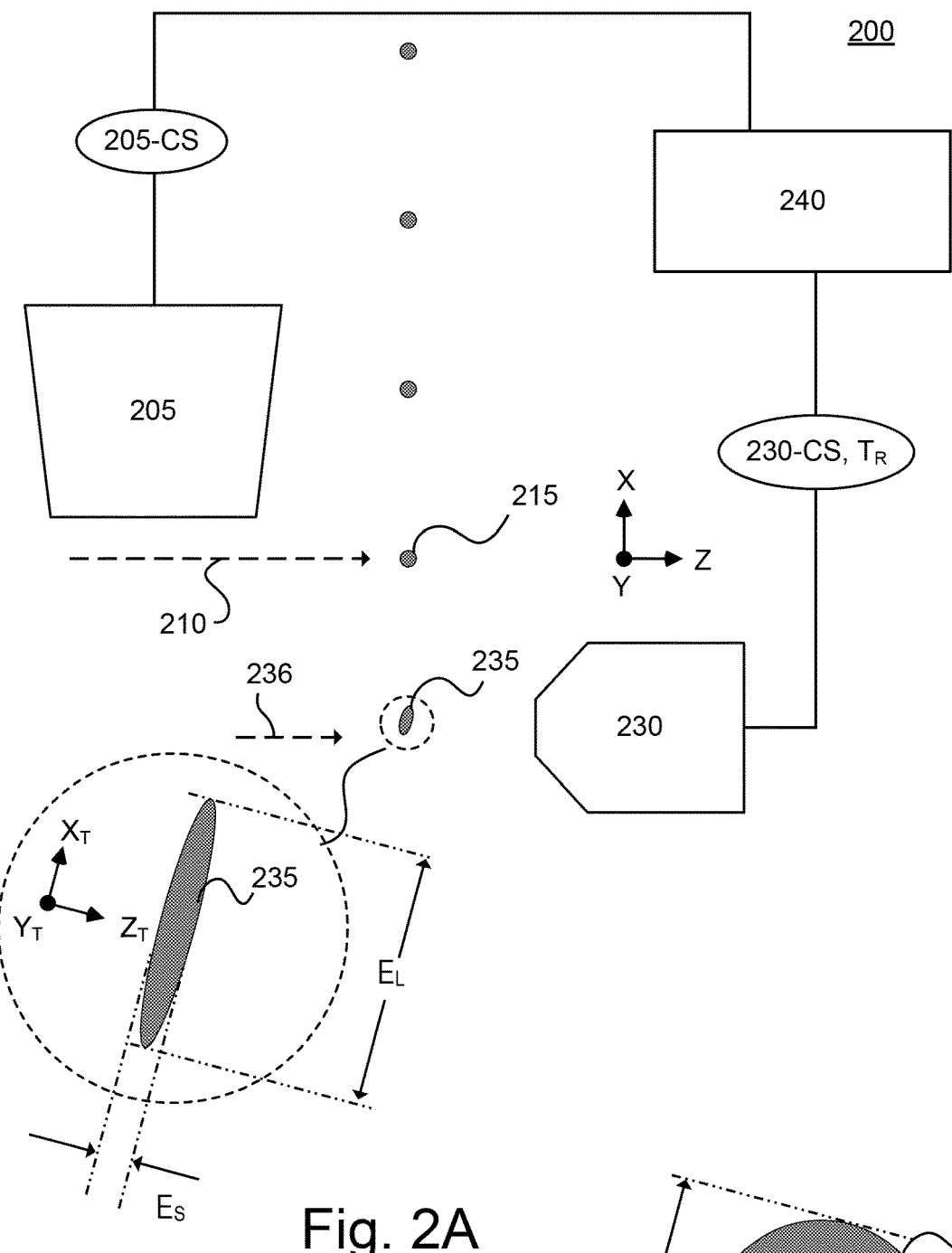
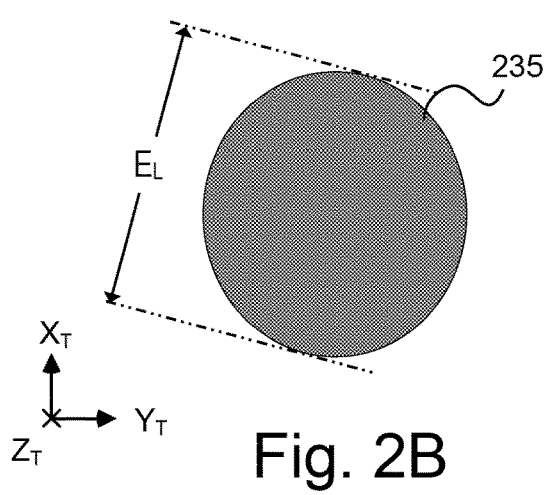
Fig. 2A
Fig. 2B

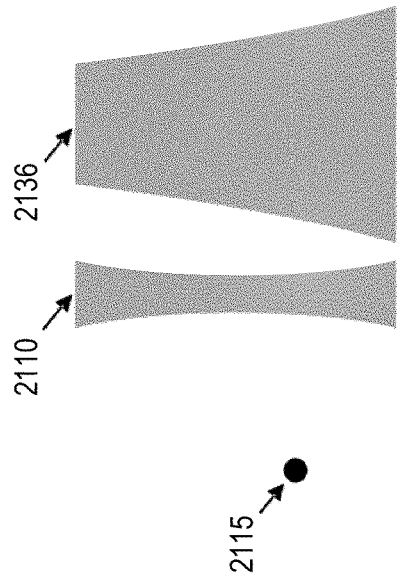
Fig. 21A
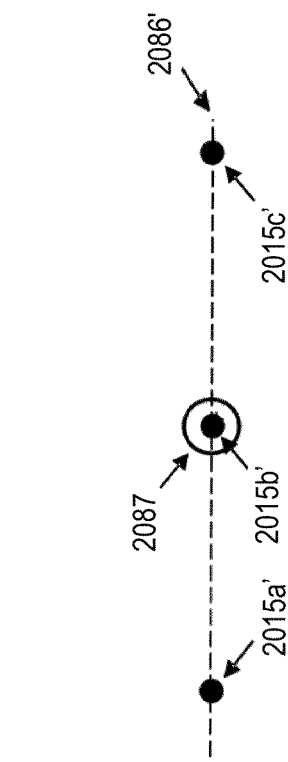
Fig. 21B
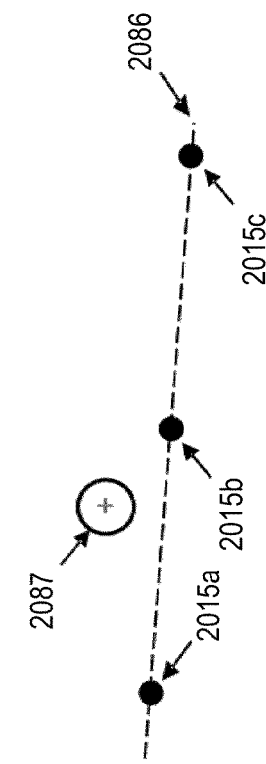
Fig. 20A
Fig. 20B

CALIBRATION SYSTEM FOR AN EXTREME ULTRAVIOLET LIGHT SOURCE

CROSS REFERENCE TO RELATED APPLICATIONS

This application claims priority to U.S. Application No. 62/951,397, filed Dec. 20, 2019 and titled CALIBRATION SYSTEM FOR AN EXTREME ULTRAVIOLET LIGHT SOURCE, and U.S. Application No. 62/951,846, filed Dec. 20, 2019 and titled ANCHORING A PLURALITY OF CONTROL/METROLOGY DEVICES TO A SINGLE LOCATION OF THE VESSEL AND UNIFIED COORDINATE SYSTEM FOR CALIBRATION AND CONTROL OF THE SAME, both of which are incorporated herein in their entireties by reference.

This application also claims priority to U.S. Application No. 62/987,917, filed Mar. 11, 2020 and titled CALIBRATION SYSTEM FOR AN EXTREME ULTRAVIOLET LIGHT SOURCE, and U.S. Application No. 63/118,262, filed Nov. 25, 2020 and titled CALIBRATION SYSTEM FOR AN EXTREME ULTRAVIOLET LIGHT SOURCE, both of which are also incorporated herein in their entireties by reference.

TECHNICAL FIELD

The disclosed subject matter relates to a calibration system and method within a laser produced plasma extreme ultraviolet light source.

BACKGROUND

Extreme ultraviolet (EUV) light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma can be produced by irradiating a target material, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Extreme ultraviolet (EUV) light, for example, electromagnetic radiation having wavelengths of around 50 nanometers (nm) or less (also sometimes referred to as soft x-rays), and including light at a wavelength of about 13 nm, can be used in or with a lithographic apparatus to produce extremely small features in substrates, for example, silicon wafers. Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY

In some general aspects, a metrology system for an extreme ultraviolet (EUV) light source includes a light beam metrology apparatus, a target metrology apparatus, and a control apparatus. The light beam metrology apparatus is configured to sense one or more aspects of an amplified light beam and to make adjustments to the amplified light beam based on the sensed one or more aspects. The target metrology apparatus is configured to measure one or more properties of a modified target after a target has interacted with the amplified light beam, and to determine a moment when the modified target achieves a reference calibration state. The control apparatus is in communication with the light beam metrology apparatus and the target metrology apparatus. The control apparatus is configured to: receive the reference calibration state and the moment at which the reference calibration state is achieved from the target metrology apparatus; determine a light beam calibration state of the amplified light beam based on the received reference calibration state and the moment at which the reference calibration state is achieved; and provide the light beam calibration state to the light beam metrology apparatus.

Implementations can include one or more of the following features. For example, the control apparatus can be configured to determine the light beam calibration state as the state of the amplified light beam at the time of the reference calibration state. The light beam metrology apparatus can include at least one sensor that receives a reflected amplified light beam, the reflected amplified light beam including a reflection of at least a portion of the amplified light beam that has interacted with the target. The control apparatus can be configured to indicate the light beam calibration state to the light beam metrology apparatus. The control apparatus can be configured to analyze an output from the sensor of the light beam metrology apparatus based on the light beam calibration state.

The control apparatus can be in communication with one or more of an optical source configured to produce the amplified light beam and a steering apparatus configured to direct the amplified light beam toward the target space. The control apparatus can be configured to send instructions to one or more of the optical source and the steering apparatus based on the analysis of the output from the sensor to thereby adjust the amplified light beam. The control apparatus can be configured to send one or more instructions to the optical source by sending instructions relating to one or more of a trigger or timing of a pulse of the amplified light beam and an energy of the pulse of the amplified light beam.

The target metrology apparatus can include a target metrology device configured to measure the one or more properties of the modified target. For example, the target metrology apparatus can measure one or more of a size of the modified target, such as a diameter along a long extent of the modified target; an angle or orientation of the modified target, such as an angle $R_X$ at which the axis $Z_T$ of the modified target is rotated away from the Z axis, about the X axis, and an angle $R_Y$ at which the axis $Z_T$ of the modified target is rotated away from the Z axis, about the Y axis; a position of the modified target in the X, Y, Z coordinate system; a contrast of the modified target; an ellipticity or other quality metrics of the modified target; and one or more moving properties of the modified target. The moving properties include a velocity of the modified target in one or more of the X, Y, Z directions, and an expansion rate of the modified target. The target metrology device can include two image sensors, each image sensor being arranged to sense an image in a distinct imaging plane. The distinct imaging planes can be 20°-120° apart from each other. For example, the distinct imaging planes can be 90° apart from each other. The control apparatus can be configured to determine that the modified target achieves the reference calibration state at the moment when the modified target has a desired extent along each of two projected planes from the imaging planes.

The target metrology apparatus can be unable to directly sense the amplified light beam.

The reference calibration state can indicate that a focal region of the amplified light beam encompasses the target and the target is centered in the focal region of the amplified light beam.

The light beam metrology apparatus can be configured to sense one or more aspects of the amplified light beam directed to the target space or reflected from the target space.

The determined light beam calibration state of the amplified light beam can include an energy, a value, a position, or a shape of the amplified light beam.

The control apparatus can be configured to estimate a rate of expansion of the modified target, to determine whether one or more aspects of the amplified light beam should be adjusted based on the estimated expansion rate, and to send instructions to one or more of the optical source and the steering apparatus to thereby adjust one or more aspects of the amplified light beam based on this determination.

The light beam metrology apparatus can be configured to sense the one or more aspects of the amplified light beam in accordance with the light beam calibration state.

In other general aspects, a method includes: directing an amplified light beam toward a target space so that the amplified light beam interacts with a target in the target space; adjusting one or more features of the amplified light beam; measuring one or more properties of a modified target after the target has interacted with the amplified light beam in the target space; determining, based on the measured properties of the modified target, when the modified target is in a reference calibration state; and assigning the one or more features of the amplified light beam that produced the reference calibration state to a light beam calibration state.

Implementations can include one or more of the following features. For example, the method can further include controlling aspects of the amplified light beam in accordance with the light beam calibration state. The aspects of the amplified light beam can be controlled by sensing one or more aspects of the amplified light beam in accordance with the light beam calibration state; and adjusting the amplified light beam based on the sensed one or more aspects. The one or more aspects of the amplified light beam can be sensed in accordance with the light beam calibration state by sensing a reflected amplified light beam, the reflected amplified light beam including a reflection of at least a portion of the amplified light beam that has interacted with the target.

The one or more properties of the modified target can be measured by detecting at least two images of the modified target along two distinct imaging planes. Determining when the modified target is in the reference calibration state can include assigning the reference calibration state as the state of the modified target when the modified target has a desired extent along each of two planes projected from the imaging planes.

Determining when the modified target is in the reference calibration state can include determining that a focal region of the amplified light beam encompasses the target in the target space and the target is centered in the focal region of the amplified light beam.

Determining when the modified target is in the reference calibration state can include determining when the modified target is symmetric about at least one axis that defines target space.

The one or more features of the amplified light beam can be adjusted by adjusting one or more of a direction and a focal region of the amplified light beam.

Determining when the modified target is in the reference calibration state can be independent of sensing one or more aspects of the amplified light beam. The one or more properties of the modified target can be measured by measuring an orientation of the modified target relative to a first image plane and measuring an orientation of the modified target relative to a second image plane orthogonal to the first image plane.

In other general aspects, an extreme ultraviolet (EUV) light system includes: an optical source, a steering system, a light beam metrology apparatus, a target metrology apparatus, and a control apparatus. The optical source is configured to produce an amplified light beam. The steering system is configured to steer and focus the amplified light beam toward a target space. The light beam metrology apparatus is configured to sense one or more aspects of the amplified light beam in the target space and to adjust the amplified light beam based on the sensed one or more aspects. The target metrology apparatus is configured to measure one or more properties of a modified target after the target has interacted with the amplified light beam, and to determine a moment when the modified target achieves a reference calibration state. The control apparatus is in communication with the light beam metrology apparatus and the target metrology apparatus. The control apparatus is configured to: receive the reference calibration state and the moment at which the reference calibration state is achieved from the target metrology apparatus; determine a light beam calibration state of the amplified light beam based on the received reference calibration state and the moment at which the reference calibration state is achieved; and provide the light beam calibration state to the light beam metrology apparatus.

Implementations can include one or more of the following features. For example, the target metrology apparatus can include two image sensors, each image sensor being arranged to sense an image of the modified target at a distinct imaging plane. The image sensors can be fixed to a wall that defines an enclosure in which the target space is located. The distinct imaging planes can be 20°-120° apart from each other.

The present disclosure describes various aspects of systems, apparatuses, computer program products, and methods for generating radiation using a plurality of control or metrology devices mechanically referenced to a reference point on an illumination source and using a unified coordinate system for calibration and control in the illumination source.

In some aspects, the present disclosure describes a radiation source including a fuel target generator configured to generate and emit a fuel target towards a plasma formation region. The radiation source can further include a laser system configured to hit the fuel target with a laser beam for generating a plasma at the plasma formation region. The radiation source can further include a collector configured to collect radiation emitted by the plasma. The radiation source can further include a laser steerer configured to monitor and steer the laser beam towards the plasma formation region. The radiation source can further include a fuel target steerer configured to monitor and steer the fuel target towards the plasma formation region. At least two of the collector, the laser steerer, and the fuel target steerer can be mechanically referenced to a reference point on the radiation source.

In other aspects, the present disclosure describes a system including a fuel target generator configured to generate and emit a fuel target towards a plasma formation region. The system can further include a laser system configured to hit the fuel target with a laser beam for generating a plasma at the plasma formation region. The system can further include a collector configured to collect radiation emitted by the plasma. The system can further include a laser steerer configured to monitor and steer the laser beam towards the plasma formation region. The system can further include a fuel target steerer configured to monitor and steer the fuel target towards the plasma formation region. The system can further include a fuel target imaging system. The system can further include a controller configured to use the fuel target imaging system to generate a unified coordinate system for the laser steerer and the fuel target steerer.

In still other aspects, the present disclosure describes an apparatus including a laser steerer configured to monitor and steer a laser beam towards a plasma formation region. The apparatus can further include a fuel target steerer configured to monitor and steer a fuel target towards the plasma formation region. The apparatus can further include a fuel target imaging system configured to detect an overlap between the laser beam and the fuel target. The apparatus can further include a controller configured to generate, based on a detected overlap between the laser beam and the fuel target, a unified coordinate system for the laser steerer and the fuel target steerer.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

DESCRIPTION OF DRAWINGS

FIG. 2A is a block diagram of an implementation of the metrology system of FIGS. 1A and 1B, in which the first metrology apparatus is a light beam metrology apparatus and the second metrology apparatus is a target metrology apparatus that interacts with a modified target, as well as an inset showing a side plan view of the modified target taken along a $Y_T$ axis of the modified target;

FIG. 2B is a side plan view of the modified target of FIG. 2A taken along a $Z_T$ direction of the modified target;

FIGS. 20A and 20B illustrate an example process for aligning a fuel target to a primary focus of a collector according to some aspects of the present disclosure.

FIGS. 21A and 21B illustrate an example process for aligning a pre-pulse laser beam to a fuel target according to some aspects of the present disclosure.

Figure 1A:
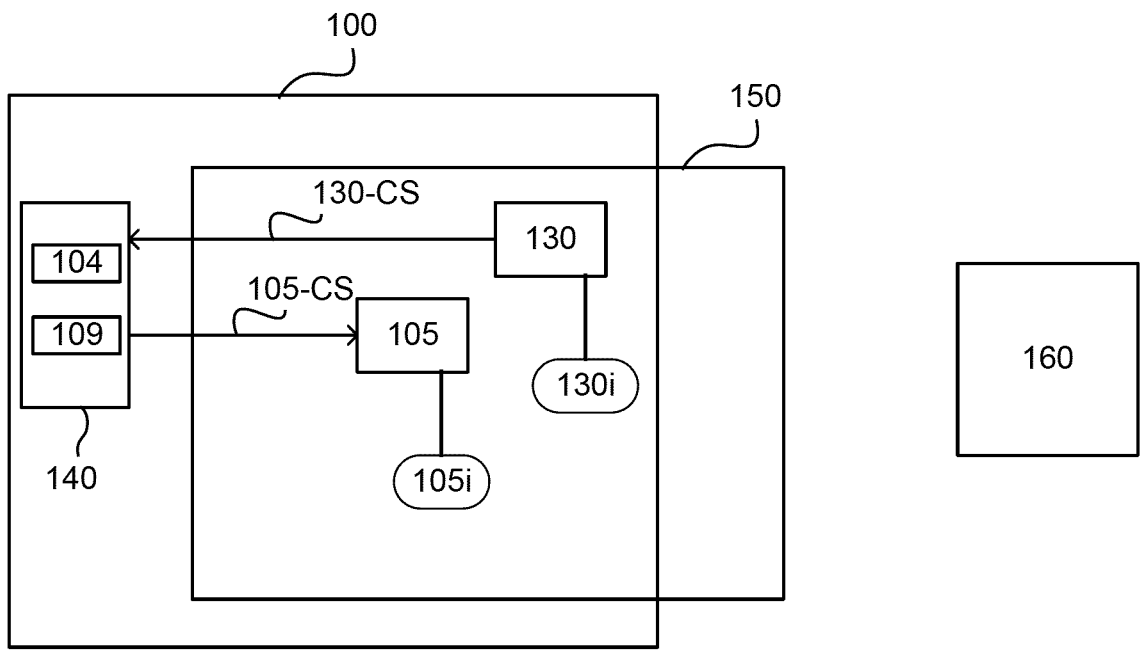
FIG. 1A is a block diagram of a metrology system interacting with one or more aspects of an extreme ultraviolet (EUV) light source while the EUV light source is in an offline mode, the metrology system including a first metrology apparatus and a second metrology apparatus.

The features the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DESCRIPTION

Referring to FIG. 1A, a metrology system 100 interacts with one or more aspects of an extreme ultraviolet (EUV) light source 150 while the EUV light source 150 is in an "offline" mode, that is, during the set up and calibration of the EUV light source 150. The metrology system 100 also interacts with the EUV light source 150 during an online mode (as shown in FIG. 1B), in which the EUV light source 150 supplies a light beam 155 that is able to be used by an output apparatus 160 such as a lithography exposure apparatus.

During the offline mode (FIG. 1A), the metrology system 100 can be used to initially set up the EUV light source 150 or to recover the EUV light source 150 from down time for service to one or more components within the EUV light source 150. The metrology system 100 enables a more rapid and more accurate set-up and calibration of the EUV light source 150, thus reducing the time required for set-up and calibration, and reducing the amount of time that the EUV light source 150 is in offline mode and therefore not producing the light beam 155 that can be used by the output apparatus 160 in the online mode. In offline mode (FIG. 1A), it is possible for the EUV light beam 155 to be produced by the EUV light source 150. The EUV light beam 155 produced during offline mode may not have the specifications or quality required for use by the output apparatus 160.

Figure 1B:
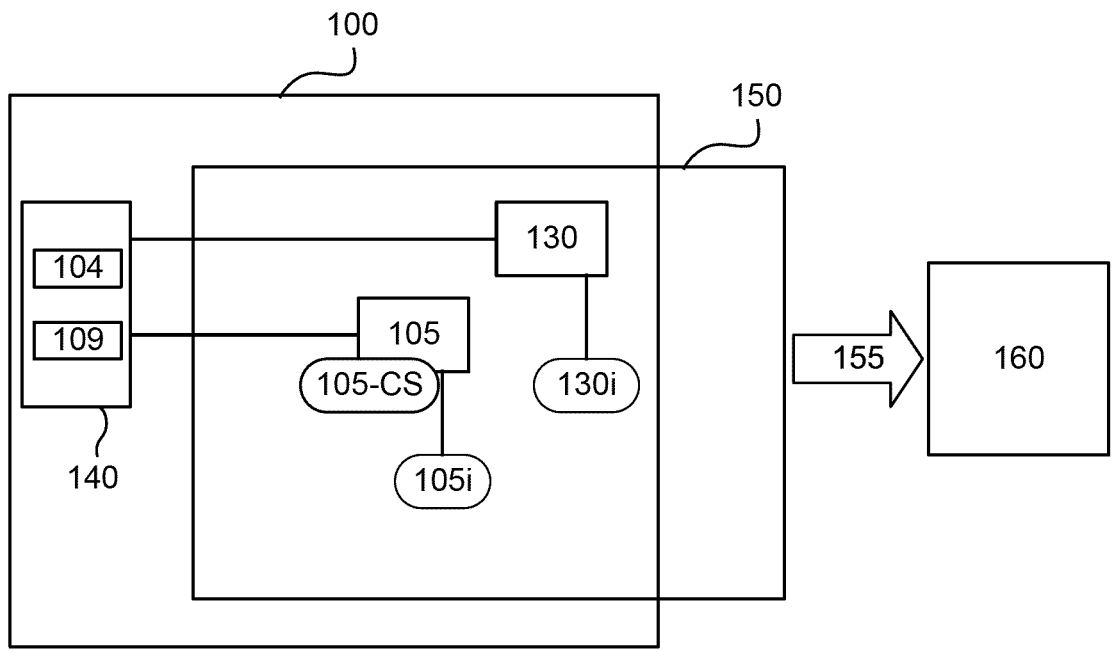
FIG. 1B is a block diagram of the metrology system interacting with the EUV light source while the EUV light source is in an online and operational mode.

The metrology system 100 can be used during online operation of the EUV light source 150, as shown in FIG. 1B, to monitor and control components within the EUV light source 150 to ensure the efficient production of the light beam 155 for use by the output apparatus 160. It is additionally possible that other processes are performed either before, after, or during the offline mode shown in FIG. 1A, such processes being required for operation of the EUV light source 150 in online mode (FIG. 1B).

Referring initially to FIG. 1A, the metrology system 100 includes a first metrology apparatus 105, a second metrology apparatus 130, and a control apparatus 140 in communication with the first metrology apparatus 105 and the second metrology apparatus 130. The control apparatus 140 receives a reference calibration state 130-CS obtained during offline operation of the EUV light source 150, such reference calibration state 130-CS being provided by the second metrology apparatus 130. The control apparatus 140 determines a calibration state 105-CS of the first metrology apparatus 105 based on an analysis of the reference calibration state 130-CS and provides the calibration state 105-CS to the first metrology apparatus 105.

In general, a calibration state CS of a metrology apparatus is a standardized state or event that enables a metrology apparatus to quantify measurements by determining how those measurements deviate from the standardized state. The calibration state CS can provide a standard scale of measurements for which the future measurements obtained by the metrology apparatus are correlated.

During calibration in the offline mode (FIG. 1A), the second metrology apparatus 130 detects the second information 130-$i$, which is associated with one or more second aspects of the EUV light source 150. The first metrology apparatus 105 detects first information 105-$i$, which is associated with one or more first aspects of the EUV light source 150. A second aspect is "downstream" of a first aspect, which means that the second aspect exists or occurs at a later time than the first aspect during operation of the EUV light source 150, and the second aspect is at least partly dependent on the first aspect. Therefore, the second aspect can change whenever the first aspect is changed.

It can be a challenge to accurately calibrate the first metrology apparatus 105 based solely on the information obtained from the first metrology apparatus 105. This is because, while the first metrology apparatus 105 is able to detect the first information 105$i$ associated with one or more first aspects, this first information 105$i$ does not provide information that can provide insights into a calibration state of the first metrology apparatus 105. Instead, the metrology system 100 uses the reference calibration state 130-CS, which is determined by the second metrology apparatus 130 from the second information 130-$i$ that is associated with the second aspect in order to calibrate the first metrology apparatus 105. This is because the second information 130-$i$ relating to the second aspect can be used to determine information about the first aspect because, as discussed above, the second aspect is at least partly dependent on the first aspect. The second metrology apparatus 130 provides a more accurate detection during calibration of the EUV light source 150, and the second information 130-$i$ associated with the second aspect is used to first calibrate and then maintain the calibration of the first metrology apparatus 105. Additionally, by using the second information 130-$i$ to calibrate the first metrology apparatus 105, the metrology system 100 is able to perform the calibration of the first metrology apparatus 105 in a more rapid and an accurate fashion enabling a much faster calibration of the EUV light source 150. Therefore, the time during which the EUV light source 150 is in the offline mode and is therefore out of service is substantially reduced.

Additionally, once the first metrology apparatus 105 is calibrated, then the calibration state 105-CS of the first metrology apparatus 105 can be used during online operation of the EUV light source 150 (FIG. 1B). For example, the second metrology apparatus 130 can operate during online operation of the EUV light source 150 and can analyze the second information 130-*i* and output instructions to the control apparatus 140 during online operation of the EUV light source 150. The control apparatus 140 can instruct other components of the EUV light source 150 as well as the first metrology apparatus 105 to make adjustments to ensure that the first aspects are within a suitable operating range for online operation of the EUV light source 150.

The control apparatus 140 includes an electronic processor 104 and an electronic storage 109. The processor 104 can be any type of electronic processor and can be more than one electronic processor. The processor 104 can include one or more processors suitable for execution of a computer program such as a general or special purpose microprocessor, and any one or more processors of any kind of digital computer. Generally, a processor receives instructions and data from a read-only memory or a random access memory or both. The electronic storage 109 stores instructions, perhaps as a computer program, that, when executed, cause the processor 104 to communicate with other components of the metrology system 100 such as the first metrology apparatus 105 and the second metrology apparatus 130. The electronic storage 109 can include volatile memory, such as RAM. The electronic storage 109 can include both non-volatile and volatile portions or components. Additionally, as discussed in more detail below, each of the first metrology apparatus 105 and second metrology apparatus 130 can include their own dedicated controllers, each including their own electronic processor and electronic storage. Moreover, the control apparatus 140 can include various separate modules, and each module can be dedicated to a particular task. Also, these modules can be physically separated from each other or integrated with other parts of the metrology system 100.

An implementation 200 of the metrology system 100 is shown in FIG. 2A. During calibration of the EUV light source 150, an amplified light beam 210 interacts with a target 215, which is traveling along a pathway within the EUV light source 150. The pathway of the target 215 extends generally, although not exclusively, along a −X axis, which is a part of a Cartesian coordinate system (X, Y, Z) defined within the EUV light source 150. A modified target 235 is formed from the target 215 after the target 215 has interacted with the amplified light beam 210. The interaction between the amplified light beam 210 and the target 215 causes the target 215 to modify its shape and also its movement, thereby forming the modified target 235. The modified target 235 deforms and geometrically expands as it moves along the X, Y, Z space, such movement being generally along the −X axis but also possibly along either or both of the Y and Z axes. In some implementations, prior to interacting with the amplified light beam 210, the target 215 has a shape that is similar to a droplet while after interacting with the amplified light beam 210, the modified target 235 has a disk shape that is expanded at least along one of its axes. In this way, the modified target 235 eventually resembles a shape such as a pancake as it expands along a plane defined by two axes $X_T$, $Y_T$, the plane being perpendicular to an axis $Z_T$ along which the modified target 235 does not expand. An extent $E_L$ of the pancake along the $X_T$, $Y_T$ plane is greater than an extent $E_S$ along the low-expansive axis $Z_T$, as can be seen in the view of FIG. 2A.

The modified target 235 is next converted to plasma (which emits the EUV light that produces the light beam 155) by interacting the modified target 235 with a second amplified light beam 236. This interaction occurs at a plasma formation region 265. The amplified light beam 210 can be referred to as a pre-pulse light beam and the second amplified light beam 236 can be referred to as a main-pulse light beam.

In the metrology system 200, the first metrology apparatus 105 is a light beam metrology apparatus 205, the second metrology apparatus 130 is a target metrology apparatus 230, and the control apparatus 140 is a control apparatus 240.

The light beam metrology apparatus 205 is configured to detect or sense first information that is related to one or more first aspects of the amplified light beam 210. The light beam metrology apparatus 205 is configured to alter one or more first aspects of the amplified light beam 210. In general, during online mode (in which the EUV light source 150 is operating to produce the light beam 155), the first information detected by the light beam metrology apparatus 205 is analyzed, and adjustments are made to the amplified light beam 210 (via the light beam metrology apparatus 205) based on the analysis to ensure that the amplified light beam 210 interacts efficiently with the target 215, as discussed in greater detail below.

During offline mode, the light beam metrology apparatus 205 alters the one or more first aspects of the amplified light beam 210 in a known manner under control of the control apparatus 240.

The target metrology apparatus 230 is configured to detect or sense second information that is related to one or more second aspects of the modified target 235. For example, the detected second information includes information relating to one or more geometric or physical properties of the modified target 235. Alternatively, or in addition, the second information can include information relating to an operating condition of a target dispensing system (such as target apparatus 856, discussed below with reference to FIG. 8). Operating conditions of a target dispensing system can include pointing direction information of a nozzle in the target dispensing system, excitation amplitudes, frequencies and phases of actuation signals provided to the target dispensing system, and other measurements or control inputs provided to the target dispensing system. Such operating conditions can be used, for example, in identifying a calibration state of a target dispensing system (for example, the operating conditions associated with a moment in time when an observed condition matches a desired observed condition (such $T_R$, discussed below). The target metrology apparatus 230 can detect geometric and physical properties of the modified target 235 that relate to the shape, flatness, and/or orientation of the modified target 235 in the X, Y, Z coordinate system of the EUV light source 150. For example, the flatness of the modified target 235 can be indicated or determined by the relative size between the extent $E_S$ and the extent $E_L$. The orientation of the modified target 235 can be indicated or determined by an angle $R_X$ at which the axis $Z_T$ of the modified target 235 is rotated away from the Z axis, about the X axis, and an angle $R_Y$ at which the axis $Z_T$ of the modified target 235 is rotated away from the Z axis, about the Y axis.

The target metrology apparatus 230 detects the second information while the control apparatus 240 instructs the light beam metrology apparatus 205 to alter the one or more first aspects of the amplified light beam 210. The target metrology apparatus 230 analyzes the detected second information and determines a moment in time $(T_R)$ when the modified target 235 achieves a reference calibration state 230-CS.

The reference calibration state 230-CS can be considered as the moment when the modified target 235 aligns with the XY plane of the EUV light source 150; which means that each of the angles $R_X$ and $R_Y$ are 0. The reference calibration state 230-CS can also correspond to the moment when the modified target 235 is flattest or has the largest extent $E_L$. This reference calibration state 230-CS can be a useful reference condition because it can be, for example, the state of the modified target 235 that produces the highest conversion efficiency when interacted with the second amplified light beam 236. In general, it is desired to increase the conversion of the light from the EUV light source 150 into EUV radiation that forms the light beam 155 because too low a conversion efficiency can require an increase in the amount of power the EUV light source 150 needs to deliver, which, increases the cost for operating the EUV light source 150 and also increases the thermal load on all the components within the EUV light source 150. An increase in the conversion efficiency can help to meet the requirements for a high-volume manufacturing tool and at the same time keep the optical source power requirements within acceptable limits Various parameters impact the conversion efficiency, such as, for example, the properties of the amplified light beam 210 and the second amplified light beam, and the state of the target 215 and the modified target 235. The conversion efficiency can be defined at least in part based on the EUV energy produced by the EUV light emitted from the plasma (upon interacting the modified target 235 with the second amplified light beam 236).

Therefore, one way to increase, maintain, or optimize the conversion efficiency in various implementations of an EUV source is to ensure that the modified target 235 is flat and parallel with the XY plane at the moment that it interacts with the second amplified light beam 236.

The control apparatus 240 is configured to receive the information regarding the reference calibration state 230-CS from the target metrology apparatus 230. The control apparatus 240 analyzes the moment in time $T_R$ when the modified target 235 achieves the reference calibration state 230-CS. The control apparatus 240 determines a light beam calibration state 205-CS of the amplified light beam 210 as being the state of the amplified light beam 210 at the moment $T_R$ of the reference calibration state 230-CS. The control apparatus 240 also provides the light beam calibration state 205-CS to the light beam metrology apparatus 205.

Figure 3:
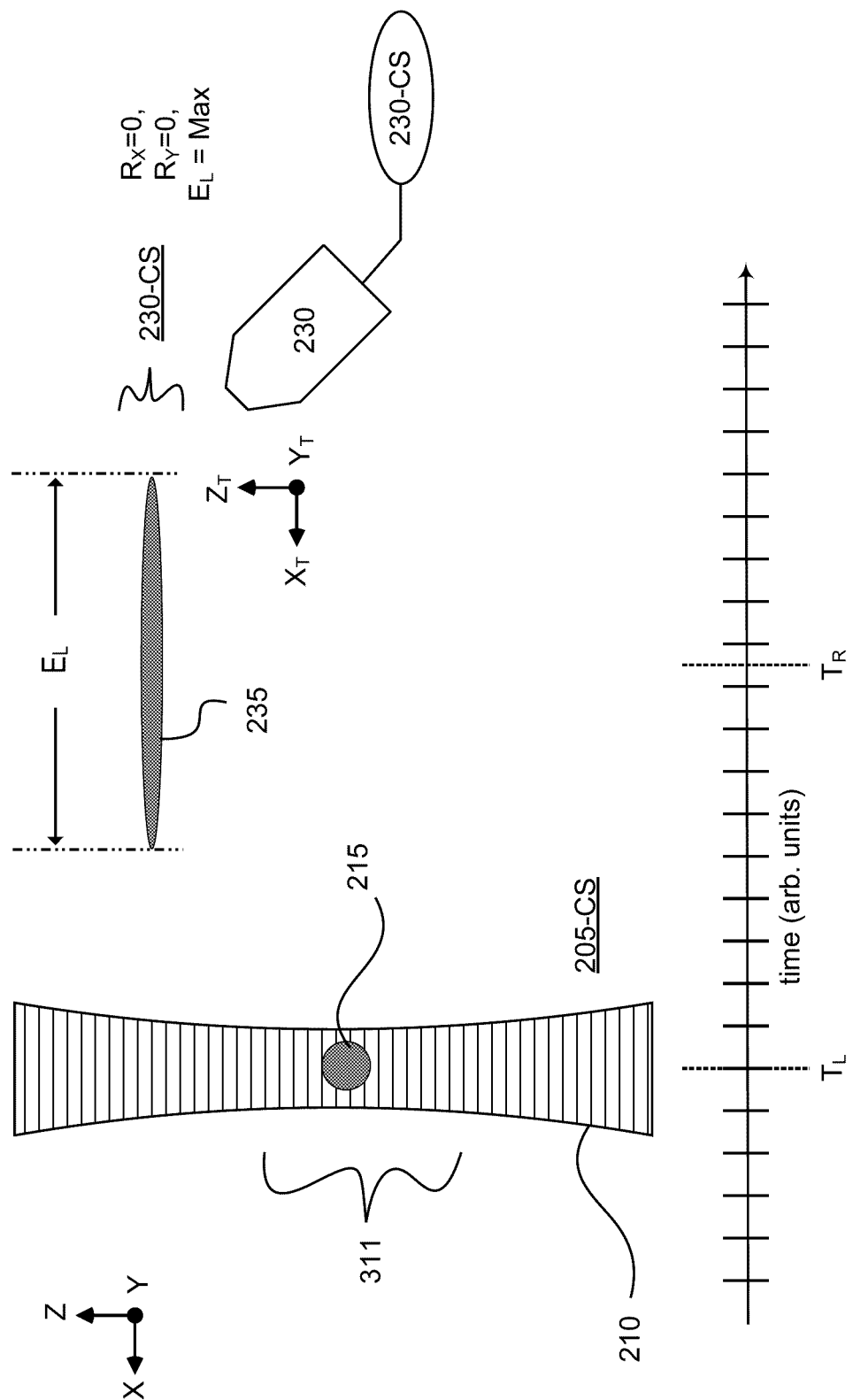
FIG. 3 is a schematic illustration showing an interaction between the light beam metrology apparatus and a target to form the modified target of FIGS. 2A and 2B, and an interaction between the target metrology apparatus and the modified target.

Referring to FIG. 3, in an implementation, the modified target 235 is shown in the reference calibration state 230-CS at the moment in time $T_R$. In the reference calibration state 230-CS, the modified target 235 is oriented so that its plane $(X_T, Y_T)$ is aligned with the X, Y plane and its extent $E_L$ is at its largest and aligned with the X, Y plane. The orientation is given by the values of the angles $R_X$, $R_Y$; and, in the reference calibration state 230-CS, the angles are $R_X=0$ and $R_Y=0$.

The reference calibration state 230-CS provides an indication about the state of the amplified light beam 210 that produced the reference calibration state 230CS. In this example, the reference calibration state 230-CS can be used to identify and therefore utilize a position and shape of the amplified light beam 210 that produced the reference calibration state 230-CS. Similarly, the reference calibration state 230-CS may be used to identify and therefore utilize an operating condition of a target dispensing system that produced the reference calibration state 230-CS. For example, the reference calibration state 230-CS can be understood as indicating that a focal region 311 of the amplified light beam 210 encompasses the target 215 and that the target 215 is generally centered in the focal region 311 of the amplified light beam 210 at a point in time $T_L$ that is prior to the time $T_R$. This state in which the focal region 311 of the amplified light beam 210 encompasses the target 215 is deemed by the control apparatus 240 to be the light beam calibration state 205-CS of the light beam metrology apparatus 205. This light beam calibration state 205-CS corresponds to the state of the amplified light beam 210 that results in the reference calibration state 230-CS. Specifically, in this example, the alignment of the modified target 135 with the XY plane occurs only when the focal region 311 of the amplified light beam 211 overlaps the target 215.

In other implementations, the reference calibration state 230-CS can indicate other light beam calibration states such as, for example, an energy, a value, a position, or a shape of the amplified light beam.

Next, the various components of the metrology system 200 are discussed before the operation of the metrology system 200 is discussed.

Figure 4:
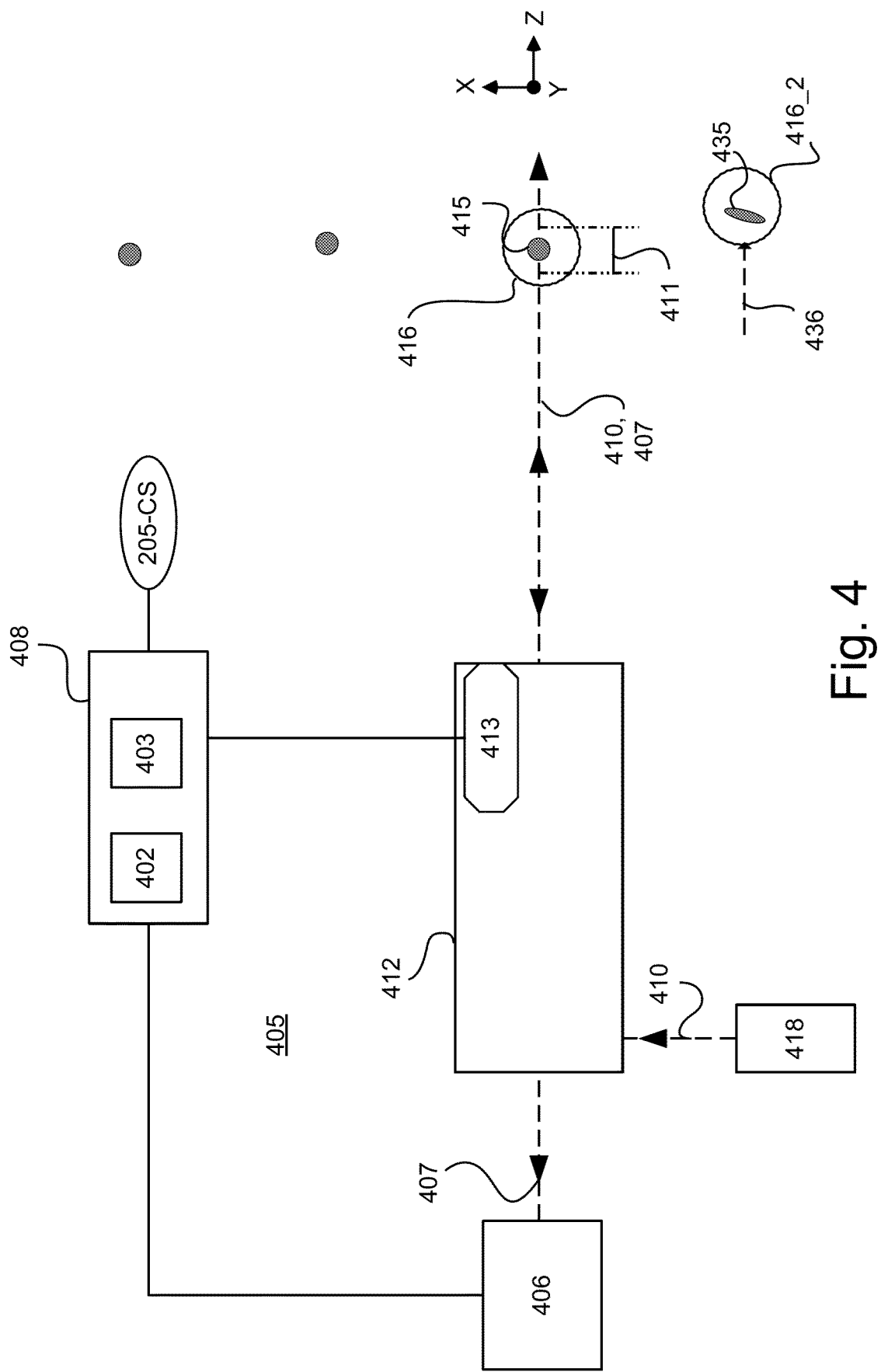
FIG. 4 is a block diagram of an implementation of the light beam metrology apparatus of FIG. 2A.

Generally, the light beam metrology apparatus 205 includes a set of components that interact with, create, adjust, direct, sense, or analyze the amplified light beam 210. In some implementations, and with reference to FIG. 4, the light beam metrology apparatus 205 is a light beam metrology apparatus 405 that is configured to sense one or more aspects of the irradiating amplified light beam 410 directed to the target 415 or reflected from the target 415. To this end, the light beam metrology apparatus 405 includes a sensing apparatus 406 configured to receive a reflected amplified light beam 407. The reflected amplified light beam 407 includes a reflection of at least a portion of the irradiating amplified light beam 410 that has interacted with the target 415.

The light beam metrology apparatus 405 is configured to sense the one or more aspects of the irradiating amplified light beam 410 in accordance with the light beam calibration state 205-CS. The light beam metrology apparatus 405 maintains the position of the irradiating amplified light beam 410 in the three dimensions X, Y, Z and relative to the target 415 during the online operation of the EUV light source 150. Specifically, the sensing apparatus 406 receives and measures the properties of the reflected amplified light beam 407. The measured properties output from the sensing apparatus 406 are used by a controller 408 within the light beam metrology apparatus 405 to determine and monitor the aspects (such as position and shape) of the irradiating amplified light beam 410 in the plurality of dimensions.

The light beam metrology apparatus 405 receives the irradiating amplified light beam 410 from a light source 418. The light source 418 includes at least one gain medium and an energy source that excites the gain medium to produce the irradiating amplified light beam 410. The irradiating amplified light beam 410 constitutes a plurality of optical pulses that are separated from each other in time. In other implementations, the beam output from the light source 418 can be a continuous wave (CW) beam. The light source 418 can be, for example, a solid-state laser (for example, Nd:YAG laser, an erbium-doped fiber (Er:glass) laser, or a neodymium-doped YAG (Nd:YAG) laser operating at 1070 nm and at 50 W power).

The light beam metrology apparatus 405 includes a beam adjustment system 412 configured to receive the irradiating amplified light beam 410 from the light source 418, and to redirect, steer, and focus the irradiating amplified light beam 410 toward a first target region or space 416 at which the target 415 is expected to be present. The beam adjustment system 412 includes an actuation system 413 in physical communication with one or more optical elements within the beam adjustment system 412 such that the one or more optical elements can be physically altered to thereby adjust the direction, steering, and/or focusing of the irradiating amplified light beam 410.

The light source 418 can also be configured to produce a second amplified light beam 436, which is directed toward a second target space 416_2 at which the modified target 435 is expected to be present. In some implementations, the second amplified light beam 436 can be split off from the irradiating amplified light beam 410 from a single light beam produced by one gain medium of the light source 418. In other implementations, the second amplified light beam 436 is produced from a second gain medium of the light source 418. In either implementation, at least a part of the second amplified light beam 436 can be directed through at least part of the beam adjustment system 412.

The controller 408 is in communication with the sensing apparatus 406 as well as the actuation system 413. The controller 408 can be in communication with the light source 418 as well. The controller 408 includes an electronic processor 402 and electronic storage 403. The processor 402 can be any type of electronic processor and can be more than one electronic processor. The processor 402 can include one or more processors suitable for execution of a computer program such as a general or special purpose microprocessor, and any one or more processors of any kind of digital computer. Generally, a processor receives instructions and data from a read-only memory or a random access memory or both. The electronic storage 403 stores instructions, perhaps as a computer program, that, when executed, cause the processor 402 to communicate with other components of the light beam metrology apparatus 405 or the controller 408. The electronic storage 403 can include volatile memory, such as RAM. The electronic storage 403 can include both non-volatile and volatile portions or components.

The actuation system 413 includes one or more actuators that are physically coupled to one or more elements within the beam adjustment system 412. The actuators within the actuation system 413 receive signals from the controller 408 and, in response, cause the one or more elements within the beam adjustment system 412 to be physically altered, for example, to move, change position, and/or rotate. As a result of the change to the one or more elements within the beam adjustment system 412, the location of a focal region 411 of the irradiating amplified light beam 410 is adjusted in the X, Y, Z volume.

The controller 408 communicates with the control apparatus 240 and receives the light beam calibration state 205-CS from the control apparatus 240 during the offline mode. The controller 408 stores the light beam calibration state 205-CS within memory. In particular, the light beam calibration state 205-CS is associated with a state of the components within the light beam metrology apparatus 405, such state producing an irradiating amplified light beam 410 having the focal region 411 that overlaps with the target 415. The light beam calibration state 205-CS is accessed by the sensing apparatus 406, which sets its internal calibration state to correspond to the light beam calibration state 205-CS.

The target 415 includes target material in a fluid state, such target material being any material that emits EUV light when in a plasma state. For example, the target material that makes up the target 415 can include water, tin, lithium, and/or xenon. The irradiating amplified light beam 410 strikes the target 415 and at least part of it is reflected to generate the reflected amplified light beam 407 while some of it is absorbed by the target 415 to thereby modify the shape of the target 415 and form the modified target 435. The reflected amplified light beam 407 propagates away from the target region 416 in a $-Z$ direction opposite from the direction along which the irradiating amplified light beam 410 travels. The reflected amplified light beam 407 travels through all or part of the beam adjustment system 412 and enters the sensing apparatus 406. As discussed above, the shape of the modified target 435 depends on the interaction between the irradiating amplified light beam 410 and the target 415. Additionally, the optimal target expansion rate (the rate at which the modified target 435 expands along its extent $E_L$) depends on the interaction between the irradiating amplified light beam 410 and the target 415. Thus, controlling the position and shape (including the location of the focal region 411) of the irradiating amplified light beam 410 relative to the target 415 while the EUV light source 150 is operating to produce the EUV light beam 155 can improve or increase the efficiency of operation of the EUV light source 150 and produce a more powerful EUV light beam 155.

To this end, the sensing apparatus 406 is configured to sense or detect information that indicates a position of the irradiating amplified light beam 410 and/or a position of the focal region 411, and to provide this information to the controller 408. As one example, measurements taken by the sensing apparatus 406 can be analyzed by the controller 408, which can determine that the focal region 411 does not coincide with the target region 416. In this case, the controller 408 can instruct the actuation system 413 to adjust one or more elements within the beam adjustment system 412 to thereby move the location of the focal region 411 of the irradiating amplified light beam 410 along the Z axis. In some implementations, in order to move the focal region 411 of the irradiating amplified light beam 410 along the Z axis, a curved mirror within the beam adjustment system 412 is translated and/or rotated. It is additionally or alternatively possible for the focal region 411 to be moved along either or both of the X and Y axes by adjusting the curved mirror or another element within the beam adjustment system 412.

The controller 408 is also configured to send instructions to the light source 418 based at least in part on the analysis of the output from the sensing apparatus 406 to thereby adjust the irradiating amplified light beam 410. For example, the controller 408 can be configured to send one or more instructions to the light source 418 to change one or more of a trigger or a timing of a pulse of the amplified light beam 410 and an energy of the pulse of the amplified light beam 410.

Figure 5:
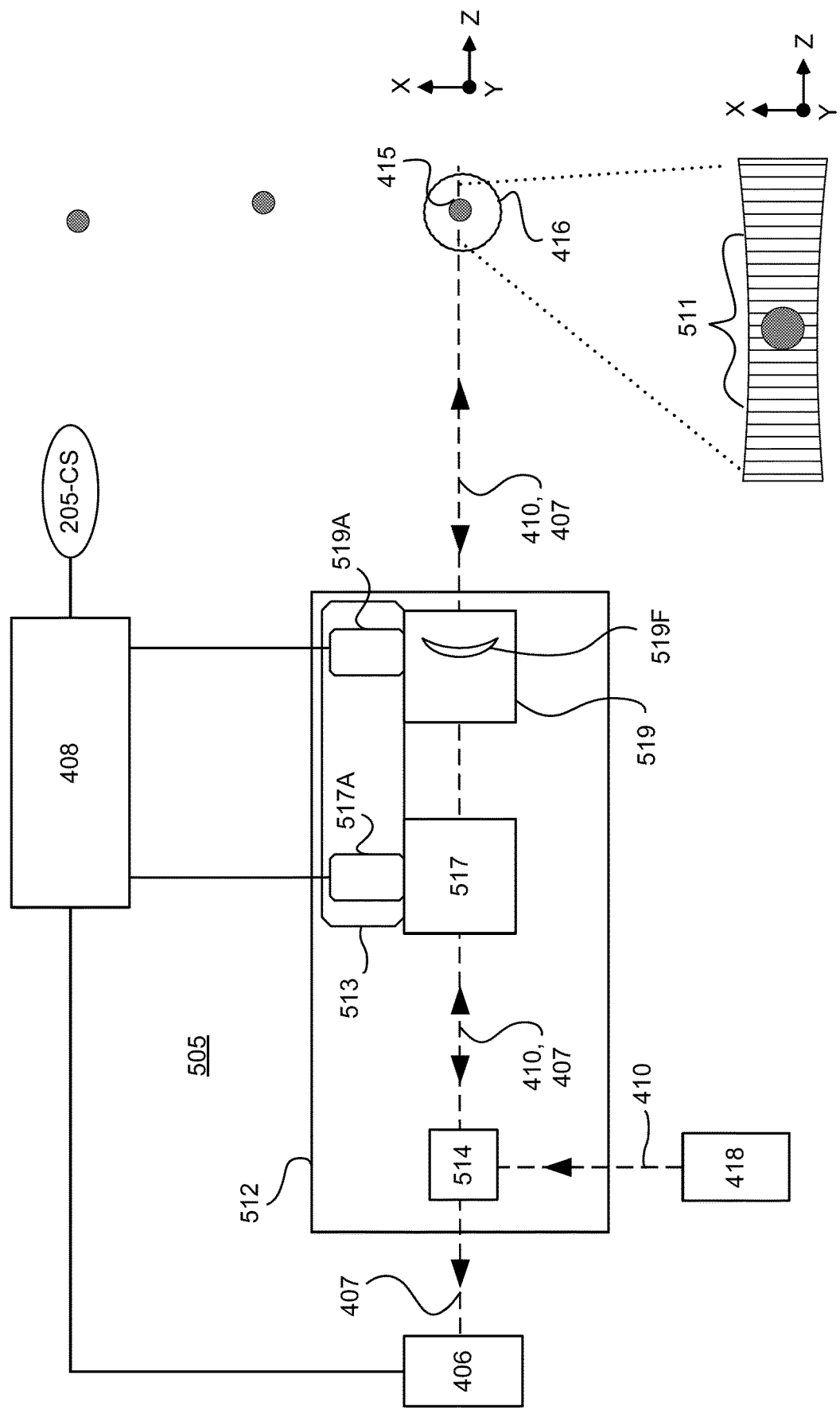
FIG. 5 is a block diagram of another implementation of the light beam metrology apparatus of FIG. 2A.

Referring to FIG. 5, in some implementations, the beam adjustment system 412 is a beam adjustment system 512 that includes an optical input/output coupler 514 for in-coupling the irradiating amplified light beam 410 from the light source 418 onto the path toward the target region 416 and for out-coupling the reflected amplified light beam 407 to the sensing apparatus 406. The input/output coupler 514 can include a partially reflective optical element that is configured to reflect the irradiating amplified light beam 410 onto the path toward the target region 416 while also transmitting the reflected amplified light beam 407 on its way from the target region 416 toward the sensing apparatus 406.

The beam adjustment system 512 includes a beam transport system 517 and a focusing system 519, each being controlled by respective actuators 517A, 519A of the actuation system 513, which receives instructions from the controller 408.

The beam transport system 517 is a collection of optical and/or mechanical elements that receives the irradiating amplified light beam 510 and steers the irradiating amplified light beam 510 as needed toward the focusing system 519. the beam transport system 517 can further include a beam expansion system that optically expands the irradiating amplified light beam 510. examples of a beam expansion system are found in U.S. Pat. No. 8,173,985, filed Dec. 15, 2009, and titled "Beam Transport System for Extreme Ultraviolet Light Source," which is hereby incorporated by reference in its entirety.

The focusing system 519 includes at least one focusing optic 519F that receives the irradiating amplified light beam 510 and focuses the light beam 510 to a focal region 511 that is within the target region 416. The focusing optic 519F can be a refractive optic (such as a lens), a reflective optic (such as a curved mirror), or a collection of optical elements that includes both refractive and reflective optical components. The focusing system 519 can also include additional optical components, such as turning mirrors, which can be used to position the focusing optic 519F relative to an amplified light beam that passes through the focusing optic 519F. The actuator 519A is configured to physically adjust (such as translate and/or rotate) the focusing optic 519F and any additional optical components, as needed to ensure that the light beam 510 is properly focused so that the focal region 511 overlaps with the target 415 within the target region 416.

Figure 6:
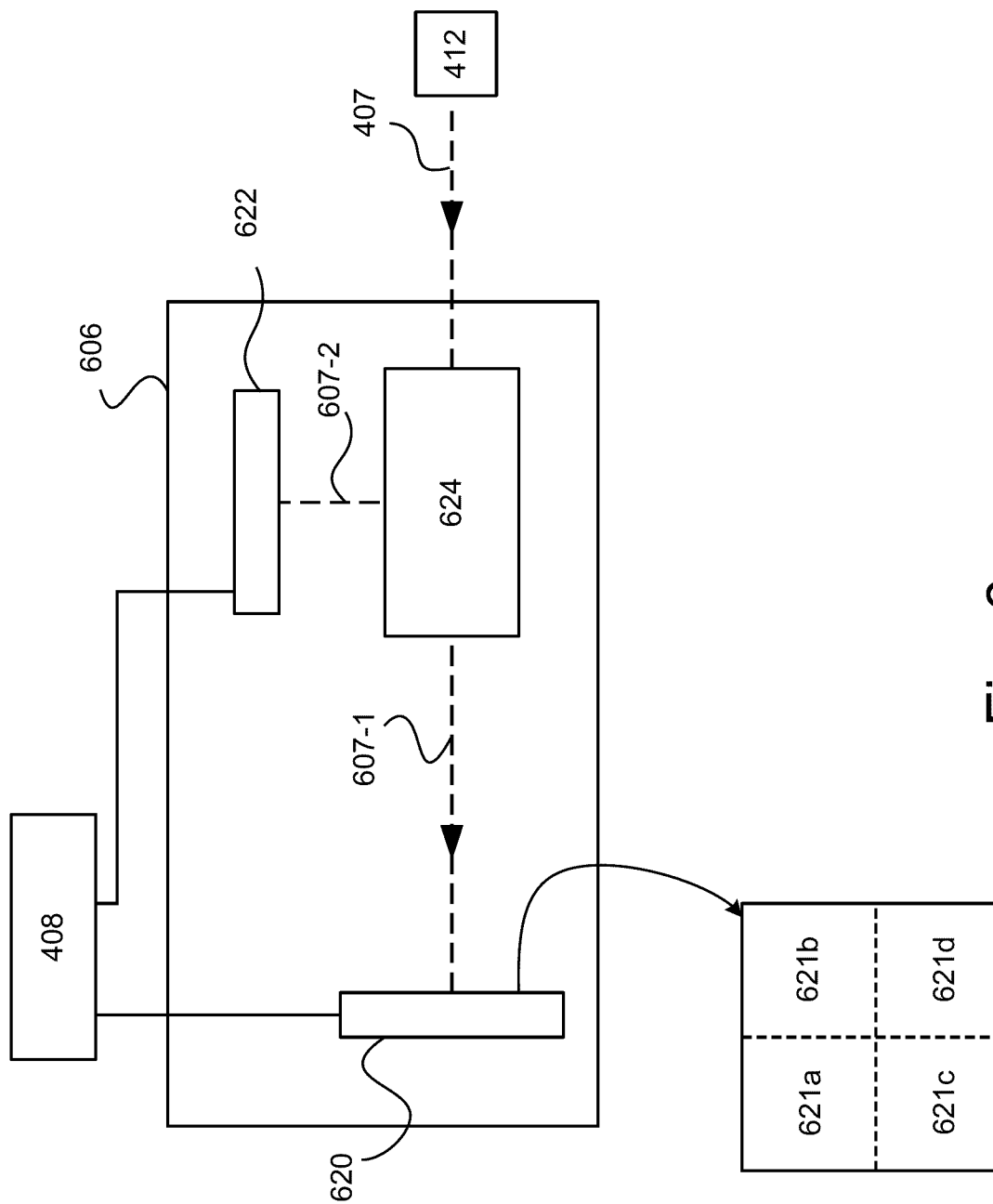
FIG. 6 is a block diagram of an implementation of a sensing apparatus of the light beam metrology apparatus of FIG. 4 or 5.

Referring to FIG. 6, in some implementations, the sensing apparatus 406 is a sensing apparatus 606 that includes a sensor 620, a sensor 622, and a set 624 of optical elements. The reflected amplified light beam 407 is directed to the set 624 of optical elements, at least one of which directs (including focusing) the reflected amplified light beam 407 as light beam 607-1 toward the sensor 620 and at least one of which directs (including focusing) the reflected amplified light beam 407 as light beam 607-2 toward the sensor 622. The sensors 620, 622 can acquire data at different sampling rates, and thus provide information about physical effects that occur on different time scales.

In some implementations, the sensor 620 can have a data acquisition rate that is at least as high as the repetition rate at which the light source 418 produces pulses of the irradiating amplified light beam 410 and the sensor 620 can have a data acquisition rate that is higher than the data acquisition rate of the sensor 622. For example, the sensor 620 can have a data acquisition rate of at least 50 kilohertz (kHz), at least 60 kHz, or about 63 kHz. Such a high acquisition rate enables the sensor 620 to be used by the controller 408 to monitor high-frequency disturbances or occurrences within the light beam metrology apparatus 405, such as mirror vibrations within the beam adjustment system 412 or variations in the trajectory of the target 415 (which require rapid changes to the location of the irradiating amplified light beam 410). The sensor 622 can have a data acquisition rate of below 1 kHz or below 100 Hertz (Hz).

Data from the sensor 620 can be used to produce an image that includes a representation of the reflected amplified light beam 407. As shown, the sensor 620 can be a quadrant sensor that includes a plurality of separate sensing elements 621a, 621b, 621c, 621d arranged in a square array. To measure the position of the beam 407 on the sensor 620, the amount of energy sensed at each of the sensing elements 621a, 621b, 621c, 621d is measured. To ensure that the position of the reflected amplified light beam 407 is measured accurately, the diameter of the beam 407 at the sensor 620 is larger than the diameter of any one of the sensing elements 621a, 621b, 621c, 621d but smaller than the diameter of the square array defined by the sensing elements 621a, 621b, 621c, 621d.

The sensor 622 can be any sensor that is sensitive to the wavelengths included in the reflected amplified light beam 407. Moreover, the at least one optical element of the set 624 that directs the reflected amplified light beam 407 as light beam 607-2 toward the sensor 622 can include an astigmatic optical element that modifies the focus of the wavefront of the light beam 607-2 and changes the ellipticity of the representation that is sensed by the sensor 622 whenever the focal region 411 moves along the Z axis.

Accordingly, the sensing apparatus 606 provides several measurements of position and/or shape of the reflected amplified light beam 407, one of which (sensor 620) can be used to locate the irradiating amplified light beam 410 relative to the target region 416 along the X and Y axes, which are along the dimensions that are transverse to the direction or propagation of the irradiating amplified light beam 410 and the other of which (sensor 622) can be used to locate the focal region 411 relative to the target region 416 along the Z axis, which is aligned with the direction of the irradiating amplified light beam 410.

Details about the sensing apparatus 606 are provided in U.S. Pat. No. 9,000,405, issued Apr. 7, 2015, and titled "Beam Position Control for an Extreme Ultraviolet Light Source," which is incorporated herein by reference in its entirety.

The light beam calibration state 205-CS that is stored for access by the sensing apparatus 606 provides a calibration state for the irradiating amplified light beam 410. That is, the calibration state can be considered as the state at which the irradiating amplified light beam 410 is at (0, 0, 0) in the X, Y, Z coordinate system. The sensing apparatus 606 operates by comparing the data that it receives/senses to the calibration state 205-CS. In this case, because the light beam calibration state 205-CS is determined by the metrology system 200, in this case by analyzing the reference calibration state 230-CS from the target metrology apparatus 230, which is able to determine the actual moment when the target region 311 of the irradiating amplified light beam 210 overlaps the target 215 so that the target 215 is centered within the target region 311, the light beam metrology apparatus 205/405 knows the how to interpret data that is received at the sensing apparatus 606.

Figure 7:
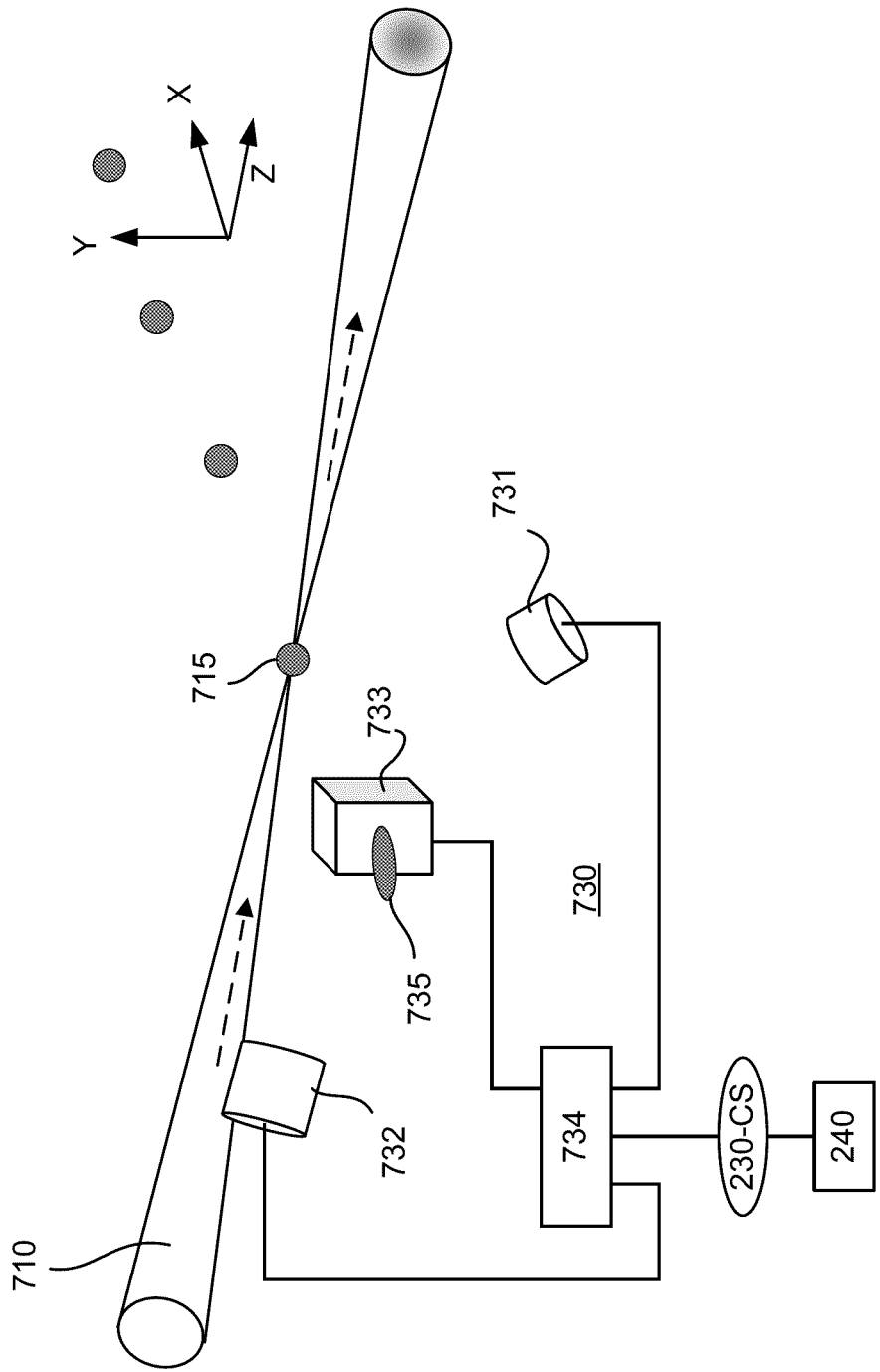
FIG. 7 is a block diagram of an implementation of the target metrology apparatus of FIG. 2A.

Referring to FIG. 7, the target metrology apparatus 230 is a target metrology apparatus 730 that includes two or more two-dimensional recording devices 731, 732 that are arranged relative to the modified target 735 so that their imaging planes are not parallel with each other. Moreover, their respective imaging planes can be offset from any of the planes of the X, Y, Z coordinate system. For example, the imaging planes of the recording devices 731, 732 are not parallel with any of the following planes: XY, XZ, or YZ. The imaging planes of the recording devices 731, 732 can be arranged so that they are 20°-120° apart from each other.

Each recording device 731, 732 includes an image sensor, and each image sensor is therefore arranged to sense an image in a distinct imaging plane. By imaging in two distinct imaging planes, it is possible for the target metrology apparatus 230 to determine a shape or geometry and extent of the modified target 735 in all three dimensions, X, Y, and Z.

In further implementations, the target metrology apparatus 730 also includes a probe module 733 designed to produce one or more diagnostic light beams that interact with the modified target 735. These diagnostic light beams have a wavelength that is distinct from the wavelength of the irradiating amplified light beam 710 so that any light detected by the recording device 731, 732 due to the interaction between the diagnostic light beams and the modified target 735 can be distinguished from the light of the amplified light beam 710.

The recording devices 731, 732 can be configured to record or sense one or more two-dimensional representations of light that is produced due to the interaction between the modified target 735 and the one or more diagnostic light beams. For example, the light that is produced due to the interaction between the modified target 735 and the one or more diagnostic light beams can be light that traverses or passes around the modified target 735, such that the two-dimensional representation that is recorded at the recording device 731, 732 is a shadow of the modified target 735 obscuring a portion of the diagnostic light beam. In such implementations, the recording device 731, 732 is arranged on a side of the modified target 735 that is opposite to the side at which the diagnostic light beam approaches the modified target 735. As another example, the light that is produced due to the interaction between the modified target 735 and the one or more diagnostic light beams can be light from the diagnostic light beam that is scattered or reflected from the modified target 735.

In some implementations, each of the two-dimensional recording devices 731, 732 is a camera that captures the two-dimensional representation of the light. Thus, for example, the two-dimensional recording device includes a two-dimensional array of thousands or millions of photo sites (or pixels), such array defining the imaging plane. The light is directed onto the photo-sensitive area of each pixel where it is converted into electrons that are collected into a voltage signal and the array of these signals forms the two-dimensional image. The recording devices 731, 732 can be high speed cameras that are fast enough to detect, record, and output the two-dimensional image of the detected light for the modified target 735 before the next modified target enters the imaging region encompassed by the recording device 731, 732. The frame rate of each camera can, in some implementations, be greater than or equal to the rate at which the targets 715 are produced to enable a rapid analysis of the data. If the targets 715 are produced at a rate of 50 kHz, then the frame rate of each camera can be greater than 50 kHz. In other implementations, the frame rate of each camera is less than the rate at which the targets 715 are produced; in this case, it may take a little longer for the control apparatus 140 to determine the calibration state 105-CS based on the analysis of the reference calibration state 130-CS.

In some implementations, each camera is a complementary metal-oxide semiconductor (CMOS) while in other implementations, each camera is a charged coupled device (CCD) or an infrared camera. The cameras can have an exposure time on the order of nanoseconds (ns), for example, between 20-200 ns, or between 30-50 ns, or even greater and up to about 300 is. The cameras can have an exemplary resolution of about 1696×1710 pixels, a pixel size on the order of micrometers, for example, about 5 μm, or about 8 μm. The cameras can have a gain that is anywhere between 0-12 dB, or about 1.0 dB.

In some implementations, the imaging plane of the recording device 731 is a plane defined by two axes: a first axis, which is aligned with the Z axis, and a second axis, which is an axis (XY-731) lying in the XY plane. And, the imaging plane of the recording device 732 is a plane defined by two axes: a first axis, which is aligned with the Z axis, and a second axis, which is an axis (XY-732) lying in the XY plane, where the XY-732 axis is distinct from the XY-731 axis.

The target metrology apparatus 730 includes a controller 734 in communication with the recording device 731, 732 and configured to receive the two-dimensional representations from each of the recording devices 731, 732. The controller 734 is also in communication with the probe module 733. Either or both of the controller 734 (within the target metrology apparatus 730) and the controller 408 (within the light beam metrology apparatus 405) can be integrated within the control apparatus 140 of the metrology system 100. Moreover, the target metrology apparatus 730 can include other optical elements such as imaging lenses, mirrors, etc., not shown in FIG. 7.

While the target metrology apparatus 730 is configured to sense or detect aspects associated with the modified target 735, the target metrology apparatus 730 is unable to directly sense the irradiating amplified light beam 710. Therefore, the amplified light beam 710 is effectively invisible to the recording devices 731, 732.

Figure 8:
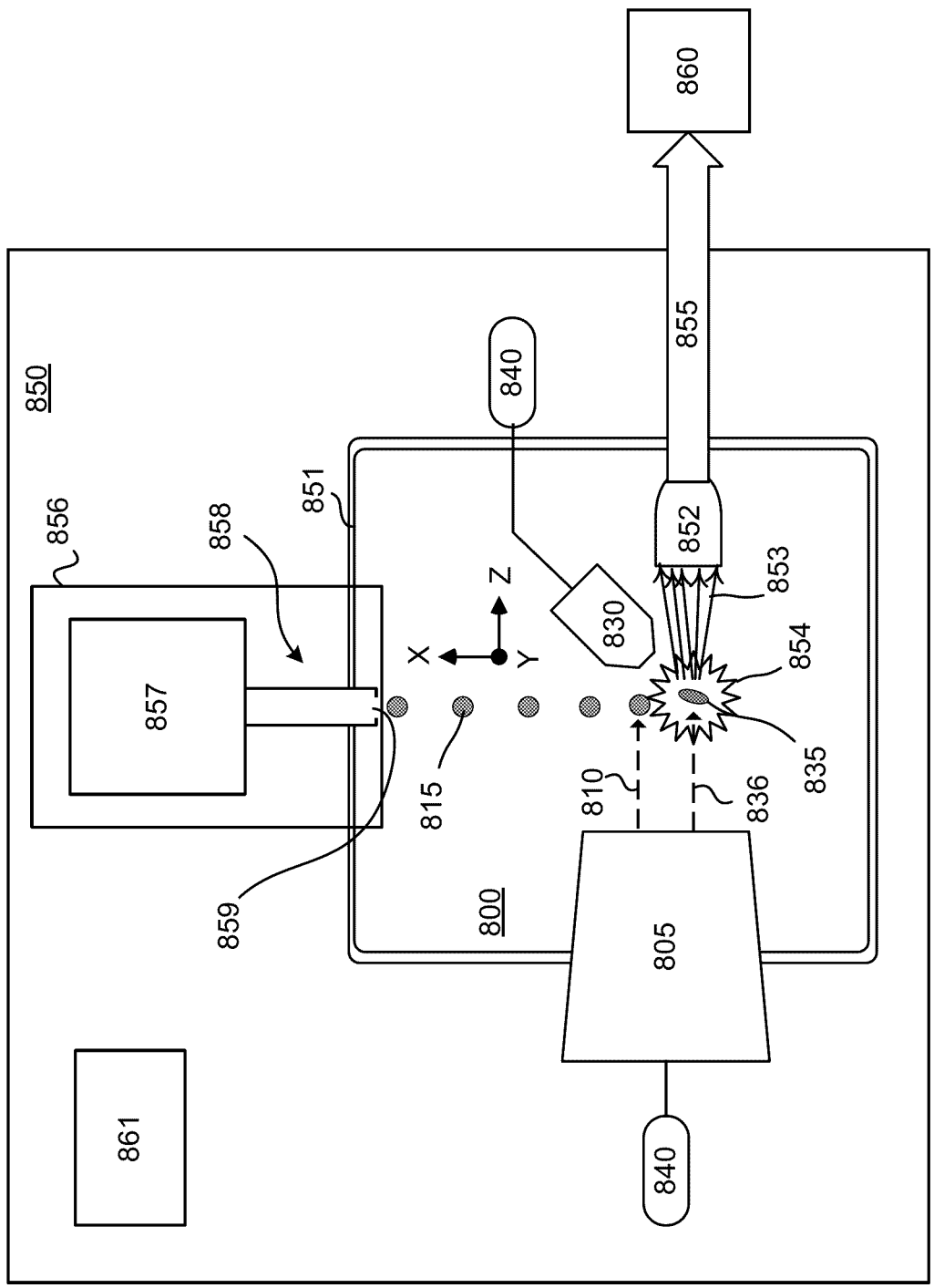
FIG. 8 is a block diagram of an implementation of the metrology system and an EUV light source.

Referring to FIG. 8, an implementation 800 of the metrology system 100 is incorporated into an EUV light source 850 that, when in online mode, supplies an EUV light beam 855 to an output apparatus 860, which can be a lithography exposure apparatus (which is also referred to as a scanner). The EUV light source 850 includes a vacuum chamber 851 (or vessel) that defines a first target space (such as the first target space 416 shown in FIG. 4) at which each target 815 interacts with the amplified light beam 810 and a second target space (such as the second target space 416_2 shown in FIG. 4) at which each modified target 835 interacts with the second amplified light beam 836.

The EUV light source 850 includes an EUV light collector 852 arranged relative to the second target space. The EUV light collector 852 collects EUV light 853 emitted from a plasma 854 that is produced when the modified target 835 interacts with the second amplified light beam 836. The EUV light collector redirects that collected EUV light 853 as the EUV light beam 855 toward the output apparatus 860. The EUV light collector 852 can be a reflective optical device such as a curved mirror that is able to reflect light having EUV wavelength (that is, the EUV light 853) to form the produced EUV light beam 855, the collector 852 defining a primary focus within the target space and a secondary focus at the exit of the chamber 851.

The EUV light source 850 includes a target apparatus 856 that forms a stream of targets 815 directed to the first target space for interaction with the amplified light beam 810. The targets 815 are formed from target material that produces the EUV light 853 when in a plasma state. The first target space is, for example, a location at which the targets 815 are converted to the plasma state. The target apparatus 856 includes a reservoir 857 defining a hollow interior that is configured to contain a fluid target material. The target apparatus 856 includes a nozzle structure 858 having an opening (or orifice) 859 in fluid communication with the interior of the reservoir 857 at one end. The target material, in a fluid state, being under the force of a pressure P (as well as other possible forces such as gravity), flows from the interior of the reservoir 857 and through the opening 859 to form the stream of targets 815. The trajectory of the targets 815 that are ejected from the opening 859 generally extends along the −X direction, although it is possible for the trajectory of the targets 815 to include components along the plane perpendicular to the −X direction (that is, Y and Z components).

Each modified target 835 is converted at least partially or mostly to plasma through its interaction with the pulses in the second amplified light beam 836 produced by the light beam metrology apparatus 805, such interaction occurring in the second target space. Each target 815 is a target mixture that includes a target material and optionally impurities such as non-target particles. The target 815 can be, for example, a droplet of liquid or molten metal, a portion of a liquid stream, solid particles or clusters, solid particles contained within liquid droplets, a foam of target material, or solid particles contained within a portion of a liquid stream. The target 815 can include, for example, water, tin, lithium, xenon, or any material that, when converted to a plasma state, has an emission line in the EUV range. For example, the target 815 can include the element tin, which can be used as pure tin (Sn); as a tin compound such as SnBr4, SnBr2, SnH4; as a tin alloy such as tin-gallium alloys, tin-indium alloys, tin-indium-gallium alloys, or any combination of these alloys.

The EUV light source 850 can include a controller 861 in communication with the control apparatus 840 as well as other components (such as the target apparatus 856) of the EUV light source 850. Alternatively, it is possible for the control apparatus 840 to be a part of the controller 861.

The X, Y, Z coordinate system of the EUV light source 850 can be fixed or determined based on an aspect of the vacuum chamber 851. For example, the chamber 851 can be defined by a set of walls, and three points on one or more walls of the chamber 851 or within the space of the chamber 851 can provide reference for the X, Y, Z coordinate system. It is possible to fix one or more of the components of the target metrology apparatus 830 to one or more walls of the chamber 851. For example, both of the two-dimensional recording devices 731, 732 can be fixed to one or more of the walls of the chamber 851, and the relative positions between the imaging planes of the respective recording devices 731, 732 in the X, Y, Z coordinate system is fully known.

The EUV light source 850 can further include other metrology apparatuses not shown. For example, the EUV light source 850 can include a coarse target steering camera and a fine target steering camera positioned to view the targets 815 as they travel toward the first target space, such steering cameras being in communication with the controller 861. The controller 861 can analyze the data from these steering cameras to determine a position of the target 815 in one or more of the Y and Z directions. As another example, the EUV light source 850 can include target metrology module for controlling a timing at which the light beam metrology apparatus 805 (and specifically the light source within the apparatus 805) produces pulses of the light beam 810 and/or the second amplified light beam 836. Still further, the EUV light source 850 can include a set of sensors arranged and configured to detect or sense the EUV light 853; such information about the EUV light 853 can be analyzed by the controller 861 for use in other aspects or control of the EUV light source 850.

Figure 9:
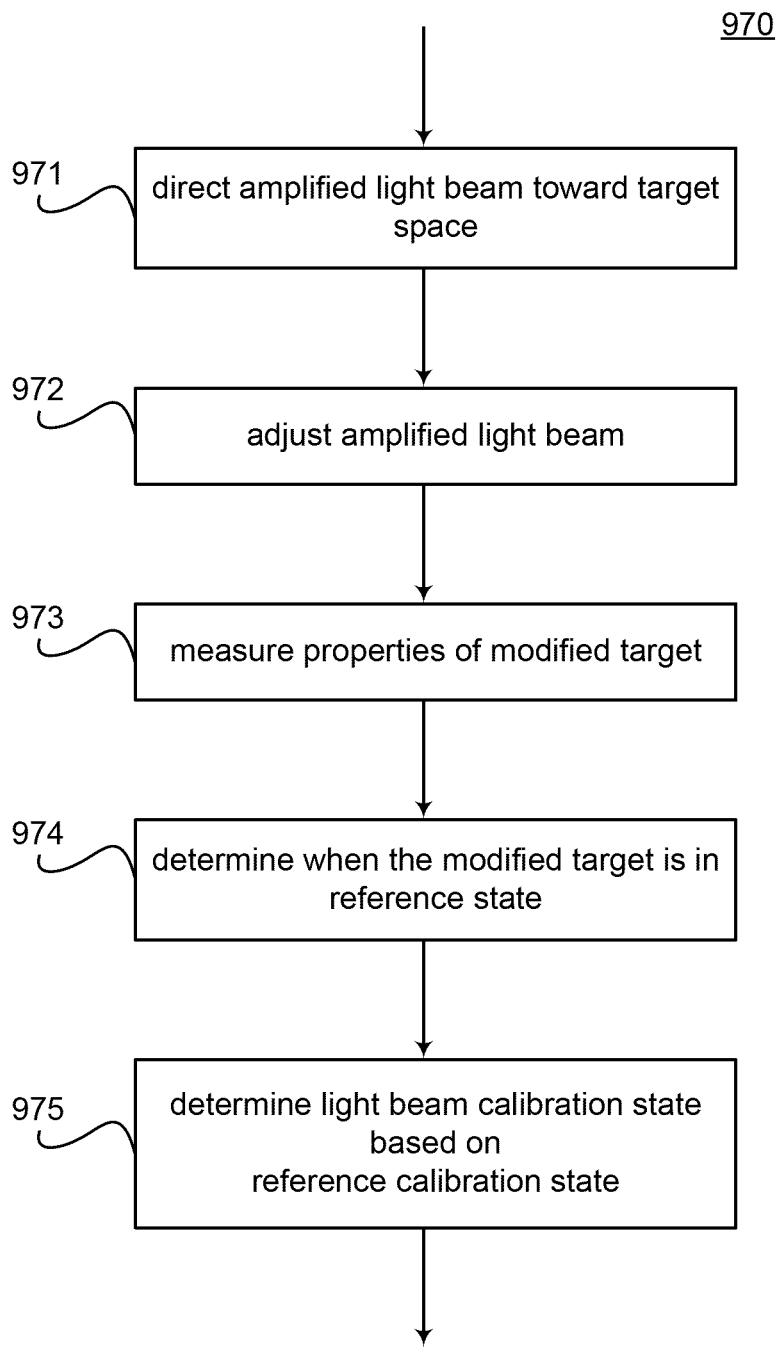
FIG. 9 is a flow chart of a procedure performed by the metrology system of any one of FIGS. 1A, 2A, and 8.

Referring to FIG. 9, a calibration procedure 970 is performed by the metrology system 200 while in an offline mode. The procedure 970 can be performed by various aspects of the control apparatus 240 or controllers within the light beam metrology apparatus 205 and the target metrology apparatus 230.

The light beam metrology apparatus 205 directs the amplified light beam 210 toward the first target space so that the amplified light beam 210 interacts with the target 215 (971). The light beam metrology apparatus 205 adjusts one or more features of the amplified light beam 210 (972). The target metrology apparatus 230 measures one or more properties of the modified target 235, which is produced from the interaction of the target 215 with the amplified light beam 210 in the target space (973). Next, the target metrology apparatus 230 determines, based on the measured properties of the modified target 235, a moment in time ($T_R$) when the modified target 235 is in the reference calibration state 230-CS (974). The control apparatus 240 accesses the determination from the target metrology apparatus 230 and also the features of the amplified light beam 210 from the light beam metrology apparatus 205. The control apparatus 240 assigns the one or more features of the amplified light beam 210 that produced the reference calibration state 230-CS to a light beam calibration state 205-CS (975). The procedure 970 is discussed in detail next.

Initially, the light beam metrology apparatus 205 directs the amplified light beam 210 toward the first target space so that the amplified light beam 210 interacts with the target 215 (971). For example, and with reference to FIG. 4, the controller 408 can instruct the light source 418 to produce the amplified light beam 410, and the controller 408 can instruct the actuation system 413 to set the actuators so that the amplified light beam 410 is directed toward the first target space 416.

Figure 10A:
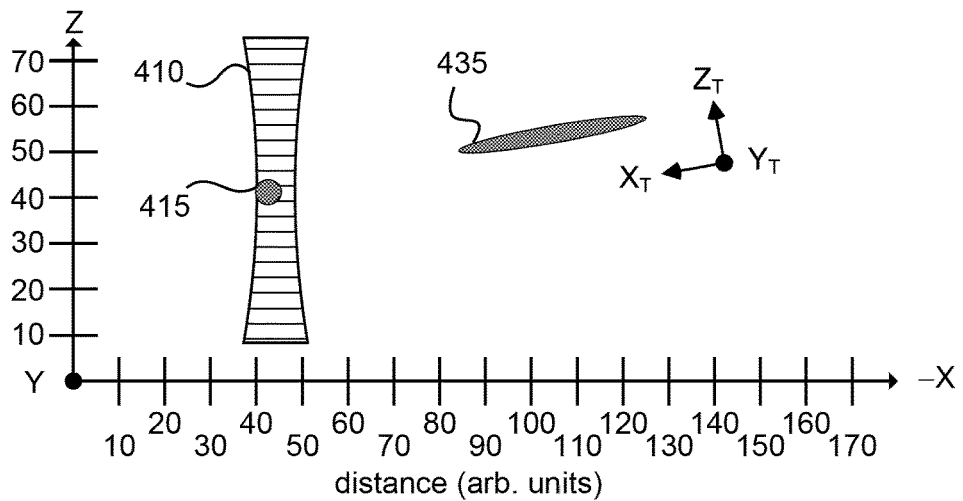
FIGS. 10A-10C show a scanning of an amplified light beam produced by the light beam metrology apparatus of any one of FIGS. 1A, 2A, 4, 5, and 8 along an −X direction of the EUV light source by the adjustment of one or more optical elements within a beam adjustment system of the light beam metrology apparatus.
Figure 10B:
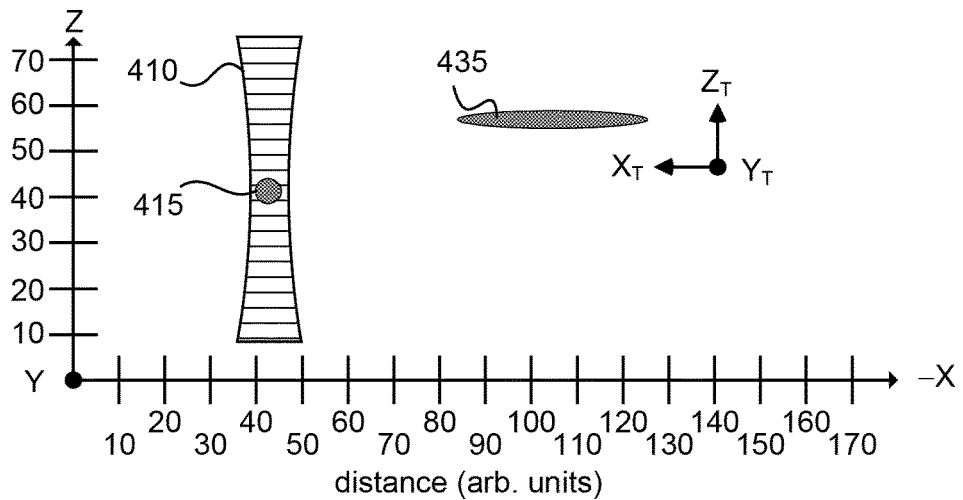
Figure 10C:
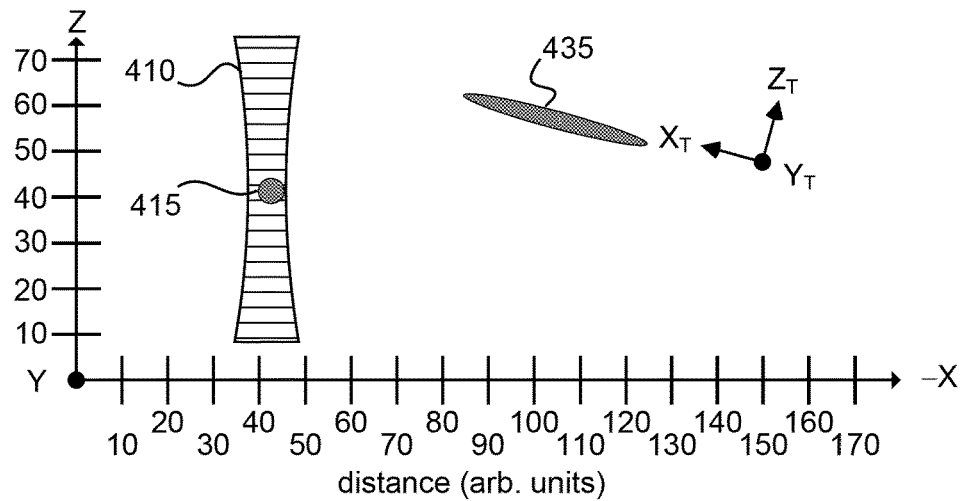

Next, the light beam metrology apparatus 205 adjusts one or more features of the amplified light beam 210 (972). For example, and with reference to FIG. 4, the controller 408 can instruct the actuation system 413 to adjust features of the amplified light beam 410, such as features that control the focal region 411 (the direction and/or location in the X, Y, Z coordinate system) of the amplified light beam 410. The actuation system 413 can adjust a last optical element of the beam adjustment system 412, such last optical element including a final focus mirror, which is a curved mirror that redirects and focuses the amplified light beam 410. The actuation system 413 can adjust the features in steps through a set of possible values so that the various aspects or features of the amplified light beam 410 are probed through a range of possible values. For example, and with reference to FIGS. 10A-10C, the amplified light beam 410 is scanned along the −X direction by the adjustment of one or more optical elements within the beam adjustment system 412. While only three distinct steps are shown in FIGS. 10A-10C, many more scanning steps can be used.

The target metrology apparatus 230 measures one or more properties of the modified target 235, which is produced from the interaction of the target 215 with the amplified light beam 210 in the target space (973). For example, and with reference to FIG. 7, the recording devices 731, 732 record two-dimensional representations of the modified target 735 as the amplified light beam 410 is scanned across the set of values.

As discussed above, while the recording devices 731, 732 are configured and able to measure aspects relating to the modified target 735, such measurements are independent of any sensing associated with the amplified light beam 710; that is, the analysis performed by the target metrology apparatus 230 does not rely on information sensed about the amplified light beam 710.

The target metrology apparatus 230 determines, based on the measured properties of the modified target 235, a moment in time ($T_R$) when the modified target 235 is in the reference calibration state 230-CS (974). As an example, and with reference to FIG. 7, the controller 734 can analyze the recorded two-dimensional representations output from the recording devices 731, 732 to determine the moment $T_R$ when the modified target 735 reaches the reference calibration state 230-CS. Referring to the example of FIGS. 10A-10C, the reference calibration state 230-CS is shown in FIG. 10B and this is the moment when the largest extent $E_L$ aligns with the XY plane, the angles $R_X$ and $R_Y$ are both 0.

The two-dimensional representations of the modified target 735 recorded by the recording devices 731, 732 provide enough information to enable the controller 734 to determine the orientation of the modified target 735 relative to a first image plane and also an orientation of the modified target 735 relative to a second image plane orthogonal to the first image plane. Additionally, the two-dimensional representations of the modified target 735 recorded by the recording devices 731, 732 provide information relating to a position of the modified target 735 in the X, Y, and Z directions, as well as information that can be used to determine an expansion rate of the modified target 735 (for example, by comparing a position, shape, or size of the expanding modified target 735 between two or more images taken at two distinct moments in time).

The controller 734 can determine that the modified target 735 achieves the reference calibration state 230-CS at the moment when the modified target 735 has a desired extent along each of two projected planes (such as the XZ plane and the YZ plane) from the imaging planes of the recording device 731, 732. For example, the desired extent (for the reference calibration state 230-CS) can be a maximum value along one of the planes and a minimum value along the other of the planes. In this example, the reference calibration state 230-CS indicates that the focal region 411 of the amplified light beam 410 encompasses the target 415 in the target space and the target 415 is centered in the focal region 411 of the amplified light beam 410 in the X, Y, Z space.

The reference calibration state 230-CS of the modified target 435 can be a state in which the distribution of the modified target 435 is symmetric about at least one axis X, Y, or Z that defines target space.

The control apparatus 240 assigns the one or more features of the amplified light beam 210 that produced the reference calibration state 230-CS to a light beam calibration state 205-CS (975). For example, with reference to FIGS. 10A-10C, the control apparatus 240 determines the aspects relating to the light beam metrology apparatus 405 that formed the amplified light beam 410 that resulted in the reference calibration state of the modified target 435 as shown in FIG. 10B. For example, the control apparatus 240 can access the settings of the actuation system 413 and/or the settings within the light source 418.

Once the control apparatus 240 has assigned the features to the light beam calibration state 205-CS, the control apparatus 240 provides this light beam calibration state to the light beam metrology apparatus 205, which can store the light beam calibration state 205-CS within memory of its controller (such as the controller 408 of the metrology apparatus 405).

Additionally, at this time, additional steps may be performed to calibrate other aspects of the EUV light source 150. However, once the EUV light source 150 is finished being calibrated and set up, then the EUV light source 150 can begin operation in online mode to produce the light beam 155 for use by the output apparatus 160. At this time, the light beam metrology apparatus 205 can control aspects of the amplified light beam 210 in accordance with the light beam calibration state 205-CS. For example, with reference to FIG. 4, the controller 408 can analyze the output from the sensing apparatus 406 based on the stored light beam calibration state 205-CS. In particular, as discussed above, the sensing apparatus 406 detects or senses the reflected amplified light beam 407, which including a reflection of at least a portion of the irradiating amplified light beam 410 that has interacted with the target 415.

Additionally, the control apparatus 240 can be configured to estimate a rate of expansion of the modified target 235, to thereby determine whether one or more aspects of the amplified light beam 210 should be adjusted based on the estimated expansion rate. The control apparatus 240 can send instructions to light beam metrology apparatus 205 to instruct an adjustment to one or more aspects of the amplified light beam 210 based on this determination. For example, with reference to FIG. 4, the control apparatus 240 can send instructions to the controller 408 to adjust one or more aspects of the light source 418 and/or the beam adjustment system 412 to thereby adjust one or more aspects of the amplified light beam 410.

Figure 11A:
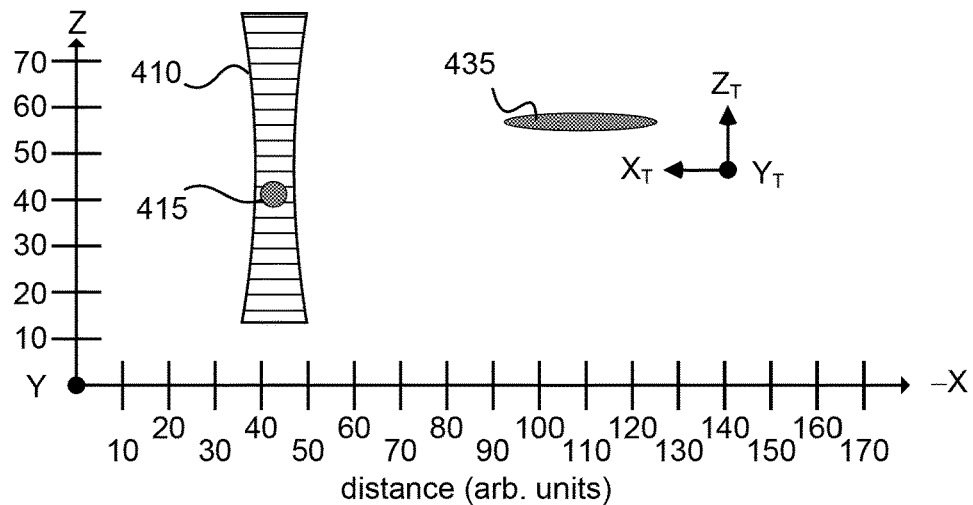
FIGS. 11A-11C show a scanning of an amplified light beam produced by the light beam metrology apparatus of any one of FIGS. 1A, 2A, 4, 5, and 8 along a Z direction of the EUV light source by the adjustment of one or more optical elements within the beam adjustment system of the light beam metrology apparatus.
Figure 11B:
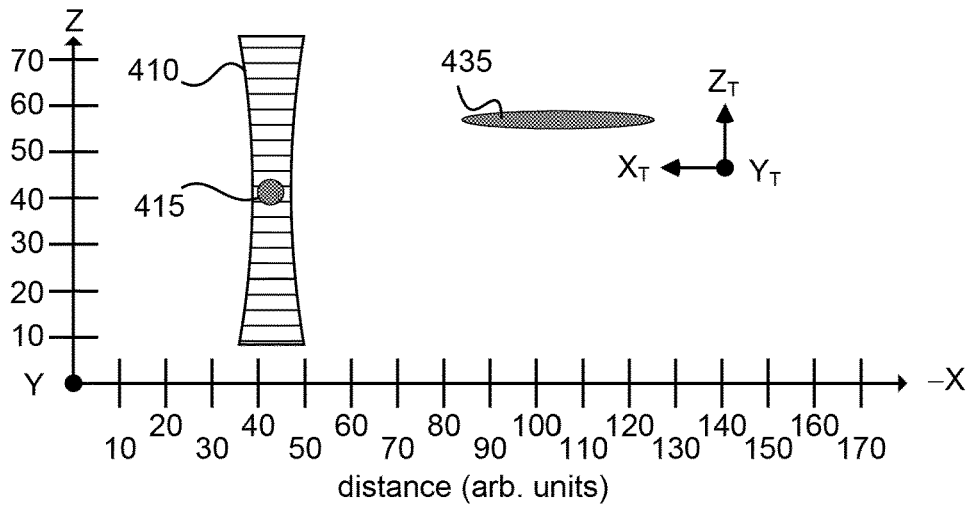
Figure 11C:
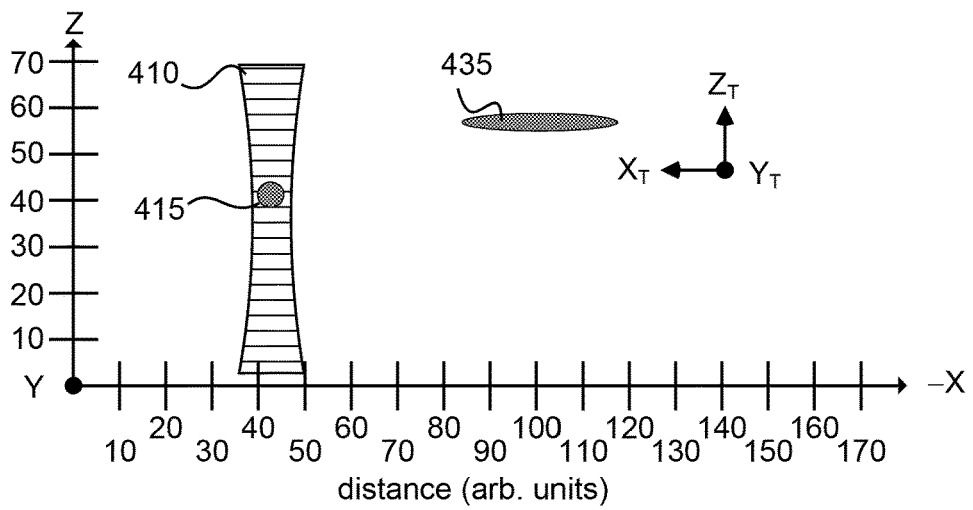

As discussed above, the light beam metrology apparatus 205 adjusts one or more features of the amplified light beam 210 at step 972. In the example of FIGS. 10A-10C, the amplified light beam 410 is scanned along the −X direction by the adjustment of one or more optical elements within the beam adjustment system 412. In other implementations, such as shown in FIGS. 11A-11C, the amplified light beam 410 is scanned along the Z direction. For example, with reference to FIG. 4, the controller 408 can instruct the actuation system 413 to adjust features of the amplified light beam 410, such as features that control the focal region 411 (the direction and/or location in the X, Y, Z coordinate system) of the amplified light beam 410 along the Z direction. The actuation system 413 can adjust a last optical element of the beam adjustment system 412, such last optical element including a final focus mirror, which is a curved mirror that redirects and focuses the amplified light beam 410. In this example, the extent $E_L$ of the modified target 435 is at its largest in FIG. 11B. With reference to FIG. 7, controller 734 can determine that the extent $E_L$ of the modified target 735 is largest by analyzing a projected intensity of the light in each of the two projected planes (such as the XZ plane and the YZ plane) from the imaging planes of the recording device 731, 732, and determining when this projected intensity is greatest.

Figure 12:
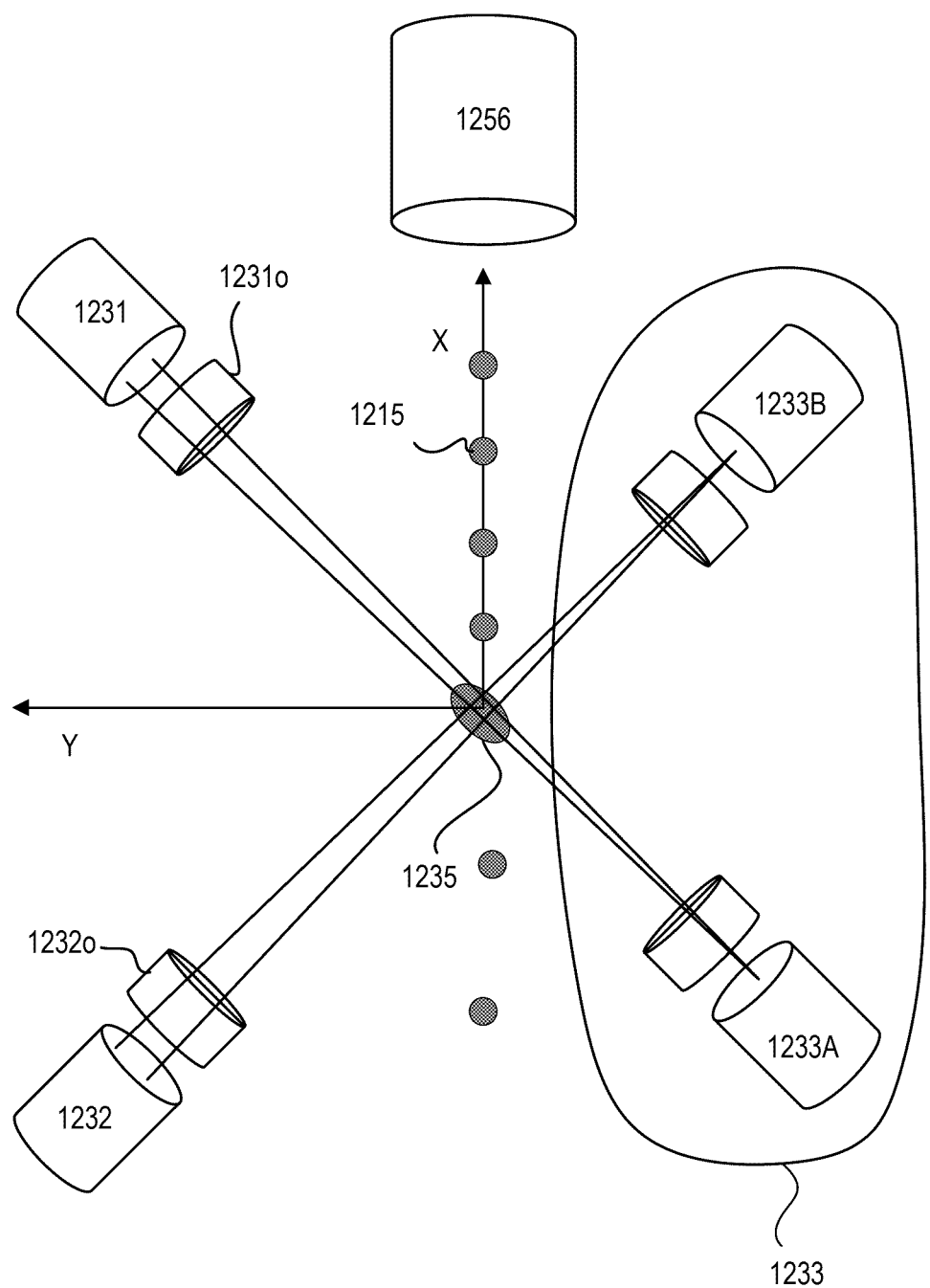
FIG. 12 is a perspective view of another implementation of the target metrology apparatus of FIG. 2A.

Referring to FIG. 12, an implementation of a target metrology apparatus 1230 is shown. In this implementation, the targets 1215 are produced from the target apparatus 1256 and travel generally along the −X direction toward a target space at which they will interact with one or more light beams (such as light beams 810, 836) that are directed along the Z direction (which is out of the page in FIG. 12). The target metrology apparatus 1230 includes two or more two-dimensional recording devices 1231, 1232 that are arranged relative to the modified target 1235 (which is produced due to the interaction between the target 1215 and at least one of the light beams). In this implementation, the imaging planes of the recording devices 1231, 1232 are not parallel with each other and are offset from any of the planes of the X, Y, Z coordinate system. In this example, the imaging planes of the recording devices 1231, 1232 are offset from each other by about 90° and lie in a plane defined by the Z direction and a direction that lies in the XY plane. In addition to each recording device 1231, 1232 including an image sensor, each recording device 1231, 1232 includes a respective set of imaging optics 1231*o*, 1232*o* for collecting the light directed to the respective image sensor.

The target metrology apparatus 1230 also includes a probe module 1233 including a first backlight module 1233A and a second backlight module 1233B, each designed to produce one or more diagnostic light beams that interact with the modified target 1235. The diagnostic light beams from first and second backlight module 1233A, 1233B are directed, respectively, toward the recording device 1231, 1232.

Conventional EUV light sources require complex and time-consuming calibration procedures to align the components within the EUV light source. For example, with reference to FIG. 8, the light source within the light beam metrology apparatus 805 (such as the light source 418, which can be a $CO_2$ laser within apparatus 405) that is configured to produce one or more amplified light beams 810, 836 directed to the first and second target spaces needs to be aligned. The target 815 (which can be considered a fuel target) needs to be aligned. And, the plasma (such as the plasma 854) needs to be aligned. For instance, chambers or vessels in traditional EUV light sources contain mechanical interfaces that are used for steering of the amplified light beam 810, 836 (for example, actuators and metrology), for steering of the fuel target 815 (for example, actuators and metrology), and generation of plasma 854 (for example, metrology) devices that are not intentionally machined to achieve "plug-and-play" alignment to any relevant point (for example, the primary focus PF of the collector (such as the collector 852) in the interior of the vessel 851. As a result, these devices need to be manually aligned where possible. Additionally, or alternatively, significant automation time is spent in exhaustive searches to bring the light beams 810, 836 onto the fuel target 815 or 835 and then to bring the resulting plasma 854 to a position that corresponds to a point typically referred to as "alignment into the scanner," to enable the EUV light 853 to be directed to the output apparatus 860.

In addition, conventional EUV light sources lack of a unified coordinate system. For instance, traditional metrology devices for the $CO_2$ laser, fuel targets, and plasma operate independently from each other. In one illustrative example, these three metrology systems (for example, the $CO_2$ laser positioning into the chamber or vessel of the EUV light source, fuel target stream positioning into the chamber or vessel of the EUV light source, and plasma) each have their own estimates of similar physical quantities, leading to redundancy, disagreement, and hence risk of error. Consequentially, this independence restrains achievement of best EUV light source performance and fast recoveries following a major service.

Figure 16:
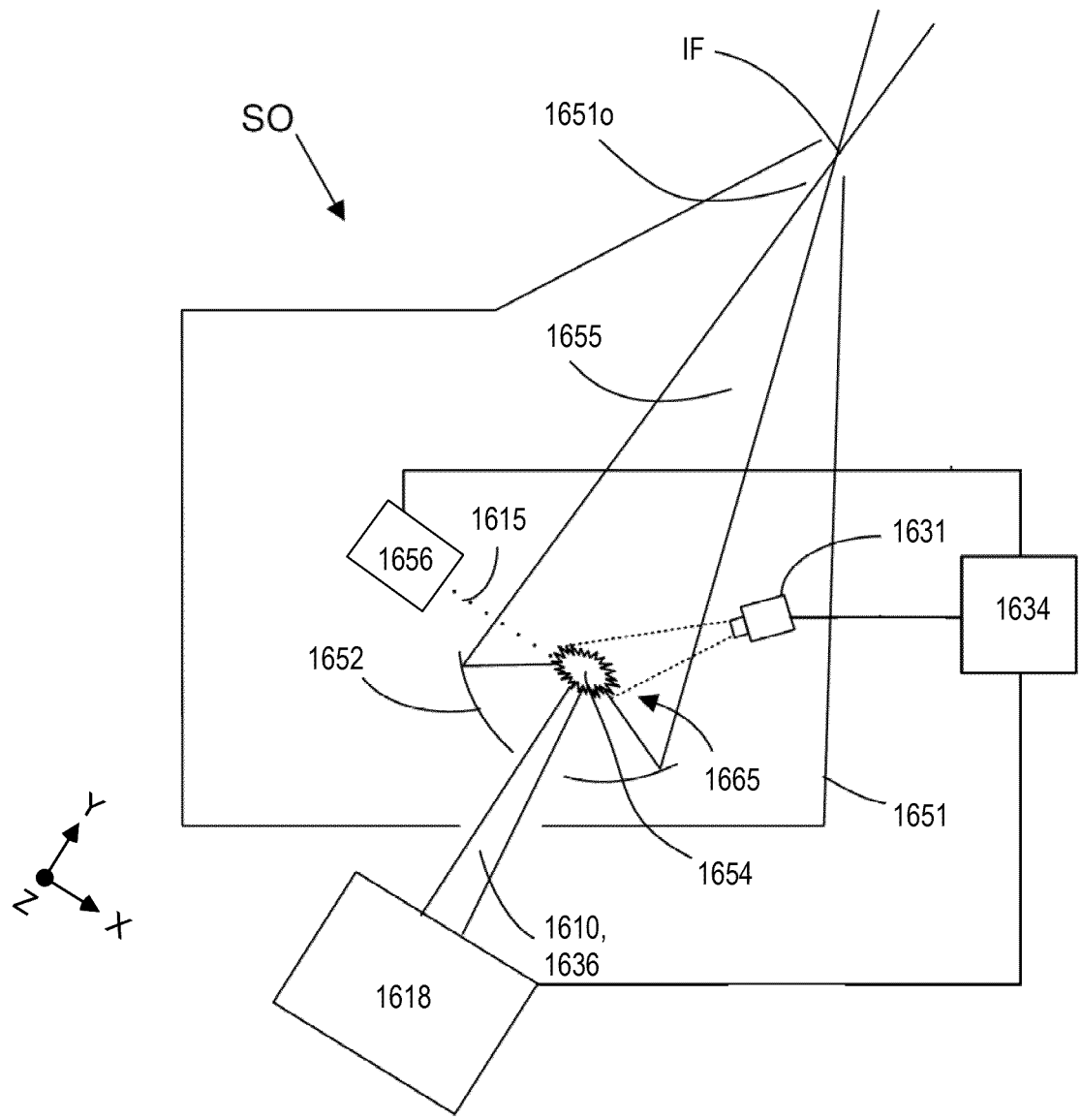
FIG. 16 is a schematic illustration of an example radiation source for an example reflective lithographic apparatus according to some aspects of the present disclosure.

In contrast to these conventional systems, the present disclosure provides for metrology and control devices that can be mechanically referenced to a single location on or encompassed by the light source vessel (such as an example enclosing structure 1751 of the light source SO as shown in FIGS. 13A, 13B, 14, 16, and 17). In some aspects, the hardware in each of the metrology and control devices can be machined relative to this single location. For example, a collector system (such as, for example, collector system 1762 of FIG. 17, which can include collector 1652 as shown in FIG. 16 and a holder frame), can include three reference points. When installed into the light source vessel 1751, these three reference points can be aligned to the light source vessel 1751 based on the single location.

Interfaces (such as, for example, mounting support structures and anchor points) for metrology and control devices also can be machined to achieve alignment relative to this single location. For example, there is an interface for the light beam metrology apparatus 405, and specifically for the beam adjustment system 412 and the actuation system 413, which adjusts a direction, steering, and focusing of the light beam 410 (which can be referred to as a laser steerer (such as laser steerer 1713 of FIG. 17). There is an interface for steering the fuel target (called a fuel target steerer (such as fuel target steerer 1763 of FIG. 17). There is an interface for a plasma generator, which is configured to monitor the plasma (such as plasma generator 1764 of FIG. 17).

In some aspects, the present disclosure provides for determining a calibration location of the pre-pulse light beam (such as light beam 210, 410, 810) using the fuel target steerer. In some aspects, the present disclosure provides for mechanically referencing the laser steerer, the fuel target steerer, and the plasma generator to within 1 millimeter (mm) in relation to the plasma formation region (such as plasma formation region 1665 in FIG. 16), within 0.1 mm in relation to the plasma formation region 1665, within 10 micrometers (microns) in relation to the plasma formation region 1665, within 1 micron in relation to the plasma formation region 1665, or any other suitable distance in relation to the center of the plasma formation region 1665 or any other suitable tolerance in location. In some aspects, the plasma formation region 1665 can be about 50 microns wide to about a few mm wide, and the light source 418 (also referred to as a laser system (such as laser system 1618 of FIG. 16) can be positioned about 0.25 meters to 1.5 meters away from the plasma formation region 1665. Accordingly, the angle of incidence of one or more light beams (for example, one or more light beams 1610, 1636 emitted by the laser system 1618) to the plasma formation region 1665 can be about 0.02 milliradians (mrad), about 0.03 mrad, about 0.07 mrad, about 0.2 mrad, about 0.5 mrad, about 1 mrad, about 10 mrad, or any other suitable tolerance in angle. Various tolerances may be used in different systems, depending, for example, on the distances between elements and the plasma formation region 1665, the size of the fuel targets 1615 (for example, approx. 1 micron, 10 microns, 30 microns, 75 microns, 150 microns), the cross-sectional area of the light beam 1610, 1636 (for example, a few microns to a few mm), and the field of view of the metrology systems that image or otherwise monitor the plasma formation region 1665.

In further contrast to these conventional systems, the present disclosure provides for a unified coordinate system for the laser steerer, the fuel target steerer, and the plasma generator. In some aspects, the present disclosure provides for a fuel target imaging system that includes a dual droplet formation camera (DFC) system, such as the target metrology apparatus 730 that includes two or more two-dimensional recording devices 731, 732 that are arranged so that their imaging planes are not parallel with each other, as shown in FIG. 7. The dual DFC system can include two cameras (for example, droplet formation camera 1731 and droplet formation camera 1732) and related mounting structures, imaging hardware, and image processing software. The dual DFC system can be used, for example, to intentionally unify the coordinate systems of the laser steerer 1713, the fuel target steerer 1763, and the plasma generator 1764. For instance, the dual DFC system can be oriented such that the primary focus PF of the collector is expected to appear in the center of the field of view of each camera 1731, 1732. Based on this technique, the dual DFC system can have observability of each fuel target (for example, in X, Y, and Z) and observability of target orientation (for example, given by angles $R_x$ and $R_y$) in the vicinity of the plasma formation region 1665 that provides the maximum EUV radiation transmission into the scanner.

In one illustrative example, the present disclosure provides for unification of the coordinate systems in three stages. First, during machine setup, the reference or zero point of the fuel target steering system metrology can be calibrated to position the fuel target in the center of the dual DFC system field of view. Second, also during machine setup, the reference or zero point of the laser-to-fuel target metrology can be calibrated to achieve a target with zero orientation about the X and Y axes. This procedure can establish a reference point for the pre-pulse laser steering metrology device using the same measurement system as the measurement system used for calibrating the reference or zero point for the fuel targets (for example, fuel targets 1615). Third, given that the positions of both the fuel target and the pre-pulse laser beam are established within the frame of reference of the dual DFC system, the laser steerer can measure the main pulse laser beam position relative to the pre-pulse laser beam position by estimating the main pulse laser beam position relative to the generated fuel target position. As a result, the metrology systems for the fuel target, pre-pulse laser beam, modified fuel target, and main pulse laser beam can all be unified in the frame of reference of the dual DFC system.

In some instances, the dual DFC system disclosed herein can be implemented as an incremental change to the hardware of the metrology system, and the calibration technique for unification of the different metrology systems in the laser steerer 1713, the fuel target steerer 1763, and the plasma generator 1764 (FIG. 17) can be implemented, in some instances, with a modicum of effort in software design. In some instances, the unification of coordinate systems provides for improved and faster recovery of operational performance following major service, including higher availability and reduced long down-times.

There are many advantages and benefits to the mechanical referencing techniques disclosed herein. For example, with reference to FIG. 17, the present disclosure provides for an anchor point for the laser steerer 1713, the fuel target steerer 1763, and the plasma generator 1764 to provide for faster recoveries following major service and to realize the availability gains associated with such a technique. One particular benefit of this technique relates to the manner in which the pre-pulse laser beam initiates contact with the fuel target and the corresponding process that is used to bring the fuel and the pre-pulse laser beam close to each other. In one conventional approach, the EUV pulse energy was detected to determine when the pre-pulse laser beam overlapped the fuel target, which took an unacceptably large amount of time. In contrast to this conventional approach, the dual DFC system of the present disclosure is used to detect the overlap between the pre-pulse laser beam and the fuel target at a much faster time frame for at least two separate reasons. One reason for this increase in performance and speed is that the dual DFC system is anchored to the single location of the vessel 1751 and thus when the dual DFC system is installed, the dual DFC system is immediately positioned in a location that is close to where the fuel target will be located. Another reason for this increase in performance and speed is that the backlight and camera of the dual DFC system are triggered at the correct time (for example, based on when the pre-pulse light beam is created (that is, fired)).

Additionally, there are many advantages and benefits to the unified coordinate system techniques disclosed herein. For example, the present disclosure provides for improvements in the area that the coordinated plasma position changes. In another example, the present disclosure provides for faster recovery following major service, including metrology service, as all metrology systems contain absolute reference information and may each be used to re-establish the performance operating point. As a result, recovery to performance level following major service, which for conventional systems may take up to 24 hours, can be reduced to less than one hour. Additionally, there are many advantages and benefits to the dual DFC system disclosed herein, such as stereoscopic imaging of the fuel targets. Such imaging can support measurements in three-dimensional space (3-space) of the fuel target locations. Further, these 3-space measurements can be connected with the reference point, the unified coordinate system, or both, to implement the aspects disclosed herein.

Before describing such aspects in more detail, however, it is instructive to present an example environment in which aspects of the present disclosure can be implemented.

Example Lithographic Systems

Figure 13A:
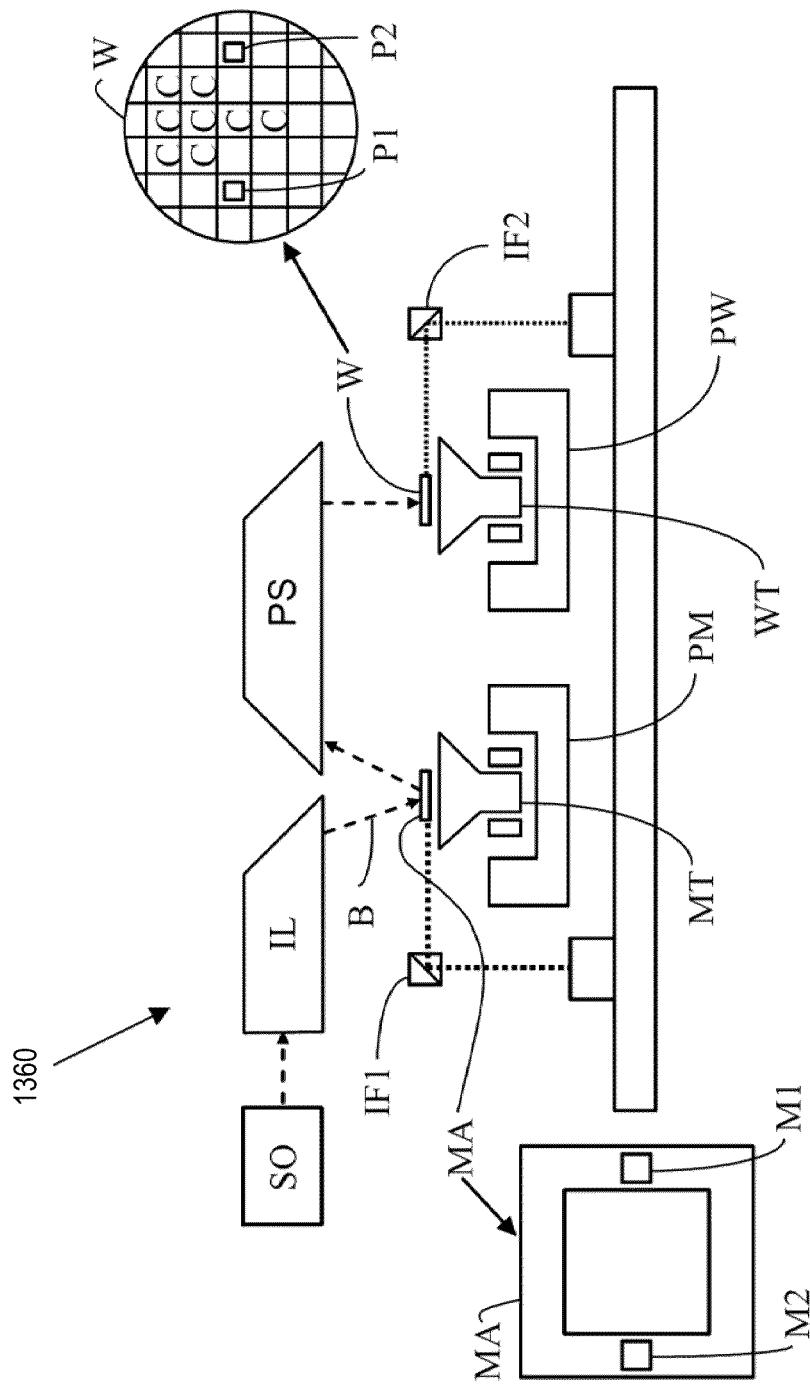
FIG. 13A is a schematic illustration of an example reflective lithographic apparatus according to some aspects of the present disclosure.
Figure 13B:
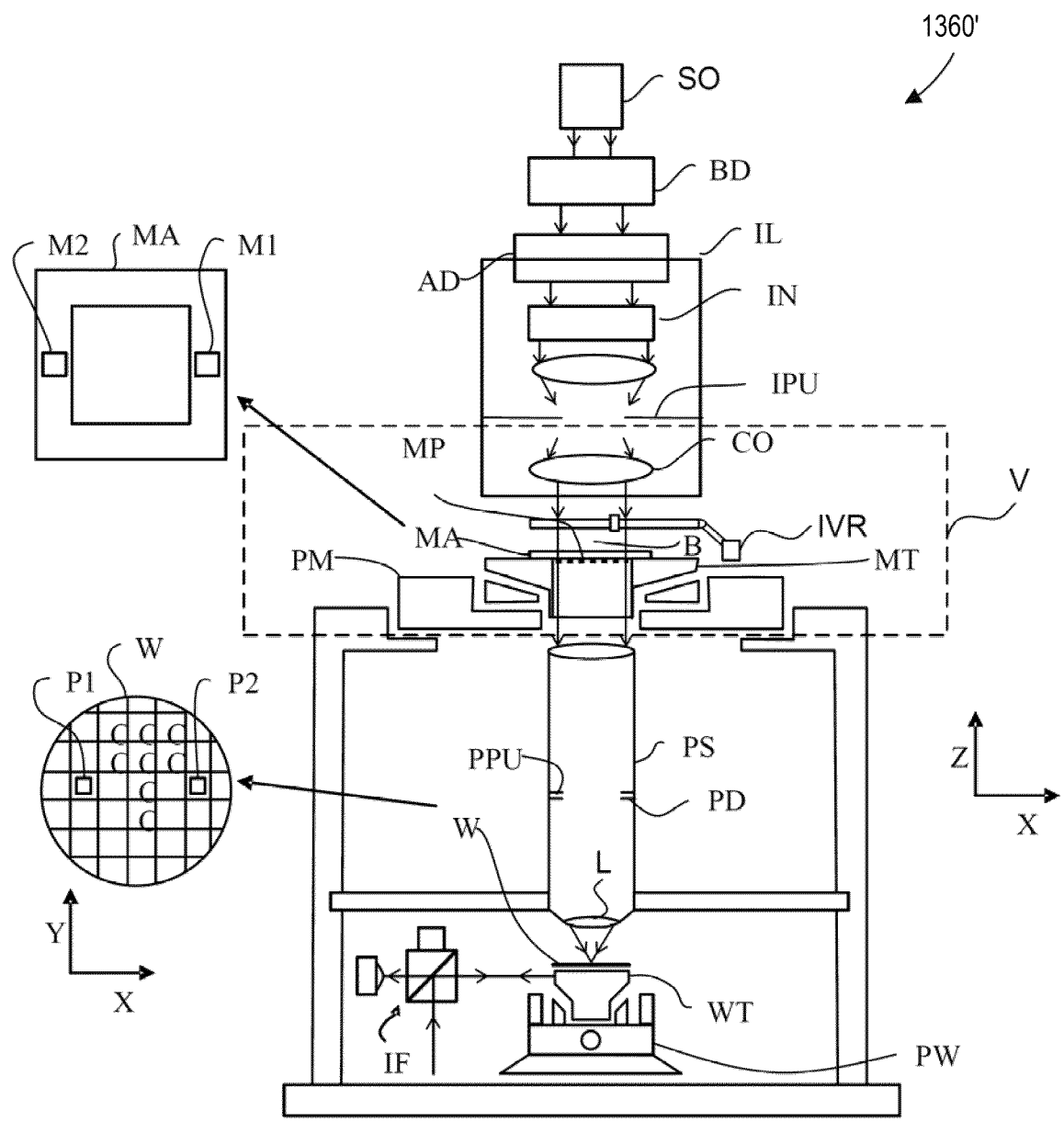
FIG. 13B is a schematic illustration of an example transmissive lithographic apparatus according to some aspects of the present disclosure.

FIGS. 13A and 13B are schematic illustrations of a lithography exposure apparatus 1360 and a lithography exposure apparatus 1360', respectively, in which aspects of the present disclosure can be implemented. The lithography exposure apparatus 1360 and the lithography exposure apparatus 1360' each include the following: an illumination system (illuminator) IL configured to condition a radiation beam B (for example, deep ultra violet (DUV) radiation or extreme ultra violet (EUV) radiation such as the EUV light beam 855 output from the EUV light source 850); a support structure (for example, a mask table) MT configured to support a patterning device (for example, a mask, a reticle, or a dynamic patterning device) MA and connected to a first positioner PM configured to accurately position the patterning device MA; and, a substrate holder such as a substrate table (for example, a wafer table) WT configured to hold a substrate (for example, a resist coated wafer) W and connected to a second positioner PW configured to accurately position the substrate W. Lithography exposure apparatuses 1360 and 1360' also have a projection system PS configured to project a pattern imparted to the radiation beam B by patterning device MA onto a target portion (e.g., including one or more dies) C of the substrate W. In the lithography exposure apparatus 1360, the patterning device MA and the projection system PS are reflective. In the lithography exposure apparatus 1360', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithography exposure apparatuses 1360 and 1360', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in the lithography exposure apparatus 1360' of FIG. 13B) or reflective (as in the lithography exposure apparatus 1360 of FIG. 13A). Examples of patterning devices MA include reticles, masks, programmable mirror arrays, or programmable LCD panels. Masks include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

The lithography exposure apparatus 1360 and/or the lithography exposure apparatus 1360' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithography exposure apparatus can also be of a type wherein at least a portion of the substrate can be covered by a liquid having a relatively high refractive index, such as, for example, water, so as to fill a space between the projection system and the substrate. An immersion liquid can also be applied to other spaces in the lithographic apparatus, for example, between the mask and the projection system Immersion techniques provide for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 13A and 13B, the illumination system IL receives the radiation beam B from a radiation source SO, which can correspond to, for example, the EUV light source 850 of FIG. 1. The radiation source SO and the lithography exposure apparatus 1360, 1360' can be separate physical entities, for example, when the radiation source SO is an excimer laser. In such cases, the radiation source SO is not considered to form part of the lithography exposure apparatus 1360 or 1360', and the radiation beam B passes from the radiation source SO to the illumination system IL with the aid of a beam delivery system BD (in FIG. 13B) including, for example, suitable directing mirrors and/or a beam expander. In other cases, the radiation source SO can be an integral part of the lithography exposure 1360, 1360', for example, when the radiation source SO is a mercury lamp. The radiation source SO and the illuminator IL, together with the beam delivery system BD, if required, can be referred to as a radiation system.

The illumination system IL can include an adjuster AD (in FIG. 13B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components (in FIG. 13B), such as an integrator IN and a radiation collector (for example, a condenser) CO. The illumination system IL can be used to condition the radiation beam B to have a desired uniformity and intensity distribution in its cross section.

Referring to FIG. 13A, the radiation beam B is incident on the patterning device (for example, mask) MA, which is held on the support structure (for example, mask table) MT, and is patterned by the patterning device MA. In the lithography exposure apparatus 1360, the radiation beam B is reflected from the patterning device MA. After being reflected from the patterning device MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device MA with respect to the path of the radiation beam B. Patterning device MA and substrate W can be aligned using mask alignment marks M1, M2 and substrate alignment marks P1, P2.

Referring to FIG. 13B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Undiffracted beams (for example, so-called zeroth-order diffracted beams) traverse the pattern without any change in propagation direction. The zeroth-order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth-order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of the illumination system pupil IPU. Further, in some aspects, astigmatism aberration can be reduced by blocking the zeroth-order beams in the pupil conjugate PPU of the projection system associated with radiation poles in opposite quadrants. This is described in more detail in U.S. Pat. No. 7,511,799, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 13B) can be used to accurately position the patterning device MA with respect to the path of the radiation beam B (for example, after mechanical retrieval from a mask library or during a scan).

In general, movement of the support structure MT can be realized with the aid of a long-stroke (coarse positioning) device and a short-stroke (fine positioning) device, which form part of the first positioner PM Similarly, movement of the substrate table WT can be realized using a long-stroke device and a short-stroke device, which form part of the second positioner PW. In the case of a stepper (as opposed to a scanner), the support structure MT can be connected to a short-stroke actuator only or can be fixed. Patterning device MA and substrate W can be aligned using mask alignment marks M1, M2, and substrate alignment marks P1, P2. Although the substrate alignment marks (as illustrated) occupy dedicated target portions, they can be located in spaces between target portions (e.g., scribe-lane alignment marks). Similarly, in situations in which more than one die is provided on the patterning device MA, the mask alignment marks can be located between the dies.

Support structure MT and patterning device MA can be in a vacuum chamber V, where an in-vacuum robot IVR can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot IVR. In some instances, both the in-vacuum and out-of-vacuum robots need to be calibrated for a smooth transfer of any payload (e.g., mask) to a fixed kinematic mount of a transfer station.

The lithography exposure apparatuses 1360 and 1360' can be used in at least one of the following modes:

1. In step mode, the support structure MT and the substrate table WT are kept essentially stationary, while an entire pattern imparted to the radiation beam B is projected onto a target portion C at one time (for example, a single static exposure). The substrate table WT is then shifted in the X and/or Y direction so that a different target portion C can be exposed.

2. In scan mode, the support structure MT and the substrate table WT are scanned synchronously while a pattern imparted to the radiation beam B is projected onto a target portion C (for example, a single dynamic exposure). The velocity and direction of the substrate table WT relative to the support structure (for example, mask table) MT can be determined by the (de-) magnification and image reversal characteristics of the projection system PS.

3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

Combinations and/or variations on the described modes of use or entirely different modes of use can also be employed.

In a further aspect, the lithography exposure apparatus 1360 includes the radiation source, which can be the EUV light source, which is configured to generate a beam of EUV radiation for EUV lithography. In general, the EUV source is configured in a radiation system, and a corresponding illumination system is configured to condition the EUV radiation beam of the EUV source.

Figure 14:
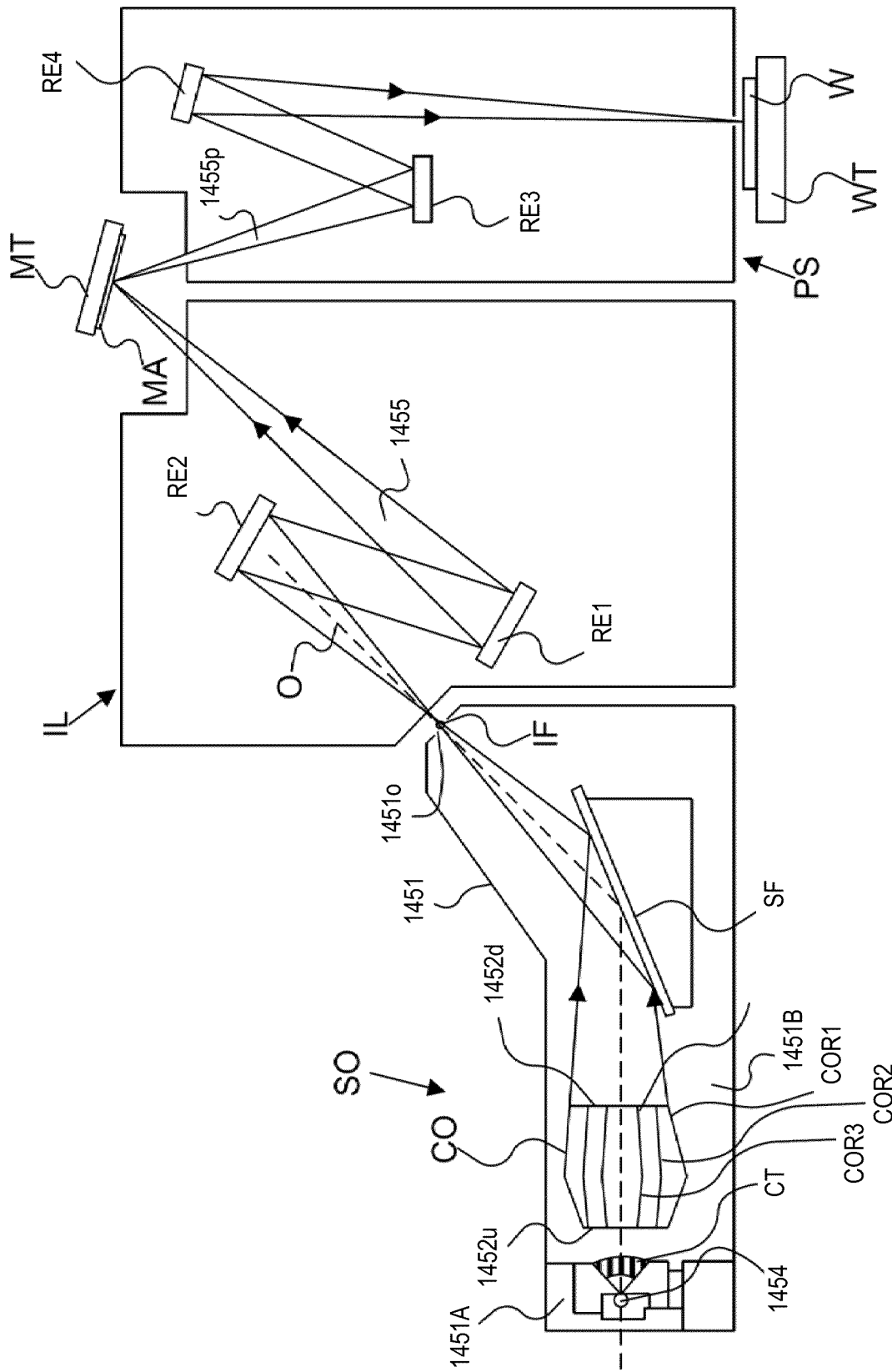
FIG. 14 is a more detailed schematic illustration of the reflective lithographic apparatus shown in FIG. 13A according to some aspects of the present disclosure.

FIG. 14 shows the lithography exposure apparatus 1360 in more detail, including the radiation source (for example, a source collector apparatus) SO, the illumination system IL, and the projection system PS. The radiation source SO is constructed and arranged such that a vacuum environment can be maintained in an enclosing structure 1451. The radiation source SO includes a source chamber 1451A and a collector chamber 1451B and is configured to produce and transmit EUV radiation.

EUV radiation can be produced by a gas or vapor, for example xenon (Xe) gas, lithium (Li) vapor, or tin (Sn) vapor in which an EUV radiation emitting plasma 1454 is created to emit radiation in the EUV range of the electromagnetic spectrum. The EUV radiation emitting plasma 1454, at least partially ionized, can be created by, for example, an electrical discharge or a laser beam. Partial pressures of, for example, 10 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 1454 is passed from the source chamber 1451A into the collector chamber 1451B via an optional gas barrier or contaminant trap CT (in some cases also referred to as contaminant barrier or foil trap), which is positioned in or behind an opening in source chamber 1451A. The contaminant trap CT can include a channel structure.

Contamination trap CT can also include a gas barrier or a combination of a gas barrier and a channel structure. The contaminant trap CT further indicated herein at least includes a channel structure.

The collector chamber 1451B can include a radiation collector (for example, a collector such as the collector 852) CO, which can be a so-called grazing incidence collector. Radiation collector CO has an upstream radiation collector side 1452u and a downstream radiation collector side 1452d. Radiation that traverses radiation collector CO can be reflected off a grating spectral filter SF to be focused in a virtual source point IF. The virtual source point IF is commonly referred to as the intermediate focus, and the source collector apparatus is arranged such that the virtual source point IF is located at or near an opening 14510 in the enclosing structure 1451. The virtual source point IF is an image of the EUV radiation emitting plasma 1454. Grating spectral filter SF is used in particular for suppressing infrared (IR) radiation.

Subsequently, the radiation traverses the illumination system IL, which can include a faceted field mirror device RE1 and a faceted pupil mirror device RE2 arranged to provide a desired angular distribution of the radiation beam 1455, at the patterning device MA, as well as a desired uniformity of radiation intensity at the patterning device MA. Upon reflection of the radiation beam 1455 at the patterning device MA, held by the support structure MT, a patterned beam 1455p is formed and the patterned beam 1455p is imaged by the projection system PS via reflective elements RE3, RE3 onto a substrate W held by the wafer stage or substrate table WT.

More elements than shown may generally be present in illumination system IL and projection system PS. The grating spectral filter SF may optionally be present, depending upon the type of lithographic apparatus. Further, there may be more mirrors present than those shown in the FIG. 14, for example there can be one to six additional reflective elements present in the projection system PS than shown in FIG. 14.

Radiation collector CO, as illustrated in FIG. 14, is depicted as a nested collector with grazing incidence reflectors COR1, COR2, COR3, just as an example of a collector (or collector mirror). The grazing incidence reflectors COR1, COR2, COR3 are disposed axially symmetric around an optical axis O and a radiation collector CO of this type is preferably used in combination with a discharge produced plasma (DPP) source.

Example Lithographic Cell

Figure 15:
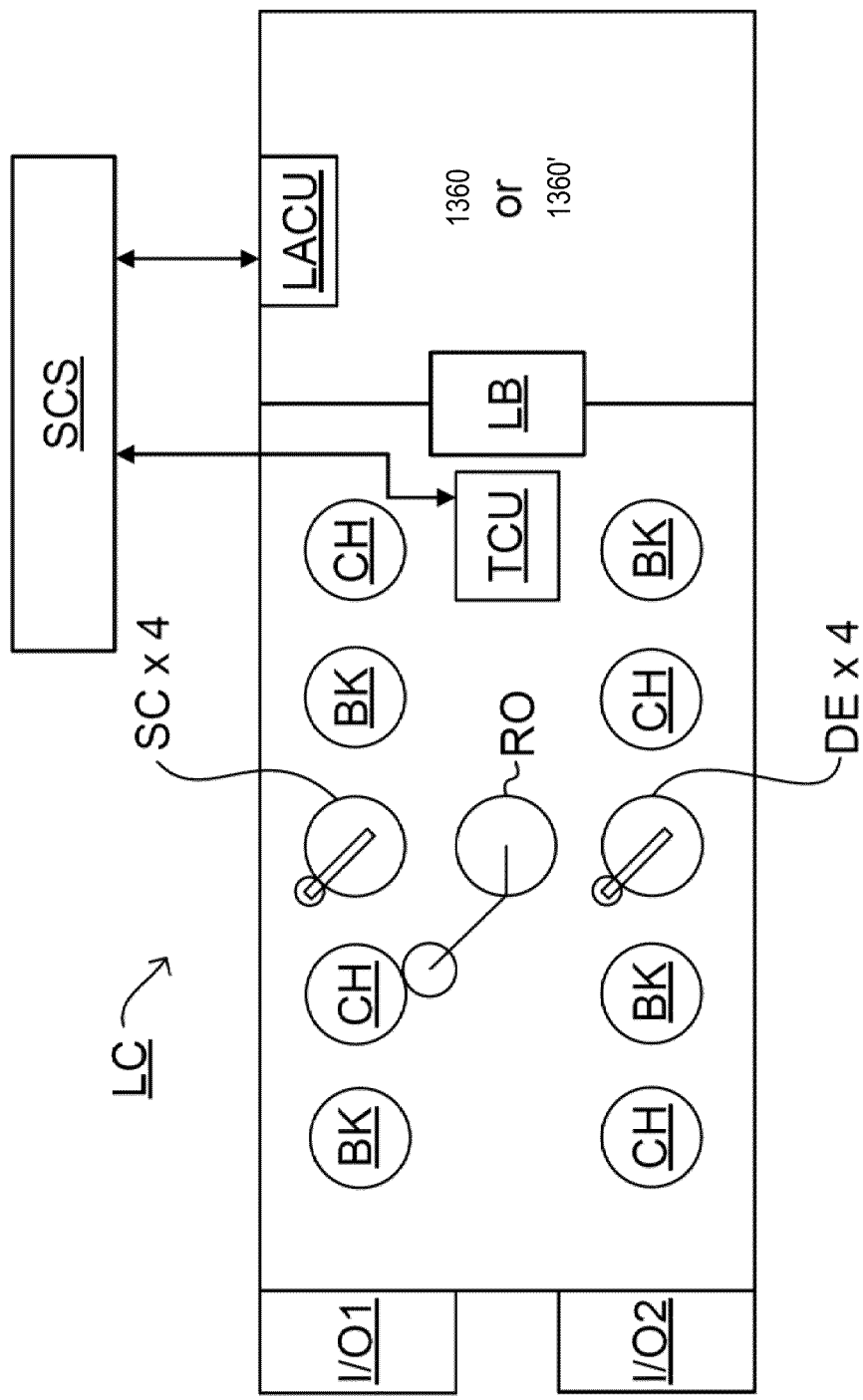
FIG. 15 is a schematic illustration of an example lithographic cell according to some aspects of the present disclosure.

FIG. 15 shows a lithographic cell LC, also sometimes referred to a lithocell or cluster. The lithography exposure apparatus 1360 or 1360' can form part of lithographic cell LC. The lithographic cell LC can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler (for example, a robot) RO picks up substrates from input/output ports I/O1, I/O2, moves them between the different process apparatuses and delivers them to the loading bay LB of the lithography exposure apparatus 1360 or 1360'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Radiation Source

An example of the radiation source SO for an example reflective lithography exposure apparatus is shown in FIG. 16. The radiation source SO 1650 shown in FIG. 16 is of a type which may be referred to as a laser produced plasma (LPP) source, such as that shown in FIG. 8. A laser system 1618, which can for example include a carbon dioxide ($CO_2$) laser, is arranged to deposit energy via one or more light beams 1610 into fuel targets 1615, such as one or more discrete tin (Sn) droplets, which are provided from a fuel target generator (for example, fuel emitter, droplet generator) 1656. According to some aspects, laser system 1618 can be, or can operate in the fashion of, a pulsed, continuous wave or quasi-continuous wave laser. The trajectory of target material (for example, droplets) emitted from the fuel target generator 1615 can be parallel to an X-axis marked on FIG. 16. According to some aspects, the one or more light beams 1610 propagate in a direction parallel to a Y-axis, which is perpendicular to the X-axis. A Z-axis is perpendicular to both the X-axis and the Y-axis and extends generally into (or out of) the plane of the page.

Although tin is referred to in the following description, any suitable target material can be used. The target material can for example be in liquid form, and can for example be a metal or alloy. Fuel target generator 1656 can include a nozzle configured to direct tin, for example, in the form of fuel targets 1615 (for example, discrete droplets) along a trajectory towards a plasma formation region 1665. Throughout the remainder of the description, references to "fuel", "fuel target" or "fuel droplet" are to be understood as referring to the target or target material (for example, droplets) emitted by fuel target generator 1656. Fuel target generator 1656 can include a fuel emitter. The one or more light beams 1610 are incident upon the target material (for example, tin) at the plasma formation region 1665. The deposition of laser energy into the target material creates a plasma 1654 at the plasma formation region 1665. Radiation, including EUV light (such as EUV light 853), is emitted from the plasma 1654 during de-excitation and recombination of ions and electrons of the plasma.

The EUV light is collected and focused by a collector 1652 (for example, radiation collector CO). In some aspects, collector 1652 can include a near normal-incidence radiation collector (sometimes referred to more generally as a normal-incidence radiation collector). The collector 1652 can have a multilayer structure, which is arranged to reflect EUV light (for example, EUV radiation having a desired wavelength such as about 13.5 nm). According to some aspects, collector 1652 can have an ellipsoidal configuration, having two focal points. A first focal point can be at the plasma formation region 1665, and a second focal point can be at an intermediate focus IF, as discussed herein.

In some aspects, laser system 1618 can be located at a relatively long distance from the enclosing structure 1651. Where this is the case, the one or more light beams 1610 can be passed from the laser system 1618 to the enclosing structure 1651 with the aid of a beam delivery system (not shown in FIG. 16 but discussed above with reference to FIGS. 4 and 5) including, for example, suitable directing mirrors and/or a beam expander, and/or other optics. Laser system 1618 and the EUV light source SO 1650 can together be considered to be a radiation system.

Radiation that is reflected by collector 1652 forms a radiation beam B 1655. The radiation beam B 1655 is focused at an area or a point (that is, the intermediate focus IF) to form an image of the plasma formation region 1665, which acts as a virtual radiation source for the illumination system IL. The point at which the radiation beam B 1655 is focused can be referred to as the intermediate focus IF. The radiation source SO is arranged such that the intermediate focus IF is located at or near to an opening 16510 in an enclosing structure 1651 of the radiation source SO 1650.

The radiation beam B 1655 passes from the radiation source SO 1650 into the illumination system IL, which is configured to condition the radiation beam B. The radiation beam B passes from the illumination system IL and is incident upon the patterning device MA held by the support structure MT. The patterning device MA reflects and patterns the radiation beam B. Following reflection from the patterning device MA the patterned radiation beam B enters the projection system PS. The projection system includes a plurality of mirrors, which are configured to project the radiation beam B onto a substrate W held by the substrate table WT. The projection system PS can apply a reduction factor to the radiation beam, forming an image with features that are smaller than corresponding features on the patterning device MA. For example, a reduction factor of four can be applied. Although the projection system PS is shown as having two mirrors in FIG. 14, the projection system can include any number of mirrors (e.g., six mirrors).

The radiation source SO 1650 can include components which are not illustrated in FIG. 16. For example, a spectral filter can be provided in the radiation source SO. The spectral filter can be substantially transmissive for EUV radiation but substantially blocking for other wavelengths of radiation such as infrared radiation.

The radiation source SO 1650 (or radiation system) further includes a fuel target imaging system to obtain images of fuel targets (for example, droplets) in the plasma formation region 1665 or, more particularly, to obtain images of shadows of the fuel targets. The fuel target imaging system can detect light diffracted from the edges of the fuel targets. References to images of the fuel targets in the following text should be understood also to refer to images of shadows of the fuel targets or diffraction patterns caused by the fuel targets.

The fuel target imaging system can include a photodetector such as a CCD array or a CMOS sensor, but it will be appreciated that any imaging device suitable for obtaining images of the fuel targets can be used. It will be appreciated that the fuel target imaging system can include optical components, such as one or more lenses, in addition to a photodetector. For example, the fuel target imaging system can include a camera 1631, which can be a combination of a photosensor (or: photodetector) and one or more lenses. The optical components can be selected so that the photosensor or camera 1631 obtains near-field images and/or far-field images. The camera 1631 can be positioned within the radiation source SO at any appropriate location from which the camera has a line of sight to the plasma formation region 1665 and one or more markers (not shown in FIG. 16) provided on the collector 1652. It may be necessary, however, to position the camera 1631 away from the propagation path of the one or more light beams 1610 and from the trajectory of the fuel targets emitted from fuel target generator 1656 so as to avoid damage to the camera 1631. According to some aspects, the camera 1631 is configured to provide images of the fuel targets to a controller 1634 via a connection, which can be wired or wireless.

As shown in FIG. 16, the radiation source SO can include a fuel target generator 1656 configured to generate and emit fuel targets 1615 (such as discrete tin droplets) toward the plasma formation region 1665. The radiation source SO can further include a laser system 1618 configured to hit one or more of the fuel targets 1615 with one or more light beams 1610, 1636 for generating a plasma 1654 at the plasma formation region 1665. The radiation source SO can further include a collector 1652 (that is, a radiation collector CO) configured to collect radiation emitted by the plasma 1654.

Figure 17:
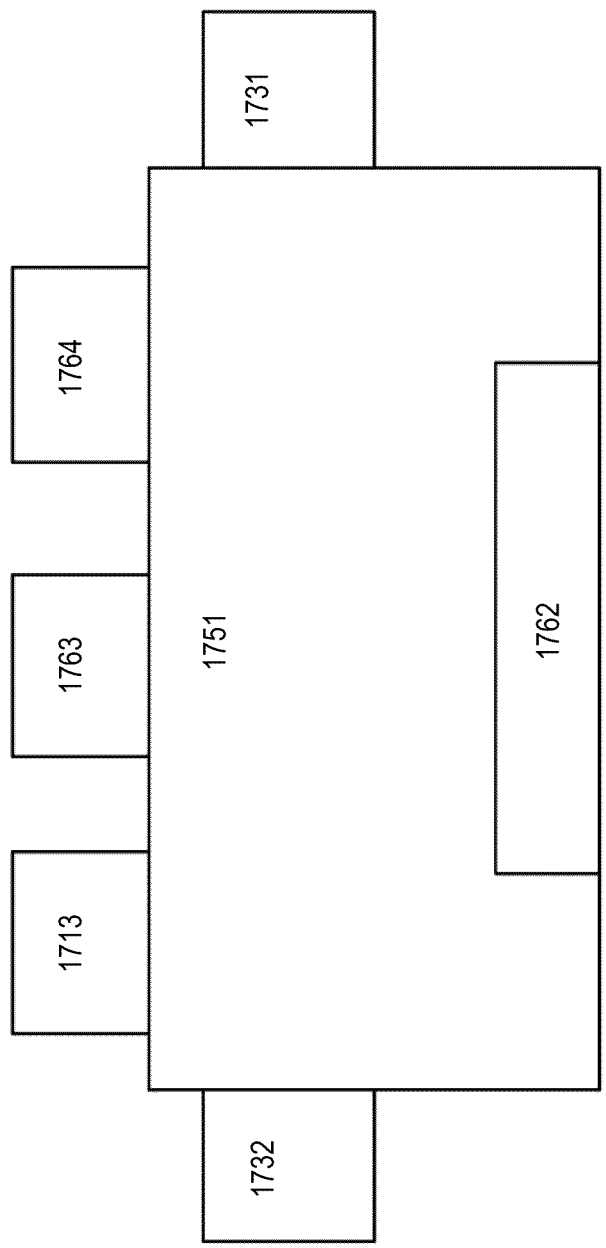
FIG. 17 is a schematic illustration of example components mechanically connected to an example enclosing structure of an example radiation source according to some aspects of the present disclosure.

FIG. 17 is a schematic illustration of example components that can be mechanically connected (for example, anchored or otherwise attached by one or more fasteners, adhesives, or a combination thereof) to an example enclosing structure 1751 (such as, for example, the enclosing structure 851 of FIG. 8, the enclosing structure 1451 of FIG. 14, or the enclosing structure 1651 of FIG. 16) of the example radiation source SO 1650 according to some aspects of the present disclosure. Example components that can be mechanically connected to the example enclosing structure 1751 of the radiation source SO 1650 can include, but are not limited to, laser steerer 1713, fuel target steerer 1763, plasma generator 1764, droplet formation camera 1731, droplet formation camera 1732, collector system 1762, any other suitable component, or any combination thereof.

In some aspects, one or more of the laser steerer 1713, the fuel target steerer 1763, the plasma generator 1764, the droplet formation camera 1731, the droplet formation camera 1732, the collector system 1762, any other suitable component, or any combination thereof can be mechanically referenced to a reference point on the radiation source SO 1650, such as a single location on, or projected onto, the example enclosing structure 1751 of the radiation source SO 1650. In some aspects, the phrase "mechanically referenced" can refer to a mechanical construction with dimensions that are known with suitable precision with regard to a reference point on the radiation source SO 1650. For example, the single location can include a location within the plasma formation region 1665, a primary focus PF of the collector 1652, any other suitable location, or any combination thereof. In one illustrative example, one or more of the laser steerer 1713, the fuel target steerer 1763, the plasma generator 1764, the droplet formation camera 1731, the droplet formation camera 1732, the collector system 1762, any other suitable component, or any combination thereof can be mechanically referenced to within 1 mm in relation to the plasma formation region 1665, within 0.1 mm in relation to the plasma formation region 1665, within 1 micron in relation to the plasma formation region 1665, or any other suitable distance in relation to the plasma formation region 1665 or any other suitable location. In some aspects, the plasma formation region 1665 can be about 50.0 microns wide to a few millimeters wide, and the laser system 1618 can be positioned about 0.25 meters to 1.5 meters away from the plasma formation region 1665. Accordingly, the angle of incidence of the one or more light beams 1610, 1636 to the plasma formation region 1665 can be about 0.02 milliradians (mrad), about 0.03 mrad, about 0.07 mrad, about 0.2 mrad, about 0.5 mrad, about 1 mrad, about 10 mrad, or any other suitable tolerance in angle.

As shown in FIG. 17, the radiation source SO 1650 can further include a laser steerer 1713 configured to monitor and steer the one or more light beams 1610, 1636 toward the plasma formation region 1665. In some aspects, the laser steerer 1713 can include a laser steering actuator configured to steer the one or more light beams 1610, 1636 toward the plasma formation region 1665. In some aspects, the laser steerer 1713 can further include a laser steering metrology system configured to monitor the one or more light beams

1610, 1636. A discussion of a laser steerer 1713 is provided above with reference to FIGS. 4 and 5.

The radiation source SO 1650 can further include a fuel target steerer 1763 configured to monitor and steer the fuel targets 1615 toward the plasma formation region 1665. In some aspects, the fuel target steerer 1763 can include a fuel target steering actuator configured to steer the fuel targets 1615 toward the plasma formation region 1665. In some aspects, the fuel target steerer 1763 can further include a fuel target steering metrology system configured to monitor the fuel targets 1615.

In some aspects, at least two of the collector 1652, the laser steerer 1713, and the fuel target steerer 1763 can be mechanically referenced to a reference point on the radiation source SO 1650. In some aspects, the reference point can include a single location on, or projected onto, the example enclosing structure 1651 or 1751 of the radiation source SO 1650. For example, the single location can include a location within the plasma formation region 1665. In another example, the single location can include a primary focus PF of the collector 1652.

The radiation source SO 1650 can further include a plasma generator 1764 configured to monitor the plasma 1654 and the plasma formation region 1665. In some aspects, the collector 1652, the laser steerer 1713, the fuel target steerer 1763, and the plasma generator 1764 can be mechanically referenced to the reference point on the radiation source SO 1650. In some aspects, the collector 1652, the laser steerer 1713, the fuel target steerer 1763, and the plasma generator 1764 can be mechanically connected to the example enclosing structure 1751 of the radiation source SO 1650 configured to be mechanically referenced to the reference point on the radiation source SO 1650.

The radiation source SO 1650 can further include the collector system 1762. The collector system 1762 can include the collector 1652 and a frame inside the radiation source SO 1650. The frame can include a plurality of frame reference points created based on the reference point on the radiation source SO 1650.

The radiation source SO 1650 can further include a fuel target imaging system, such as the target metrology apparatus 230 of FIGS. 2 and 3, and the target metrology apparatus 730 of FIG. 7. The fuel target imaging system can include the dual droplet formation camera (DFC) system configured to detect an overlap between the one or more light beams 1610, 1636 and the fuel targets 1615. The dual DFC system can include one or more fuel target formation cameras, such as droplet formation camera 1731 and droplet formation camera 1732 in FIG. 17, or the cameras 731 and 732 in the target metrology apparatus 730 of FIG. 7. In some aspects, the dual DFC system can be connected to the example enclosing structure 1751 of the radiation source SO 1650 and mechanically referenced to the reference point on the radiation source SO 1650. For example, one or both of the droplet formation camera 1731 and the droplet formation camera 1732 can be connected to the example enclosing structure 1751 of the radiation source SO 1650 and mechanically referenced to the reference point on the radiation source SO 1650.

In some aspects, the one or more light beams 1610, 1636 can include a pre-pulse light beam 1610 (such as pre-pulse light beam 210, 410, 810) and a main pulse light beam 1636 (such as main pulse light beam 236, 436, 836). In such aspects, the dual DFC system can include an illumination system (such as the probe module 733) and a camera (such as, for example, the droplet formation camera 1731, the droplet formation camera 1732, or both) and be configured to trigger the illumination system and the camera based on about a time when the pre-pulse light beam 1610 is created. Further in such aspects, the laser system 1618 can be configured to hit each of the fuel targets 1615 with a pre-pulse light beam 1610 to generate a modified fuel target (or modified target such as the modified target 235, 435, 735, 835, 1235). The laser system 1618 can be further configured to hit each of the modified fuel targets with a main pulse light beam 1636 to generate the plasma 1665. In these aspects, the reference point on the radiation source SO 1650 can include a location where the main pulse light beam 1636 hits the modified fuel target.

The radiation source SO 1650 can further include a controller 1634 configured to use the fuel target imaging system to generate a unified coordinate system for the laser steerer 1713 and the fuel target steerer 1763. The unified coordinate system can include the reference point on the radiation source SO 1650.

In some aspects, to generate the unified coordinate system, the controller 1634 can be configured to: calibrate a first reference point of the fuel target steerer 1763 to a primary focus point (for example, a primary focus PF of the collector 1652); and calibrate a second reference point of a pre-pulse light beam steerer of the laser steerer 1713 such that a pre-pulse light beam 1636 generated by the laser system 1618 hits each of the fuel targets 1615 generated by the fuel target generator 1656.

In some aspects, to generate the unified coordinate system, the controller 1634 can be configured to calibrate a reference point of the fuel target steerer 1763 such that each of the fuel targets 1615 generated by the fuel target generator 1656 is positioned at about a center of a field of view of the fuel target imaging system. In one example, the fuel target steerer 1763 can include a coarse fuel target steerer, a fine fuel target steerer, and a nozzle steerer. In this example, to calibrate the reference point of the fuel target steerer 1763, the controller 1634 can be configured to: control the nozzle steerer to steer a fuel target stream (for example, fuel targets 1615) to about a center of a field of view of the coarse fuel target steerer; and control the nozzle steerer to steer the fuel target stream to a center of a field of view of the fine fuel target steerer. In another example, the reference point of the fuel target steerer 1763 can be a first reference point, the laser steerer 1713 can include a pre-pulse light beam steerer, and the controller 1634 can be further configured to calibrate a second reference point of the pre-pulse light beam steerer using the first reference point of the fuel target steerer 1763.

In this example, the laser steerer 1713 can include a main pulse light beam steerer, and the controller 1634 can be further configured to use the main pulse light beam steerer to measure a position of the main-pulse light beam 1636 relative to a position of the pre-pulse light beam 1610 to estimate the location of the main pulse light beam 1636 relative to each of the fuel targets 1615.

In some aspects, the controller 1634 can be configured to generate unified coordinate system based on a detected overlap between the one or more light beams 161 and one or more of the fuel targets 1615, such as the detected overlap described above with reference to the fuel target imaging system.

Example Processes, Architecture, and Operations

Figure 18:
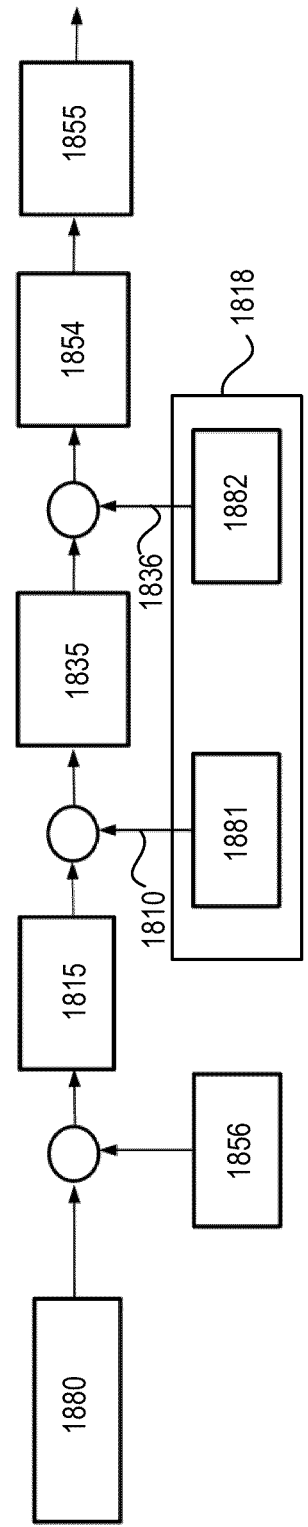
FIG. 18 illustrates an example process flow diagram for generating EUV radiation according to some aspects of the present disclosure.

FIG. 18 illustrates an example process flow diagram for generating EUV light such as the radiation beam 1655 according to some aspects of the present disclosure. For example, the example process flow can generate a fuel target 1815 (such as, for example, a tin droplet) based on input from a gas source 1880 and a fuel target generator 1856. The example process flow then can generate a modified fuel target 1835 (for example, a tilted tin droplet in the form of a pancake) by illuminating the fuel target 1815 with a pre-pulse light beam 1810 generated by a pre-pulse light source 1881. Subsequently, the example process flow can generate a plasma 1854 by illuminating the modified fuel target 1835 with a main-pulse light beam 1836 generated by a main-pulse light source 1882. The pre-pulse light source 1881 and the main-pulse light source 1882 are a part of the light or laser source (such as light source 418 or laser source 1618). Finally, the example process flow can generate EUV light or radiation 1855 based on the plasma 1854.

Figure 19:
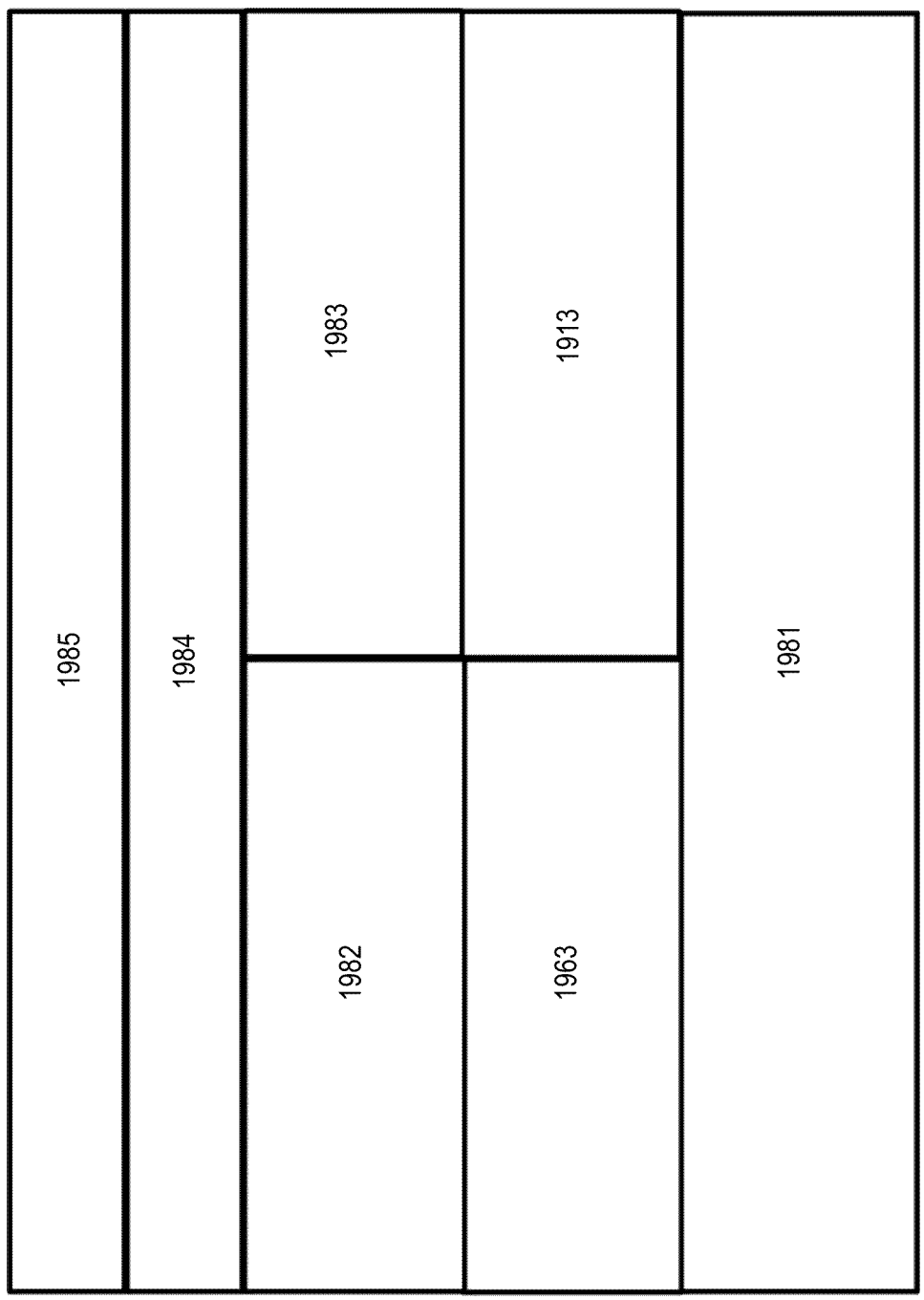
FIG. 19 illustrates an example architecture diagram for calibrating the fuel target steerer and the laser steerer according to some aspects of the present disclosure.

FIG. 19 illustrates an example tolerance and calibration architecture diagram for calibrating a fuel target steerer 1963 (which can be the fuel target steerer 1763) and the laser steerer 1913 (which can be the laser steerer 1713) according to some aspects of the present disclosure. The example architecture includes construction 1981. The example architecture includes the fuel target steerer 1963 and the laser steerer 1913. The example architecture includes a fuel target steerer calibration 1982 and a laser steerer calibration 1983. The example architecture then includes a plasma to primary focus PF alignment 1984. The example architecture then includes plasma image to intermediate focus IF alignment 1985.

FIGS. 20A and 20B provide an example schematic illustration of a process for aligning a fuel target stream to a primary focus PF of a collector (such as the collectors 852 or 1652) according to some aspects of the present disclosure. FIG. 20A shows a fuel target stream 2086 (for example, a stream of discrete fuel targets 2015*a*, 2015*b*, and 2015*c*) in relation to a primary focus 2087 of a collector at a time t_0.

FIG. 20B shows a fuel target stream 2086' at a time t_1 at which the fuel target stream 2086' has been aligned (for example, by the fuel target steerer 1763), such that each of the fuel target 2015*a*', fuel target 2015*b*', and 2015*c*' traverses the primary focus 2087 of the collector. For example, as shown in FIG. 20B, the fuel target 2015*b*' can occur at or near the primary focus 2087 of the collector at the time t_1; fuel target 2015*a*' can occur at or near the primary focus 2087 of the collector at a time before time t_1 (for example, at t_1−delta_t); and fuel target 2015*c*' can occur at or near the primary focus 2087 of the collector at a time after time t_1 (for example, at t_1+delta_t).

FIGS. 21A and 21B provide an example schematic illustration of a process for aligning a pre-pulse light beam 2110 to a fuel target according to some aspects of the present disclosure. FIG. 21A shows a fuel target 2115 at the primary focus PF of the collector in relation to a start point of a pre-pulse light beam 2110 at a time t_2 and a start point of a main-pulse light beam 2136 at a time t_3.

FIG. 21B shows a fuel target 2115' at the primary focus PF of the collector in relation to a pre-pulse light beam 2110 at a time t_4 at which the pre-pulse light beam 2110 has been aligned (for example, by the laser steerer 1713) to the fuel target 2115'. FIG. 21B further shows a modified fuel target 2135 in relation to a main-pulse light beam 2136 at a time t_5. Illumination of the fuel target 2115' by the pre-pulse light beam 2110 at time t_4 can generate the modified fuel target 2135, and illumination of the modified fuel target 2135 by the main-pulse light beam 2136 at time t_5 can generate a plasma (such as plasma 1654) for generating EUV light (such as the radiation beam 1655).

Figure 22A:
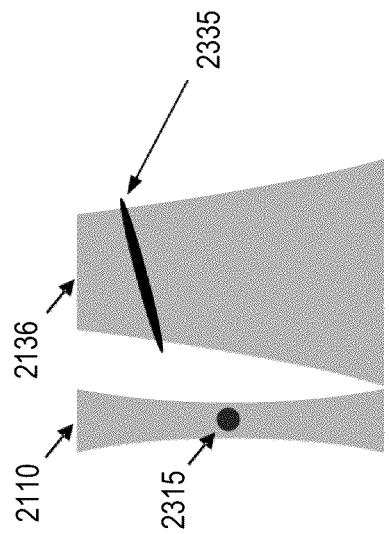
FIGS. 22A and 22B illustrate an example process for aligning a focus of a pre-pulse laser beam to a fuel target according to some aspects of the present disclosure.
Figure 22B:
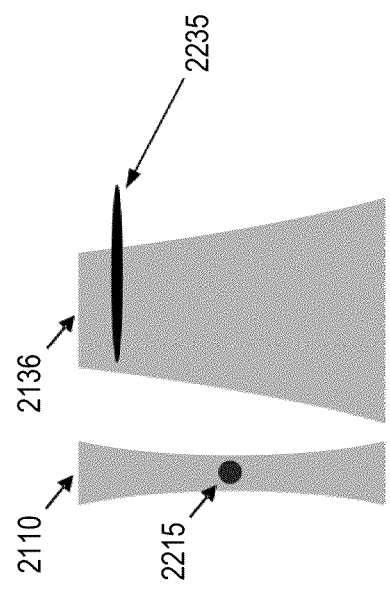

FIGS. 22A and 22B provide an example schematic illustration of a process for aligning a focus of a pre-pulse light beam 2110 to a fuel target according to some aspects of the present disclosure. FIG. 22A shows a fuel target 2215 at the primary focus PF of the collector in relation to a pre-pulse light beam 2110 at a time t_6 at which a focus of the pre-pulse light beam 2110 has been aligned (for example, by the laser steerer 1713) to the fuel target 2215. FIG. 22A further shows a flat modified fuel target 2235 in relation to a main-pulse light beam 2136 at a time t_7. Illumination of the fuel target 2215 by the pre-pulse light beam 2110 at time t_6 can generate the flat modified fuel target 2235, and illumination of the flat modified fuel target 2235 by the main-pulse light beam 2136 at time t_7 can generate a plasma (such as plasma 1654) for generating EUV light (such as the radiation beam 1655).

FIG. 22B shows a fuel target 2215' at the primary focus PF of the collector in relation to the pre-pulse light beam 2110 at a time t_8. FIG. 22B further shows a desired modified fuel target 2235' having a desired angle and size in relation to the main-pulse light beam 2136 at a time t_9. In some aspects, the desired modified fuel target 2235' can be generated based on one or more operations of the laser steerer 1713 and, in some instances, the fuel target steerer 1763. Illumination of the fuel target 2215' by the pre-pulse light beam 2110 at time t_8 can generate the desired modified fuel target 2235', and illumination of the desired modified fuel target 2235' by the main-pulse light beam 2136 at time t_9 can generate a plasma (such as plasma 1654) for generating EUV light (such as the radiation beam 1655).

Figure 23A:
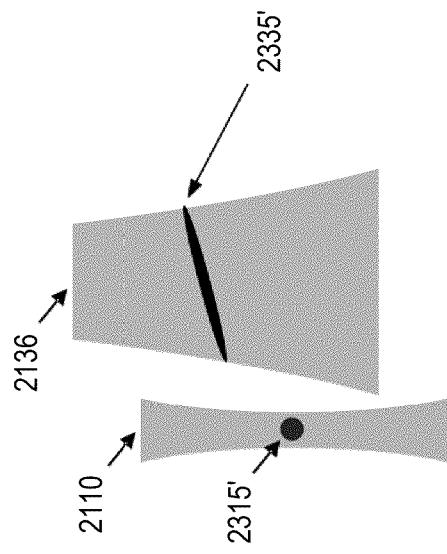
FIGS. 23A and 23B illustrate an example process for aligning a main pulse laser beam to a modified fuel target according to some aspects of the present disclosure.
Figure 23B:
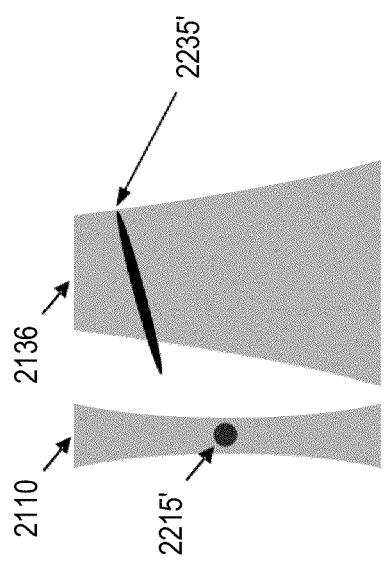

FIGS. 23A and 23B provide an example schematic illustration of a process for aligning a main-pulse light beam 2136 to a modified fuel target according to some aspects of the present disclosure. FIG. 23A shows a fuel target 2315 at the primary focus PF of the collector in relation to a focus of a pre-pulse light beam 2110 at a time t_10. FIG. 23A further shows a desired modified fuel target 2335 in relation to a main-pulse light beam 2236 at a time t_11 at which the main-pulse light beam 2236 has been aligned (for example, by the laser steerer 1713) to overlap the desired modified fuel target 2335. Illumination of the fuel target 2315 by the pre-pulse light beam 2110 at time t_10 can generate the desired modified fuel target 2335, and illumination of the desired modified fuel target 2335 by the main-pulse light beam 2136 at time t_11 can generate a plasma (such as plasma 1654) for generating EUV light (such as the radiation beam 1655).

FIG. 23B shows a fuel target 2315' at the primary focus PF of the collector in relation to a pre-pulse light beam 2110 at a time t_12. FIG. 23B further shows a desired modified fuel target 2335' in relation to a main-pulse light beam 2136 at a time t_13 at which the main-pulse light beam 2136 has been aligned (for example, by the laser steerer 1713) to maximize the overlap of the desired modified fuel target 2335' and the main-pulse light beam 2136. In some aspects, the main-pulse light beam 2136 can be referred to as a "pedestal." Illumination of the fuel target 2315' by the pre-pulse light beam 2110 at time t_12 can generate the desired modified fuel target 2335', and illumination of the desired modified fuel target 2335' by the main-pulse light beam 2136 at time t_13 can generate a plasma (such as plasma 1654) for generating maximum EUV light (such as the radiation beam 1655).

In some aspects, but not all aspects, the times described with reference to FIGS. 20A, 20B, 21A, 21B, 22A, 22B, 23A, 23B can occur sequentially. For example, time t_1 can occur after time t_0, time t_2 can occur after time t_1, time t_3 can occur after time t_2, time t_4 can occur after time t_3, time t_5 can occur after time t_4, time t_6 can occur after time t_5, time t_7 can occur after time t_6, time t_3 can occur after time t_7, time t_9 can occur after time t_8, time t_10 can occur after time t_9, time t_11 can occur after time t_10, time t_12 can occur after time t_11, time t_13 can occur after time t_12, or any combination thereof.

In some aspects, but not all aspects, the plasmas described with reference to FIGS. 20A, 20B, 21A, 21B, 22A, 22B, 23A, 23B can generate EUV radiation having different characteristics. For example, illumination of the modified fuel target 2135 by the main-pulse light beam 2136 at time t_5 can generate a first plasma for generating a first EUV radiation having a first intensity; illumination of the flat modified fuel target 2235 by the main-pulse light beam 2136 at time t_7 can generate a second plasma for generating a second EUV radiation having a second intensity greater than the first intensity of the first EUV radiation; illumination of the desired modified fuel target 2235' by the main-pulse light beam 2136 at time t_9 can generate a third plasma for generating a third EUV radiation having a third intensity greater than the second intensity of the second EUV radiation; illumination of the desired modified fuel target 2335 by the main-pulse light beam 2136 at time t_11 can generate a fourth plasma for generating a fourth EUV radiation having a fourth intensity greater than the third intensity of the third EUV radiation; illumination of the desired modified fuel target 2335' by the main-pulse light beam 2136 at time t_13 can generate a fifth plasma for generating a fifth EUV radiation having a fifth intensity greater than the fourth intensity of the fourth EUV radiation; or any combination thereof.

Figure 24:
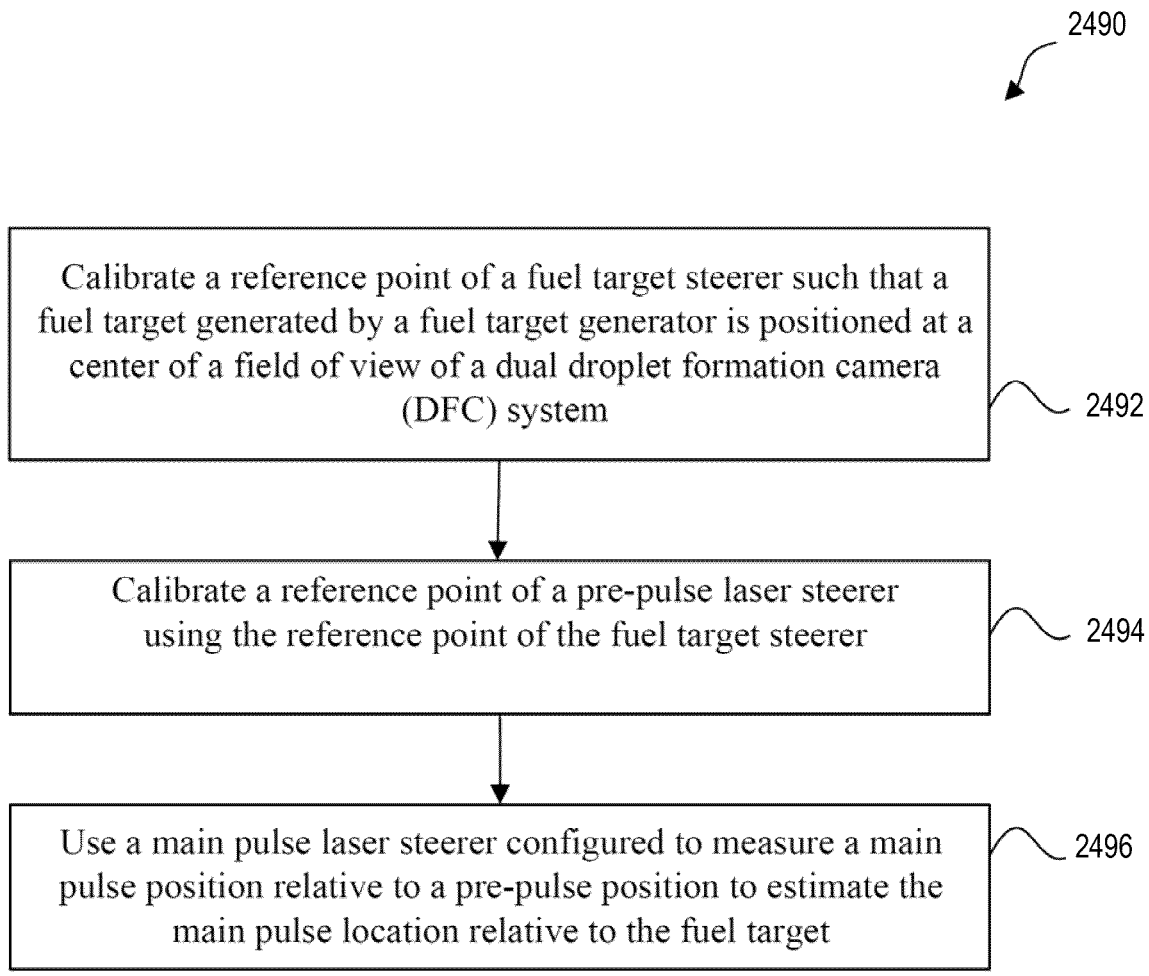
FIG. 24 is a flow chart of an example method for implementing some aspects of the present disclosure or portion(s) thereof.

FIG. 24 is an example method 2490 for implementing some aspects of the present disclosure or portion(s) thereof. The operations described with reference to example method 2490 may be performed by, or according to, any of the systems, apparatuses, computer program products, components, techniques, or combinations thereof described herein, such as those described with reference to FIGS. 1A-23B above and FIG. 25 below.

At operation 2492, the system calibrates a reference point of a fuel target steerer 1763 such that a fuel target 1615 generated by a fuel target generator 1656 is positioned at a center of a field of view of a dual DFC system (such as the apparatus 730 of FIG. 7). At operation 2494, the system calibrates a reference point of a pre-pulse light beam steerer of a laser steerer 1713 using the calibrated reference point of the fuel target steerer 1763. At operation 2496, the system uses a main-pulse light beam steerer configured to measure a position of a main-pulse light beam 1836 relative to a position of a pre-pulse light beam 1810 to estimate the location of the main-pulse light beam 1836 relative to the fuel target 1815.

Example Computing System

Aspects of the disclosure can be implemented in hardware, firmware, software, or any combination thereof. Aspects of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

Figure 25:
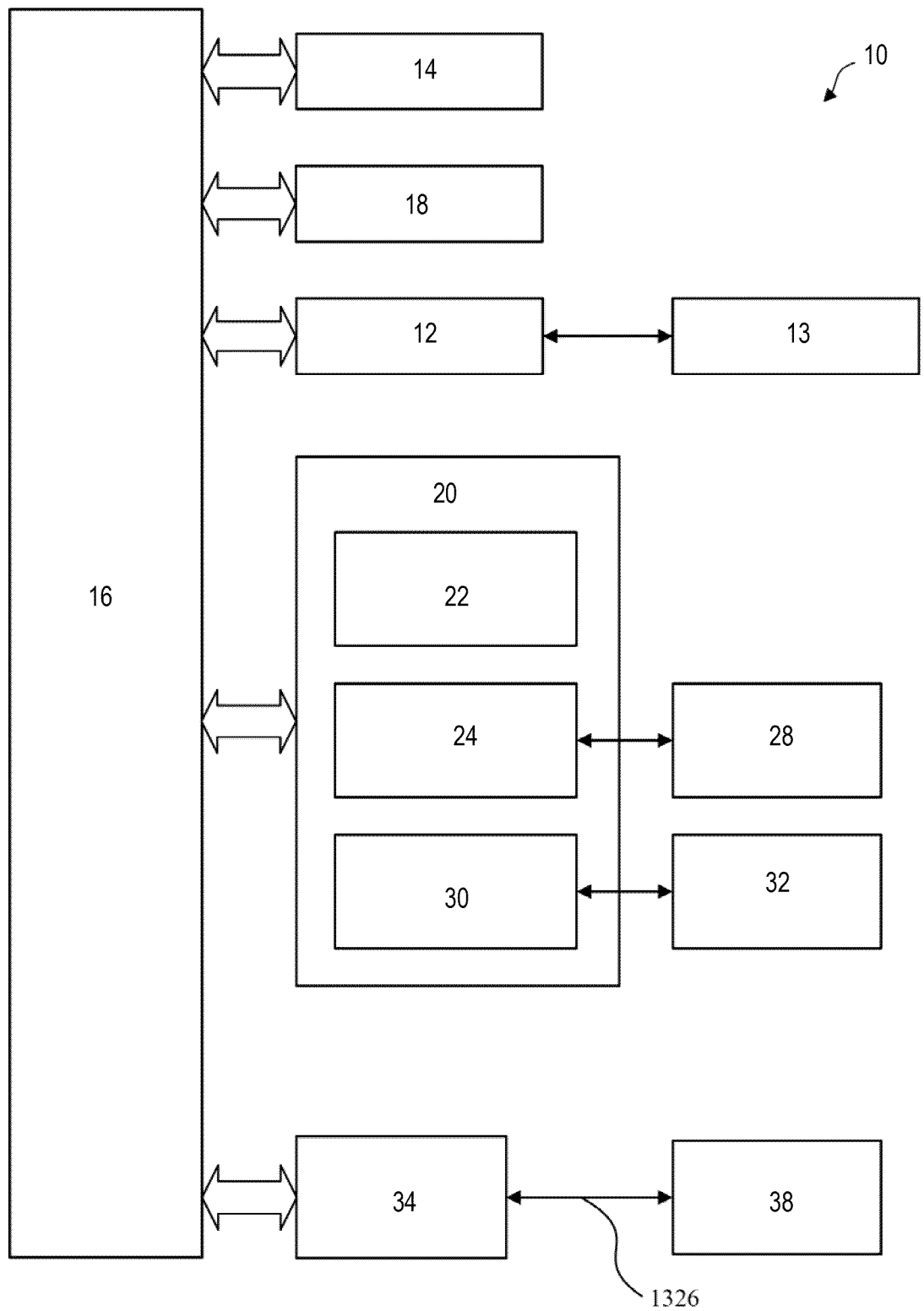
FIG. 25 is an example computer system for implementing some aspects of the present disclosure or portion(s) thereof.

Various aspects can be implemented, for example, using one or more computer systems, such as computer system 10 shown in FIG. 25. Computer system 10 can be a specialized computer capable of performing the functions described herein such as controller 1634 described with reference to FIG. 16; laser steerer 1713 (including, but not limited to, a pre-pulse light beam steerer and a main pulse light beam steerer), fuel target steerer 1763, plasma generator 1764, dual DFC system (including, but not limited to, droplet formation camera 1731 and droplet formation camera 1732), or collector system 1762 described with reference to FIG. 17; any other suitable component or system; or any combination thereof. Computer system 10 includes one or more processors (also called central processing units, or CPUs), such as a processor 14. Processor 14 is connected to a communication infrastructure 16 (for example, a bus). Computer system 10 also includes user input/output device(s) 13, such as monitors, keyboards, pointing devices, etc., that communicate with communication infrastructure 16 through user input/output interface(s) 12. Computer system 10 also includes a main memory 18 (for example, one or more primary storage devices), such as random access memory (RAM). Main memory 18 can include one or more levels of cache. Main memory 18 has stored therein control logic (for example, computer software) and/or data.

Computer system 10 can also include a secondary memory 20 (for example, one or more secondary storage devices). Secondary memory 20 can include, for example, a hard disk drive 22 and/or a removable storage drive 24. Removable storage drive 24 can be a floppy disk drive, a magnetic tape drive, a compact disk drive, an optical storage device, tape backup device, and/or any other storage device/drive.

Removable storage drive 24 can interact with a removable storage unit 28. Removable storage unit 28 includes a computer usable or readable storage device having stored thereon computer software (control logic) and/or data. Removable storage unit 28 can be a floppy disk, magnetic tape, compact disk, DVD, optical storage disk, and/or any other computer data storage device. Removable storage drive 24 reads from and/or writes to removable storage unit 28.

According to some aspects, secondary memory 20 can include other means, instrumentalities or other approaches for allowing computer programs and/or other instructions and/or data to be accessed by computer system 10. Such means, instrumentalities or other approaches can include, for example, a removable storage unit 32 and an interface 30. Examples of the removable storage unit 32 and the interface 30 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 10 can further include a communications interface 34 (for example, one or more network interfaces). Communications interface 34 enables computer system 10 to communicate and interact with any combination of remote devices, remote networks, remote entities, etc. (individually and collectively referred to as remote devices 38). For example, communications interface 34 can allow computer system 10 to communicate with remote devices 38 over communications path 36, which can be wired and/or wireless, and which can include any combination of LANs, WANs, the Internet, etc. Control logic and/or data can be transmitted to and from computer system 10 via communications path 36.

The operations in the preceding aspects of the present disclosure can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, computer system 10, main memory 18, secondary memory 20 and removable storage units 28 and 32, as well as tangible articles of manufacture embodying any combination of the foregoing. Such control logic, when executed by one or more data processing devices (such as computer system 10), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 25. In particular, aspects of the disclosure can operate with software, hardware, and/or operating system implementations other than those described herein.

Although specific reference may be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or may remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

Other aspects of the invention are set out in the following numbered clauses.

1. A metrology system for an extreme ultraviolet (EUV) light source, the metrology system comprising:
a light beam metrology apparatus configured to sense one or more aspects of an amplified light beam and to make adjustments to the amplified light beam based on the sensed one or more aspects;
a target metrology apparatus configured to measure one or more properties of a modified target after a target has interacted with the amplified light beam, and to determine a moment when the modified target achieves a reference calibration state; and
a control apparatus in communication with the light beam metrology apparatus and the target metrology apparatus, the control apparatus configured to:
receive the reference calibration state and the moment at which the reference calibration state is achieved from the target metrology apparatus;
determine a light beam calibration state of the amplified light beam based on the received reference calibration state and the moment at which the reference calibration state is achieved; and provide the light beam calibration state to the light beam metrology apparatus.

2. The metrology system of clause 1, wherein the control apparatus is configured to determine the light beam calibration state as the state of the amplified light beam at the time of the reference calibration state.

3. The metrology system of clause 2, wherein the light beam metrology apparatus comprises at least one sensor that receives a reflected amplified light beam, the reflected amplified light beam including a reflection of at least a portion of the amplified light beam that has interacted with the target.

4. The metrology system of clause 3, wherein the control apparatus is configured to indicate the light beam calibration state to the light beam metrology apparatus.

5. The metrology system of clause 3, wherein the control apparatus is configured to analyze an output from the sensor of the light beam metrology apparatus based on the light beam calibration state.

6. The metrology system of clause 5, wherein the control apparatus is in communication with one or more of an optical source configured to produce the amplified light beam and a steering apparatus configured to direct the amplified light beam toward the target space.

7. The metrology system of clause 6, wherein the control apparatus is configured to send instructions to one or more of the optical source and the steering apparatus based on the analysis of the output from the sensor to thereby adjust the amplified light beam.

8. The metrology system of clause 7, wherein the control apparatus being configured to send one or more instructions to the optical source comprises instructions relating to one or more of a trigger or timing of a pulse of the amplified light beam and an energy of the pulse of the amplified light beam.

9. The metrology system of clause 1, wherein the target metrology apparatus includes a target metrology device configured to measure the one or more properties of the modified target.

10. The metrology system of clause 9, wherein the target metrology device comprises two image sensors, each image sensor being arranged to sense an image in a distinct imaging plane.

11. The metrology system of clause 10, wherein the distinct imaging planes are 20°-120° apart from each other.

12. The metrology system of clause 10, wherein the control apparatus is configured to determine that the modified target achieves the reference calibration state at the moment when the modified target has a desired extent along each of two projected planes from the imaging planes or when the modified target has a desired orientation.

13. The metrology system of clause 1, wherein the target metrology apparatus is unable to directly sense the amplified light beam.

14. The metrology system of clause 1, wherein the reference calibration state indicates that a focal region of the amplified light beam encompasses the target and the target is centered in the focal region of the amplified light beam.

15. The metrology system of clause 1, wherein the light beam metrology apparatus is configured to sense one or more aspects of the amplified light beam directed to the target space or reflected from the target space.

16. The metrology system of clause 1, wherein the determined light beam calibration state of the amplified light beam includes an energy, a value, a position, or a shape of the amplified light beam.

17. The metrology system of clause 1, wherein the control apparatus is also configured to estimate a rate of expansion of the modified target, to determine whether one or more aspects of the amplified light beam should be adjusted based on the estimated expansion rate, and to send instructions to one or more of the optical source and the steering apparatus to thereby adjust one or more aspects of the amplified light beam based on this determination.

18. The metrology system of clause 1, wherein the light beam metrology apparatus is configured to sense the one or more aspects of the amplified light beam in accordance with the light beam calibration state.

19. A method comprising:
directing an amplified light beam toward a target space so that the amplified light beam interacts with a target in the target space;
adjusting one or more features of the amplified light beam;
measuring one or more properties of a modified target after the target has interacted with the amplified light beam in the target space;
determining, based on the measured properties of the modified target, when the modified target is in a reference calibration state; and
assigning the one or more features of the amplified light beam that produced the reference calibration state to a light beam calibration state.

20. The method of clause 19, further comprising controlling aspects of the amplified light beam in accordance with the light beam calibration state.

21. The method of clause 20, wherein controlling the aspects of the amplified light beam comprises sensing one or more aspects of the amplified light beam in accordance with the light beam calibration state; and adjusting the amplified light beam based on the sensed one or more aspects.

22. The method of clause 21, wherein sensing one or more aspects of the amplified light beam in accordance with the light beam calibration state comprises sensing a reflected amplified light beam, the reflected amplified light beam including a reflection of at least a portion of the amplified light beam that has interacted with the target.

23. The method of clause 19, wherein measuring one or more properties of the modified target comprises detecting at least two images of the modified target along two distinct imaging planes.

24. The method of clause 23, wherein determining when the modified target is in the reference calibration state comprises assigning the reference calibration state as the state of the modified target when the modified target has a desired extent along each of two planes projected from the imaging planes.

25. The method of clause 19, wherein determining when the modified target is in the reference calibration state comprises determining that a focal region of the amplified light beam encompasses the target in the target space and the target is centered in the focal region of the amplified light beam.

26. The method of clause 19, wherein determining when the modified target is in the reference calibration state comprises determining when the modified target is symmetric about at least one axis that defines target space.

27. The method of clause 19, wherein adjusting one or more features of the amplified light beam comprises adjusting one or more of a direction and a focal region of the amplified light beam.

28. The method of clause 19, wherein determining when the modified target is in the reference calibration state is independent of sensing one or more aspects of the amplified light beam.

29. The method of clause 19, wherein measuring the one or more properties of the modified target comprises measuring an orientation of the modified target relative to a first image plane and measuring an orientation of the modified target relative to a second image plane orthogonal to the first image plane.

30. An extreme ultraviolet (EUV) light system comprising:
an optical source configured to produce an amplified light beam;

a steering system configured to steer and focus the amplified light beam toward a target space;

a light beam metrology apparatus configured to sense one or more aspects of the amplified light beam in the target space and to adjust the amplified light beam based on the sensed one or more aspects;

a target metrology apparatus configured to measure one or more properties of a modified target after the target has interacted with the amplified light beam, and to determine a moment when the modified target achieves a reference calibration state; and a control apparatus in communication with the light beam metrology apparatus and the target metrology apparatus, the control apparatus configured to: receive the reference calibration state and the moment at which the reference calibration state is achieved from the target metrology apparatus;

determine a light beam calibration state of the amplified light beam based on the received reference calibration state and the moment at which the reference calibration state is achieved; and provide the light beam calibration state to the light beam metrology apparatus.

31. The EUV light system of clause 30, wherein the target metrology apparatus comprises two image sensors, each image sensor being arranged to sense an image of the modified target at a distinct imaging plane.

32. The EUV light system of clause 31, wherein the image sensors are fixed to a wall that defines an enclosure in which the target space is located.

33. The EUV light system of clause 32, wherein the distinct imaging planes are 60°-120° apart from each other.

34. The EUV light system of clause 31, wherein the target metrology apparatus comprises a diagnostic light beam arranged relative to each image sensor, wherein each diagnostic light beam is directed to interact with the modified target such that each image sensor sensing the image of the modified target comprises the image sensor sensing the interaction between the modified target and that diagnostic light beam.

35. An alignment apparatus comprising:
a light source configured to:
direct a first amplified light beam toward a target space such that an interaction between the first amplified light beam and a moving target in the target space forms a modified target; and
direct a second amplified light beam toward the target space such that an interaction between the second amplified light beam and the modified target in the target space generates plasma; and a light beam actuation system configured to:
adjust a position of the first amplified light beam relative to the target to cause the first amplified light beam to overlap the target; and
after adjusting the position of the first amplified light beam relative to the target to cause the first amplified light beam to overlap the target, adjust the position of the second amplified light beam relative to the first amplified light beam to cause the second amplified light beam to overlap the modified target.

36. The alignment apparatus of clause 35, wherein the light beam actuation system comprises a steering mechanism configured to steer or adjust a direction of the amplified light beam.

37. The alignment apparatus of clause 35, further comprising a target metrology apparatus configured to image one or more of: the interaction between the first amplified light beam and the target; the interaction between the second amplified light beam and the modified target; the target; and the modified target.

38. The alignment apparatus of clause 37, wherein the light beam actuation system is configured to adjust the position of the first amplified light beam relative to the target based on the imaging.

39. The alignment apparatus of clause 37, wherein the light beam actuation system is configured to adjust the position of the first amplified light beam relative to the target based on an orientation of the modified target determined from imaging the modified target.

40. The alignment apparatus of clause 37, wherein the target metrology is configured to determine when the second amplified light beam and the modified target overlap.

41. The alignment apparatus of clause 35, wherein the light beam actuation system is configured to adjust the position of the second amplified light beam relative to the first amplified light beam to cause the second amplified light beam to overlap the modified target by moving the second amplified light beam to center the modified target.

42. The alignment apparatus of clause 35, wherein the light beam actuation system is configured to adjust the position of the second amplified light beam relative to the first amplified light beam to cause the second amplified light beam to overlap the modified target by moving the second amplified light beam to maximize the overlap such that the second amplified light beam overlaps with a greater area of the modified target.

43. The alignment apparatus of clause 35, wherein the light beam actuation system is configured to adjust the position of the second amplified light beam relative to the first amplified light beam to cause the second amplified light beam to overlap the modified target by adjusting the position of the second amplified light beam along a direction that is perpendicular to a direction at which the second amplified light beam travels.

44. The alignment apparatus of clause 35, wherein the light beam actuation system is configured to adjust the position of the second amplified light beam relative to the first amplified light beam to cause the second amplified light beam to overlap the modified target by adjusting a beam waist of the second amplified light beam along a direction at which the second amplified light beam travels.

45. The alignment apparatus of clause 44, wherein the light beam actuation system is configured to adjust the beam waist of the second amplified light beam along the direction at which the second amplified light beam travels by an amount that improves an amount of EUV light produced by the generated plasma.

46. The alignment apparatus of clause 35, wherein the light beam actuation system is configured to measure a position of the second amplified light beam relative to a position of the first amplified light beam.

47. The alignment apparatus of clause 46, wherein the light beam actuation system is configured to adjust the position of the second amplified light beam relative to the first amplified light beam based on the measured position of the second amplified light beam relative to the position of the first amplified light beam.

48. An alignment method comprising:
directing a first amplified light beam toward a target space such that an interaction between the first amplified light beam and a moving target in the target space forms a modified target;

directing a second amplified light beam toward the target space such that an interaction between the second amplified light beam and the modified target in the target space generates plasma;

adjusting a position of the first amplified light beam relative to the target to cause the first amplified light beam to overlap the target; and after adjusting the position of the first amplified light beam relative to the target to cause the first amplified light beam to overlap the target, adjusting the position of the second amplified light beam relative to the first amplified light beam to cause the second amplified light beam to overlap the modified target.

49. The alignment method of clause 48, wherein adjusting the position of the first amplified light beam relative to the target is based on an interaction between the first amplified light beam and the target.

50. The alignment method of clause 48, wherein adjusting the position of the first amplified light beam relative to the target is based on imaging of the modified target.

51. The alignment method of clause 48, wherein adjusting the position of the first amplified light beam relative to the target is based on an orientation of the modified target.

52. The alignment method of clause 48, wherein adjusting the position of the second amplified light beam relative to the first amplified light beam to cause the second amplified light beam to overlap the modified target comprises moving the second amplified light beam to center the modified target.

53. The alignment method of clause 48, wherein adjusting the position of the second amplified light beam relative to the first amplified light beam to cause the second amplified light beam to overlap the modified target comprises moving the second amplified light beam to maximize the overlap such that the second amplified light beam overlaps with a greater area of the modified target.

54. The alignment method of clause 48, wherein adjusting the position of the second amplified light beam relative to the first amplified light beam comprises adjusting the position of the second amplified light beam along a direction that is perpendicular to a direction at which the second amplified light beam travels.

55. The alignment method of clause 48, wherein adjusting the position of the second amplified light beam relative to the first amplified light beam comprises adjusting a beam waist of the second amplified light beam along a direction at which the second amplified light beam travels.

56. The alignment method of clause 55, wherein adjusting the beam waist of the second amplified light beam along the direction at which the second amplified light beam travels comprises adjusting by an amount that improves an amount of EUV light produced by the generated plasma.

57. The alignment method of clause 48, further comprising measuring a position of the second amplified light beam relative to a position of the first amplified light beam.

58. The alignment method of clause 57, wherein adjusting the position of the second amplified light beam relative to the first amplified light beam is based on the measured position of the second amplified light beam relative to the position of the first amplified light beam.

59. An alignment apparatus comprising:

a light source configured to direct a first amplified light beam toward a target space within a chamber such that an interaction between the first amplified light beam and a moving target in the target space forms a modified target;

a target metrology apparatus configured to detect the interaction between the first amplified beam and the target; and a control system in communication with the light source and the target metrology apparatus, the control system configured to:

analyze the detected interaction output from the target metrology apparatus; and instruct the light source to adjust a position of the first amplified light beam relative to the target to cause the first amplified light beam to overlap the target, the adjustment being based on the analysis of the detected interaction.

60. The alignment apparatus of clause 59, wherein the light source is configured to direct a second amplified light beam toward the target space such that an interaction between the second amplified light beam and the modified target in the target space generates plasma.

61. The alignment apparatus of clause 59, wherein the target metrology apparatus comprises a camera arranged so that the target space is in the field of view of the camera.

62. The alignment apparatus of clause 59, wherein the target metrology apparatus comprises two cameras arranged at different viewing angles and both arranged so that the target space is in their respective fields of view.

63. The alignment apparatus of clause 59, wherein the control system is configured to activate the target metrology apparatus to thereby detect the interaction between the first amplified light beam and the target based on information regarding the first amplified light beam provided by the light source.

64. The alignment apparatus of clause 63, wherein the target metrology apparatus includes a dual droplet formation camera system that includes an illumination system and at least two cameras.

65. The alignment apparatus of clause 64, wherein the at least two cameras and the illumination system are mechanically referenced to a reference point in the chamber, wherein the reference point is a location within the target space, or a primary focus at which extreme ultraviolet light produced from the plasma is collected.

66. The alignment apparatus of clause 59, further comprising an extreme ultraviolet (EUV) light collector defining a primary focus configured to collect EUV light and to direct EUV light to an intermediate focus.

67. The alignment apparatus of clause 66, wherein the target metrology apparatus includes a dual droplet formation camera system including two cameras that are oriented such that the primary focus of the EUV light collector is in the field of view of each camera.

68. The alignment apparatus of clause 66, wherein the target metrology apparatus comprises a target steerer, the control system is in communication with the target steerer and is configured to adjust the position of the target stream to thereby align the target stream to the primary focus of the EUV light collector.

69. The alignment apparatus of clause 68, wherein the control system is configured to instruct the light source to adjust the position of the first amplified light beam relative to the target to cause the first amplified light beam to overlap the target, the adjustment being based on the analysis of the detected interaction after the target stream has been aligned to the primary focus of the EUV light collector.

70. An alignment method comprising:

directing a first amplified light beam toward a target space within a chamber such that an interaction between the first amplified light beam and a moving target in the target space forms a modified target;

detecting the interaction between the first amplified beam and the target;

analyzing the detected interaction; and adjusting a position of the first amplified light beam relative to the target to cause the first amplified light beam to overlap the target, the adjustment being based on the analysis of the detected interaction.

71. The alignment method of clause 70, wherein detecting the interaction between the first amplified light beam and the target comprises imaging the target at at least one image plane facing the target space.

72. The alignment method of clause 70, wherein detecting the interaction between the first amplified light beam and the target comprises imaging the target at two differently angled image planes, each facing the target space.

73. The alignment method of clause 70, wherein detecting the interaction between the first amplified light beam and the target comprises detecting the interaction upon a trigger signal that is generated based on a time at which the first amplified light beam is generated.

74. The alignment method of clause 70, wherein detecting the interaction between the first amplified light beam and the target comprises imaging, at a primary image plane, a backlit image of the target.

75. The alignment method of clause 74, wherein detecting the interaction between the first amplified light beam and the target comprises imaging, at a secondary image plane that is distinct from the primary image plane, a second backlit image of the target.

76. The alignment method of clause 70, further comprising collecting extreme ultraviolet (EUV) light produced by the generated plasma at a primary focus and directing the EUV light to an intermediate focus.

77. The alignment method of clause 76, further comprising, prior to adjusting the position of the first amplified light beam relative to the target to cause the first amplified light beam to overlap the target, adjusting a position of the target stream to thereby align the target stream to the primary focus.

78. The alignment method of clause 70, further comprising, after adjusting the position of the first amplified light beam relative to the target to cause the first amplified light beam to overlap the target, adjusting a position of a second amplified light beam directed toward the target space relative to the modified target to cause the second amplified light beam to overlap the modified target.

The breadth and scope of the present disclosure should not be limited by any of the above-described example aspects or embodiments, but should be defined only in accordance with the following claims and their equivalents.

What is claimed is:

1. A metrology system for an extreme ultraviolet (EUV) light source, the metrology system comprising:
a light beam metrology apparatus configured to sense one or more aspects of an amplified light beam and to make adjustments to the amplified light beam based on the sensed one or more aspects;
a target metrology apparatus configured to measure one or more properties of a modified target after a target has interacted with the amplified light beam, and to determine a moment when the modified target achieves a reference calibration state; and
a control apparatus in communication with the light beam metrology apparatus and the target metrology apparatus, the control apparatus configured to:
receive the reference calibration state and the moment at which the reference calibration state is achieved from the target metrology apparatus;
determine a light beam calibration state of the amplified light beam based on the received reference calibration state and the moment at which the reference calibration state is achieved; and
provide the light beam calibration state to the light beam metrology apparatus.

2. The metrology system of claim 1, wherein the control apparatus is configured to determine the light beam calibration state as the state of the amplified light beam at the time of the reference calibration state.

3. The metrology system of claim 2, wherein the light beam metrology apparatus comprises at least one sensor that receives a reflected amplified light beam, the reflected amplified light beam including a reflection of at least a portion of the amplified light beam that has interacted with the target.

4. The metrology system of claim 3, wherein the control apparatus is configured to indicate the light beam calibration state to the light beam metrology apparatus.

5. The metrology system of claim 3, wherein the control apparatus is configured to analyze an output from the sensor of the light beam metrology apparatus based on the light beam calibration state.

6. The metrology system of claim 5, wherein the control apparatus is in communication with one or more of an optical source configured to produce the amplified light beam and a steering apparatus configured to direct the amplified light beam toward the target space.

7. The metrology system of claim 6, wherein the control apparatus is configured to send instructions to one or more of the optical source and the steering apparatus based on the analysis of the output from the sensor to thereby adjust the amplified light beam.

8. The metrology system of claim 1, wherein the target metrology apparatus includes a target metrology device configured to measure the one or more properties of the modified target.

9. The metrology system of claim 8, wherein the target metrology device comprises two image sensors, each image sensor being arranged to sense an image in a distinct imaging plane.

10. The metrology system of claim 1, wherein the target metrology apparatus is unable to directly sense the amplified light beam.

11. The metrology system of claim 1, wherein the reference calibration state indicates that a focal region of the amplified light beam encompasses the target and the target is centered in the focal region of the amplified light beam.

12. The metrology system of claim 1, wherein the control apparatus is also configured to estimate a rate of expansion of the modified target, to determine whether one or more aspects of the amplified light beam should be adjusted based on the estimated expansion rate, and to send instructions to one or more of the optical source and the steering apparatus to thereby adjust one or more aspects of the amplified light beam based on this determination.

13. A method comprising:
directing an amplified light beam toward a target space so that the amplified light beam interacts with a target in the target space;
adjusting one or more features of the amplified light beam;
measuring one or more properties of a modified target after the target has interacted with the amplified light beam in the target space;
determining, based on the measured properties of the modified target, when the modified target is in a reference calibration state; and assigning the one or more features of the amplified light beam that produced the reference calibration state to a light beam calibration state.

14. The method of claim 13, further comprising controlling aspects of the amplified light beam in accordance with the light beam calibration state.

15. The method of claim 14, wherein controlling the aspects of the amplified light beam comprises sensing one or more aspects of the amplified light beam in accordance with the light beam calibration state; and adjusting the amplified light beam based on the sensed one or more aspects.

16. The method of claim 15, wherein sensing one or more aspects of the amplified light beam in accordance with the light beam calibration state comprises sensing a reflected amplified light beam, the reflected amplified light beam including a reflection of at least a portion of the amplified light beam that has interacted with the target.

17. The method of claim 13, wherein measuring one or more properties of the modified target comprises detecting at least two images of the modified target along two distinct imaging planes.

18. The method of claim 13, wherein determining when the modified target is in the reference calibration state is independent of sensing one or more aspects of the amplified light beam.

19. The method of claim 13, wherein measuring the one or more properties of the modified target comprises measuring an orientation of the modified target relative to a first image plane and measuring an orientation of the modified target relative to a second image plane orthogonal to the first image plane.

20. An extreme ultraviolet (EUV) light system comprising:
an optical source configured to produce an amplified light beam;
a steering system configured to steer and focus the amplified light beam toward a target space;
a light beam metrology apparatus configured to sense one or more aspects of the amplified light beam in the target space and to adjust the amplified light beam based on the sensed one or more aspects;
a target metrology apparatus configured to measure one or more properties of a modified target after the target has interacted with the amplified light beam, and to determine a moment when the modified target achieves a reference calibration state; and
a control apparatus in communication with the light beam metrology apparatus and the target metrology apparatus, the control apparatus configured to: receive the reference calibration state and the moment at which the reference calibration state is achieved from the target metrology apparatus; determine a light beam calibration state of the amplified light beam based on the received reference calibration state and the moment at which the reference calibration state is achieved; and provide the light beam calibration state to the light beam metrology apparatus.

21. The EUV light system of claim 20, wherein the target metrology apparatus comprises two image sensors, each image sensor being arranged to sense an image of the modified target at a distinct imaging plane.

22. The EUV light system of claim 21, wherein the image sensors are fixed to a wall that defines an enclosure in which the target space is located.

23. The EUV light system of claim 21, wherein the target metrology apparatus comprises a diagnostic light beam arranged relative to each image sensor, wherein each diagnostic light beam is directed to interact with the modified target such that each image sensor sensing the image of the modified target comprises the image sensor sensing the interaction between the modified target and that diagnostic light beam.

* * * * *